United States Patent
Singh et al.

(10) Patent No.: US 11,063,138 B2
(45) Date of Patent: Jul. 13, 2021

(54) QUANTUM DOT DEVICES

(71) Applicants: Intel Corporation, Santa Clara, CA (US); Technische Universiteit Delft, Delft (NL)

(72) Inventors: Kanwaljit Singh, Rotterdam (NL); James S. Clarke, Portland, OR (US); Menno Veldhorst, Bergschenhoek (NL); Lieven Mark Koenraad Vandersypen, Delft (NL)

(73) Assignee: Intel Corporation, Santa Clara, CA (US)

(*) Notice: Subject to any disclaimer, the term of this patent is extended or adjusted under 35 U.S.C. 154(b) by 55 days.

(21) Appl. No.: 16/616,350

(22) PCT Filed: Jun. 24, 2017

(86) PCT No.: PCT/US2017/039155
§ 371 (c)(1),
(2) Date: Nov. 22, 2019

(87) PCT Pub. No.: WO2018/236404
PCT Pub. Date: Dec. 27, 2018

(65) Prior Publication Data
US 2020/0161455 A1 May 21, 2020

(51) Int. Cl.
*H01L 29/66* (2006.01)
*G06N 10/00* (2019.01)
(Continued)

(52) U.S. Cl.
CPC ....... *H01L 29/66977* (2013.01); *G06N 10/00* (2019.01); *H01L 27/088* (2013.01);
(Continued)

(58) Field of Classification Search
CPC .. H01L 27/088; H01L 29/66977; H01L 29/82
See application file for complete search history.

(56) References Cited

U.S. PATENT DOCUMENTS 9,548,269 B2   1/2017   Myers et al.
2002/0179897 A1* 12/2002   Eriksson ............... B82Y 10/00
257/14
(Continued)

FOREIGN PATENT DOCUMENTS

JP   590611 A   4/1993
JP   2000315786 A   11/2000
(Continued)

OTHER PUBLICATIONS

PCT International Search Report and Written Opinion for PCT Application No. PCT/US2017/039155 dated Feb. 23, 2018; 14 pages.
(Continued)

*Primary Examiner* — Daniel P Shook
(74) *Attorney, Agent, or Firm* — Patent Capital Group

(57) ABSTRACT

Quantum dot devices, and related systems and methods, are disclosed herein. In some embodiments, a quantum dot device may include a quantum well stack having a first face and a second opposing face; an array of parallel first gate lines at the first face or the second face of the quantum well stack; and an array of parallel second gate lines at the first face or the second face of the quantum well stack, wherein the second gate lines are oriented diagonal to the first gate lines.

20 Claims, 43 Drawing Sheets

(51) Int. Cl.

| | | |
|---|---|---|
| *H01L 27/088* | (2006.01) | |
| *H01L 29/43* | (2006.01) | |
| *H01L 29/49* | (2006.01) | |
| *H01L 29/12* | (2006.01) | |
| *H01L 27/105* | (2006.01) | |
| *H01L 29/82* | (2006.01) | |

(52) U.S. Cl.
CPC .......... *H01L 29/127* (2013.01); *H01L 29/437* (2013.01); *H01L 29/49* (2013.01); *H01L 27/105* (2013.01); *H01L 29/82* (2013.01)

(56) References Cited

U.S. PATENT DOCUMENTS

| | | |
|---|---|---|
| 2009/0309229 A1 | 12/2009 | Angus et al. |
| 2010/0006821 A1 | 1/2010 | Choi et al. |
| 2012/0074386 A1 | 3/2012 | Rachmady et al. |
| 2013/0264617 A1 | 10/2013 | Joshi et al. |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |

FOREIGN PATENT DOCUMENTS

| | | |
|---|---|---|
| KR | 1020160108585 A | 9/2016 |
| WO | 2017155531 A1 | 9/2017 |
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Quantum computation with quantum dots," Loss et al , Physical Review A, vol. 57, No. 1, Jan. 1998, pp. 120-126.
"Ultrafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.

(56) References Cited

OTHER PUBLICATIONS

"Embracing the quantum limit in silicon computing," Morton et al, Macmillan Publishers, Nov. 17, 2011, vol. 479, Nature, pp. 345-353.
"Review: Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Defect reduction of selective Ge epitaxy in trenches on Si(001) substrates using aspect ratio trapping," Park et al., Applied Physics Letter 90, 052113 (2007), pp. 052113-1 through 052113-3.
"Photon- and phonon-assisted tunneling in the three-dimensional charge stability diagram of a triple quantum dot array," Braakman et al., Applied Physics Letters 102, 112110 (2013), pp. 112110-1 through 112110-4 (5 pages with cover sheet).
"Radio frequency measurements of tunnel couplings and singlet-triplet spin states in Si:P quantum dots," House et al., Nature Communications, 6:884, DOI: 10.1038/ncomms 9848, Nov. 9, 2015, pages 1-6.
"Detecting bit-flip errors in a logical qubit using stabilizer measurements," Riste et al., Nature Communications, 6:6983, DOI: 10.1038/ncomms7983, Apr. 29, 2015, pp. 1-6.
"Scalable gate architecture for densely packed semiconductor spin qubits," Zajac et al, Department of Physics, Princeton University; Sandia National Laboratories, retrieved [cond-mat.mes-hall] Jul. 24, 2016, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 113104-3.
"Single-shot read-out of an individual electron spin in a quantum dot," Elzerman et al., Nature, vol. 430, Jul. 22, 2004, pp. 431-435.
"An addressable quantum dot qubit with fault-tolerant control-fidelity," Veldhorst et al., Nature Nanotechnology vol. 9, Dec. 2014, pp. 981-985.

* cited by examiner

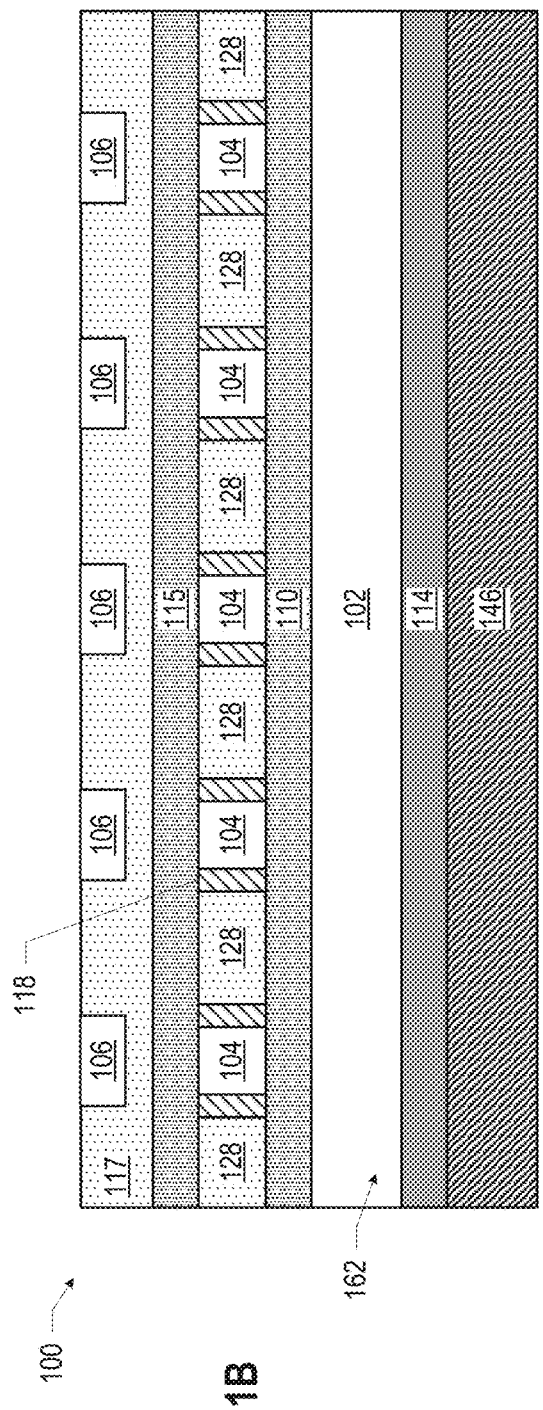
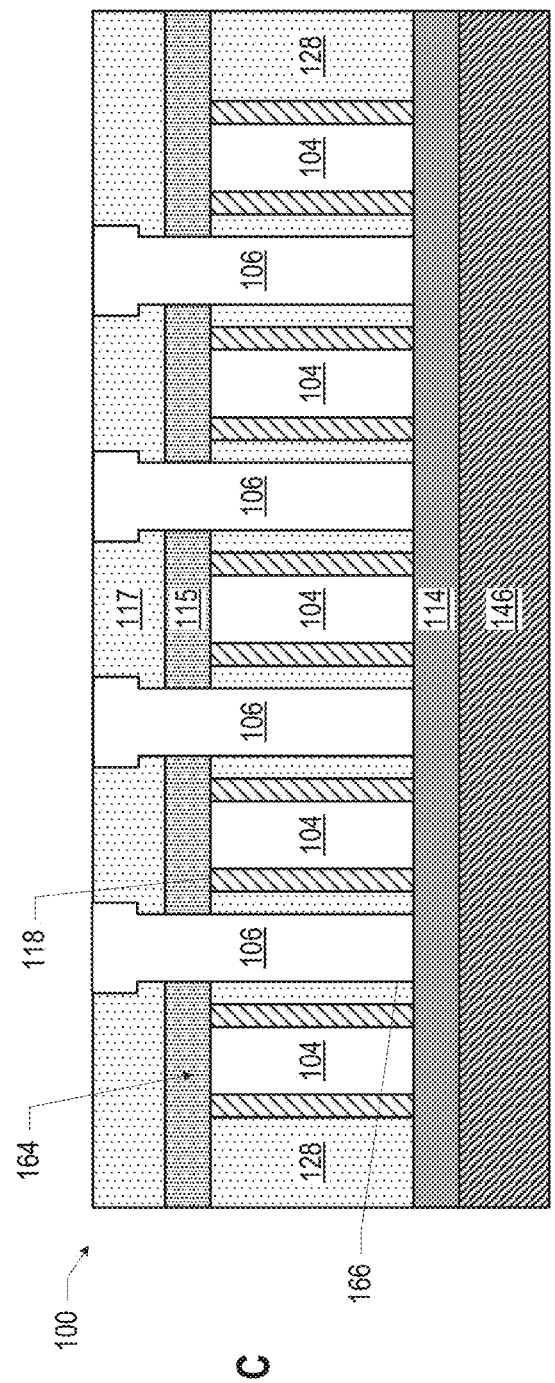

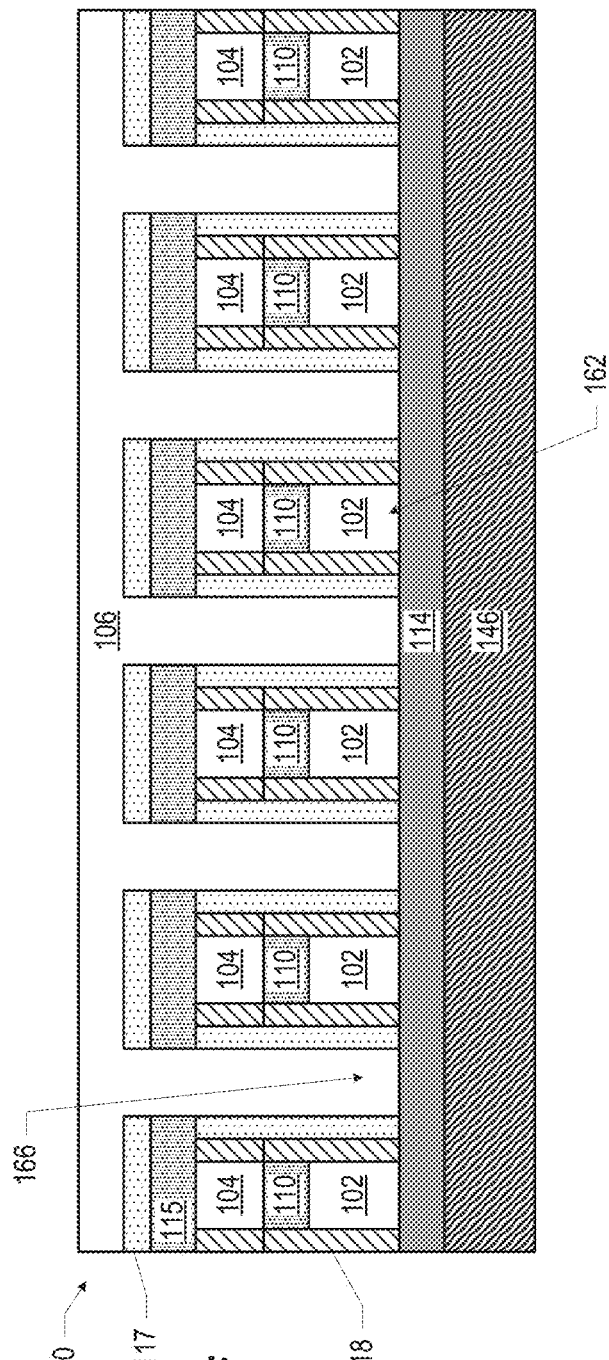

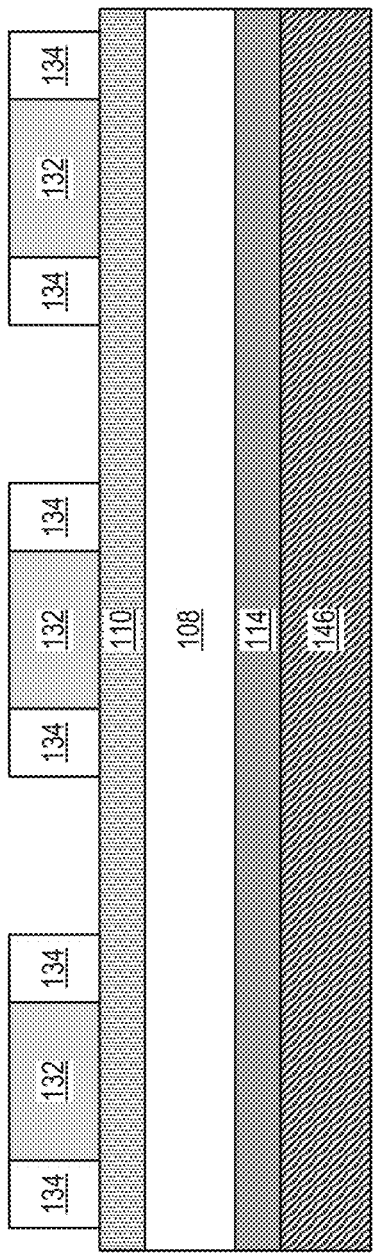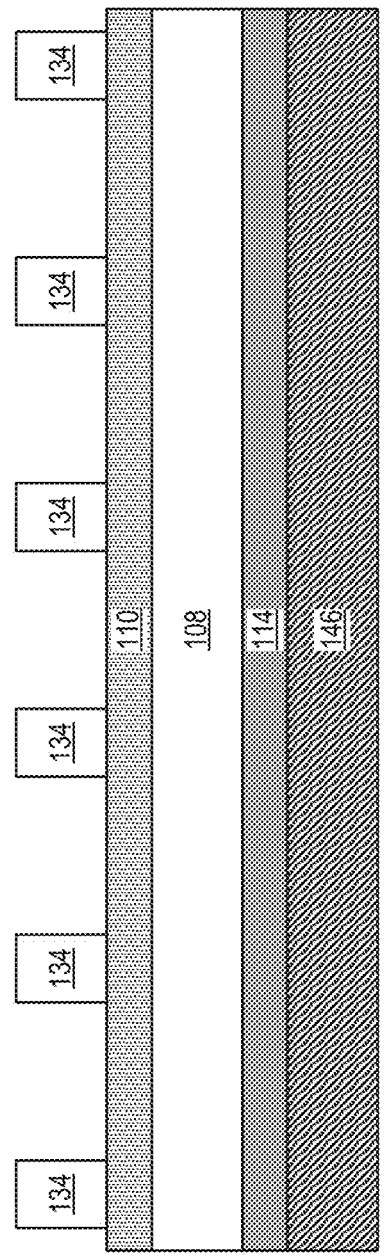
FIG. 2C
FIG. 2D

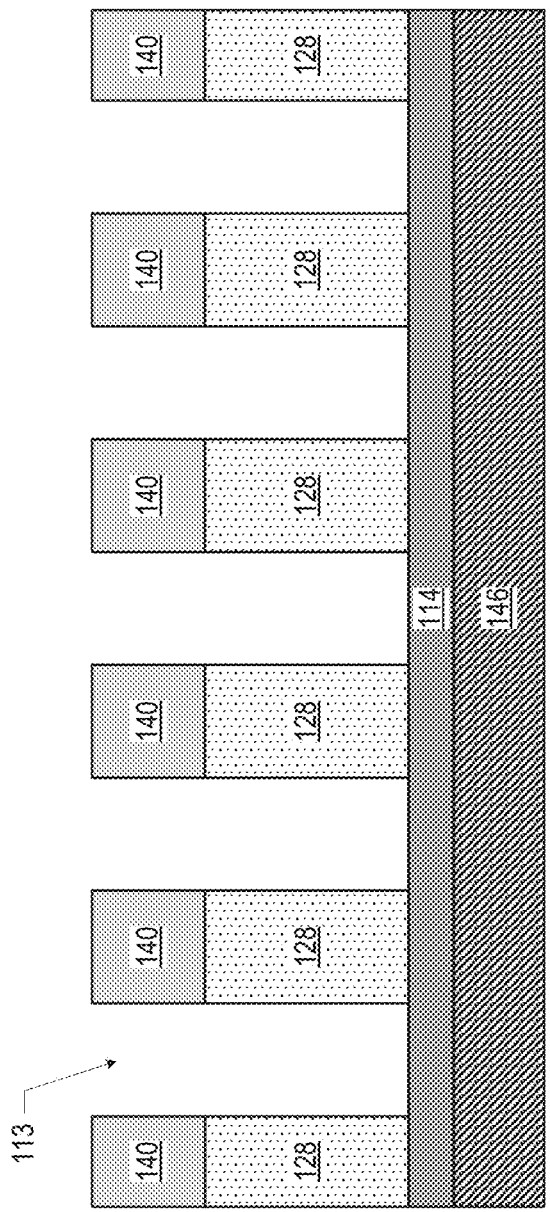
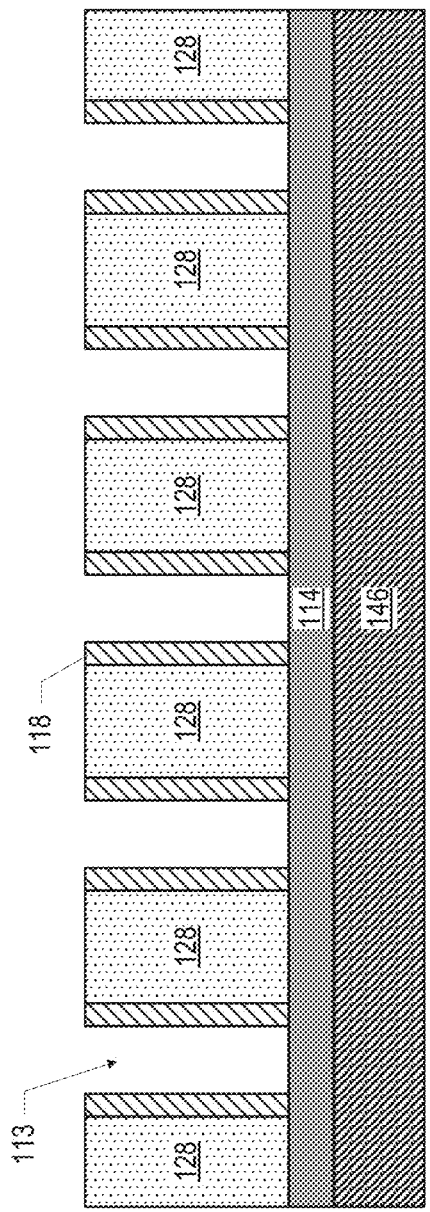
FIG. 2N
FIG. 2O

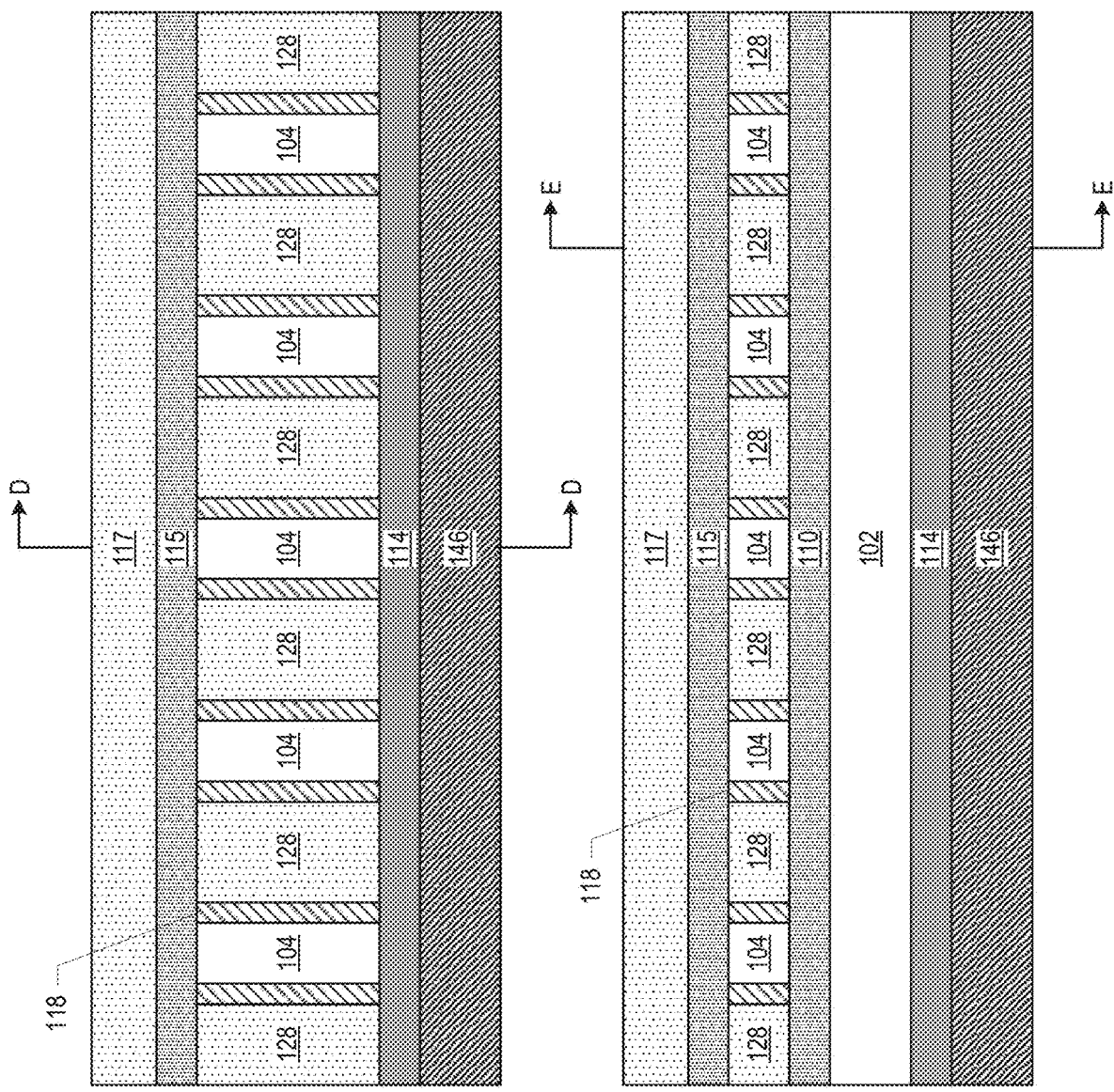

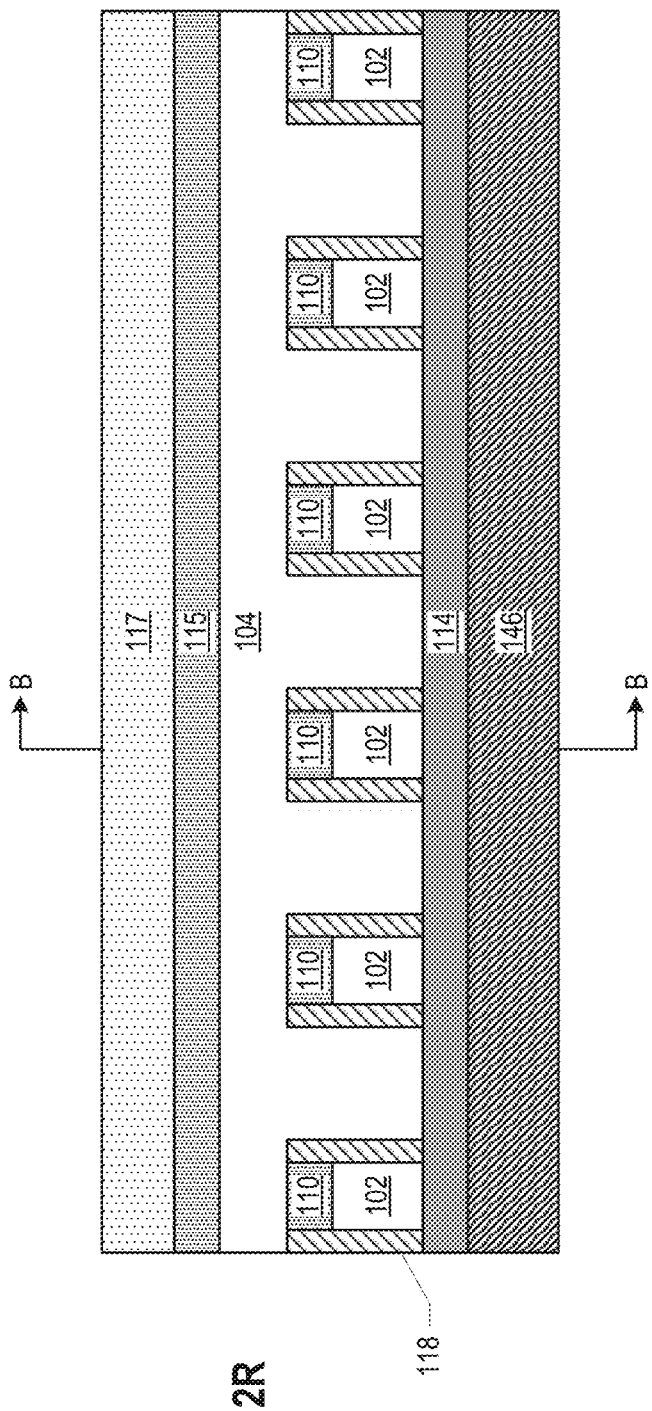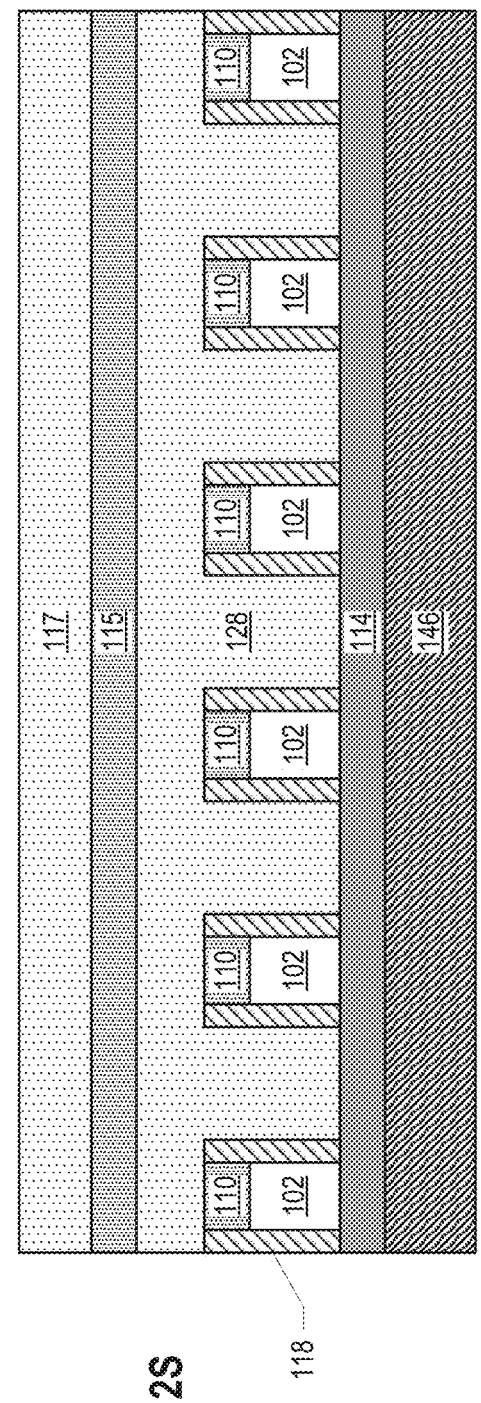

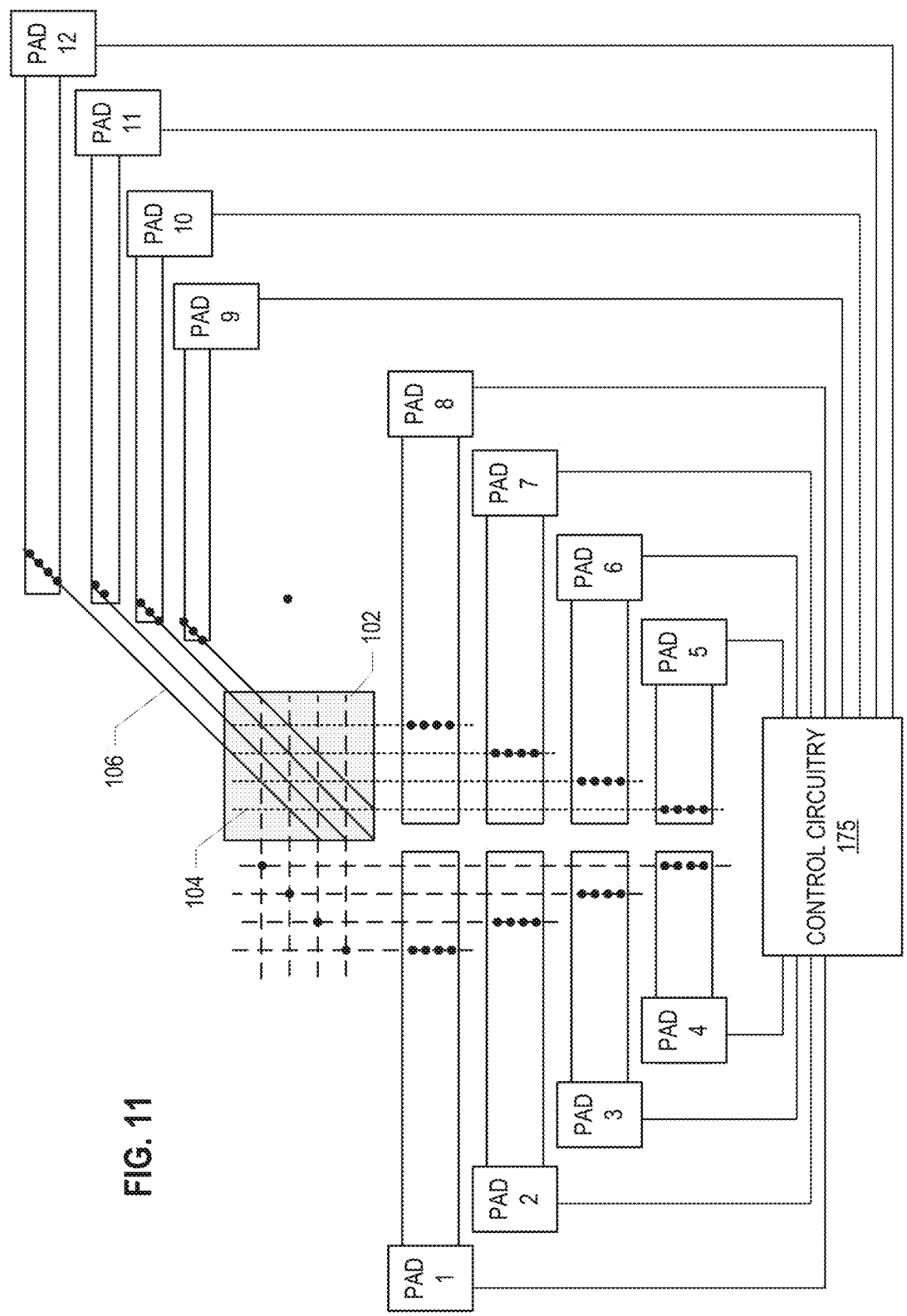

QUANTUM DOT DEVICES

CROSS-REFERENCE TO RELATED APPLICATION

This application is a national stage application under 35 U.S.C. § 371 of PCT International Application Serial No. PCT/US2017/039155, filed on Jun. 24, 2017 and entitled "QUANTUM DOT DEVICES," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1F are various views of a quantum dot device, in accordance with various embodiments.

FIG. 11 illustrates an interconnect arrangement for a quantum dot device, in accordance with various embodiments.

DETAILED DESCRIPTION

Figure 1A:
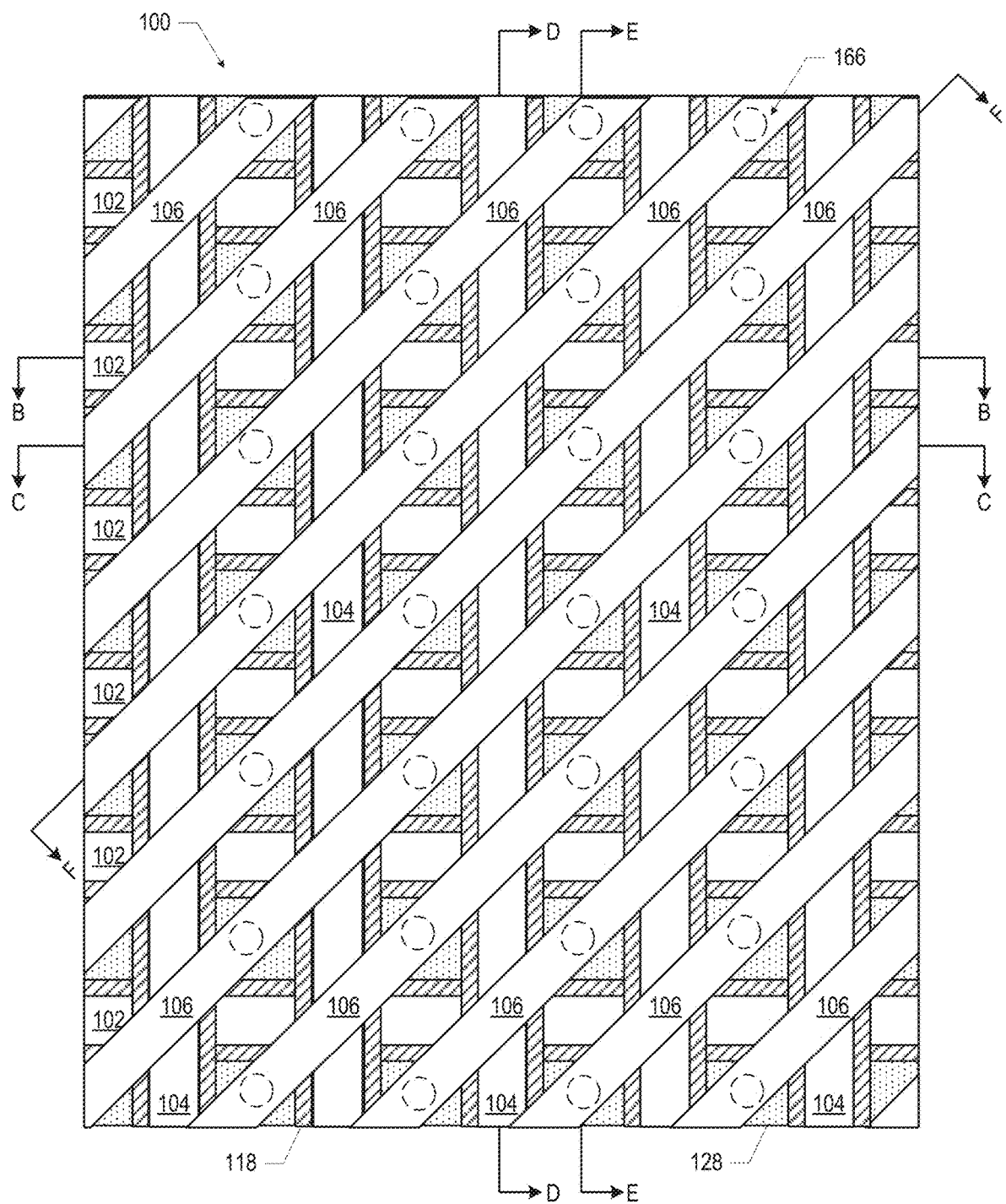

Quantum dot devices, and related systems and methods, are disclosed herein. In some embodiments, a quantum dot device may include a quantum well stack having a first face and a second opposing face; an array of parallel first gate lines at the first face or the second face of the quantum well stack; and an array of parallel second gate lines at the first face or the second face of the quantum well stack, wherein the second gate lines are oriented diagonal to the first gate lines. In some embodiments, a quantum dot device may include a quantum well stack; a two-dimensional array of gates above the quantum well stack, including rows and columns of gates; an array of parallel first gate lines, wherein individual ones of the first gate lines are electrically coupled to alternating ones of the gates in individual rows; and an array of parallel second gate lines, wherein individual ones of the second gate lines are electrically coupled to alternating ones of the gates in individual columns.

The quantum dot devices disclosed herein may enable the formation of quantum dots to serve as quantum bits ("qubits") in a quantum computing device, as well as the control of these quantum dots to perform quantum logic operations. Unlike some previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

The disclosure may use the singular term "layer," but the term "layer" should be understood to refer to assemblies that may include multiple different material layers. For ease of discussion, all the lettered sub-figures associated with a particular numbered figure may be referred to by the number of that figure; for example, FIGS. 1A-1F may be referred to as "FIG. 1," FIGS. 2A-2W may be referred to as "FIG. 2," etc.

Figure 1D:
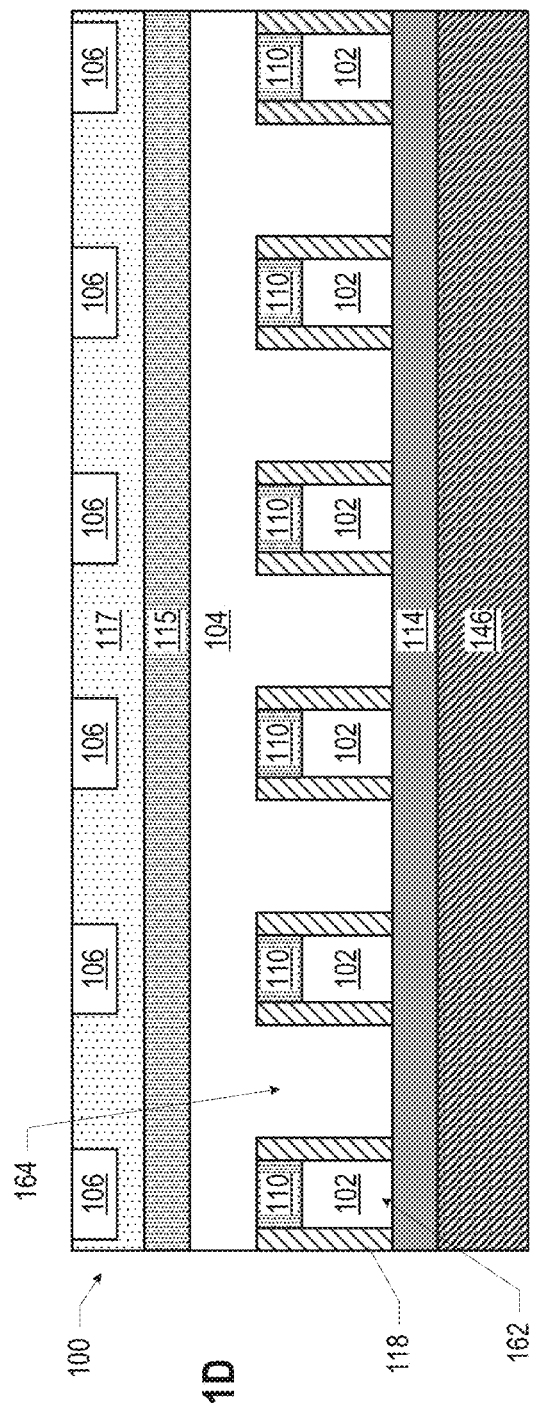
Figure 1E:
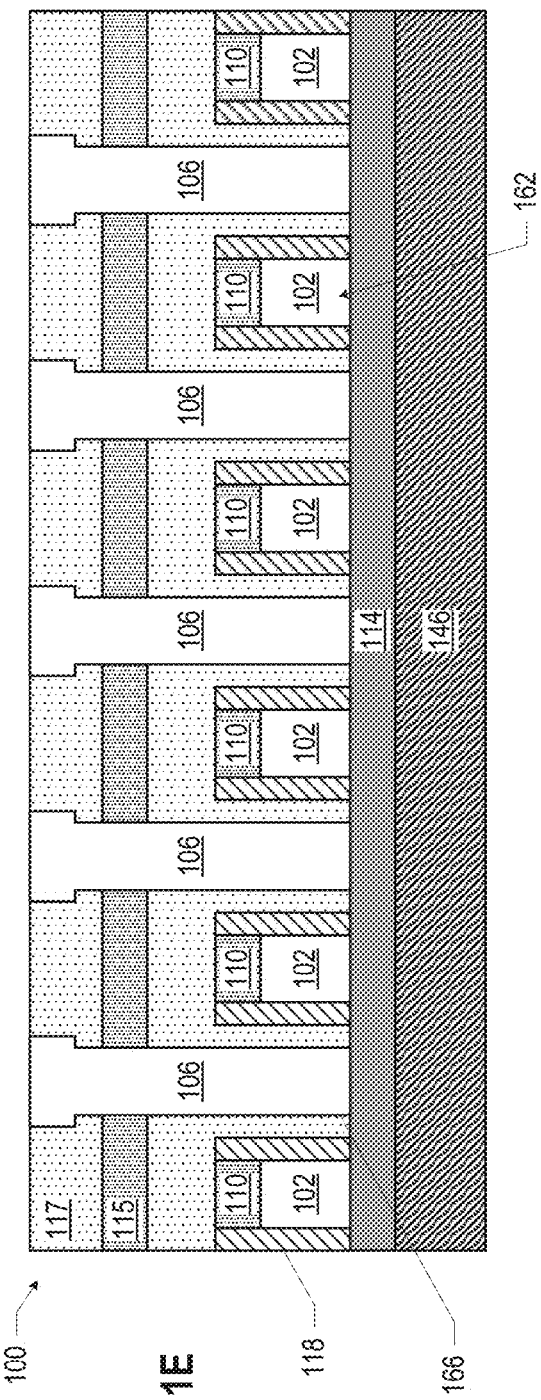

FIGS. 1A-1F are various views of a quantum dot device 100, in accordance with various embodiments. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 16-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals (e.g., voltages, currents, radio frequency (RF), and/or microwave signals) may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100; examples of quantum well stacks 146 are discussed below with reference to FIG. 10. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIG. 1 illustrates a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are discussed below with reference to FIGS. 8 and 11. Electrical interconnects (e.g., vias and conductive lines) may contact the first gate lines 102, second gate lines 104, and third gate lines 106 in any desired manner; some example arrangements are discussed below with reference to FIG. 10.

Not illustrated in FIG. 1 (or FIG. 3, 5, 6, 8, or 11, discussed below), are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments (e.g., as discussed below with reference to FIG. 10), a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein (e.g., the quantum dot devices 100 discussed herein with reference to FIGS. 1, 3, 5, 6, 8, and 11).

Figure 2A:
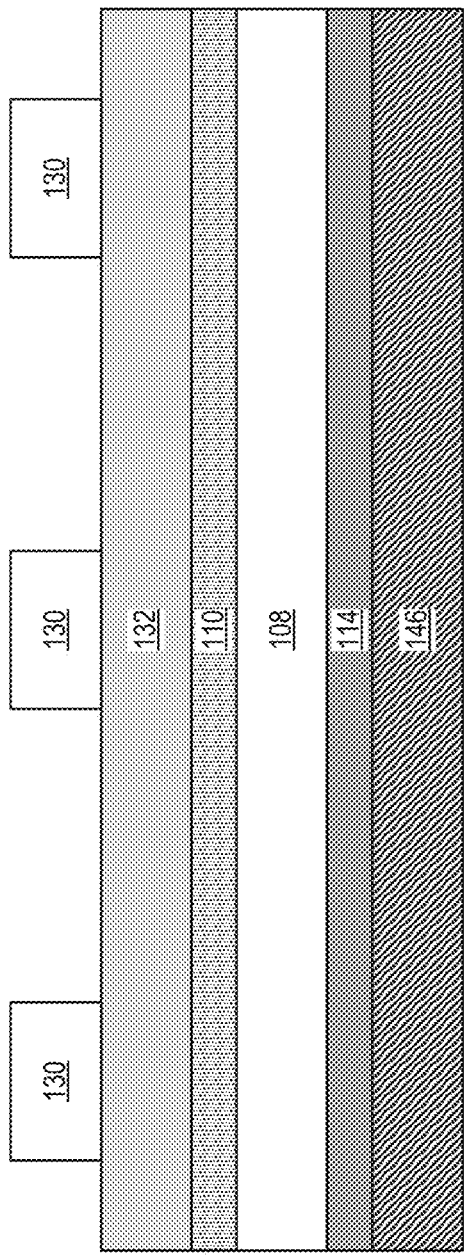
FIGS. 2A-2W illustrate various example stages in the manufacture of the quantum dot device of FIGS. 1A-1F, in accordance with various embodiments.
Figure 2B:
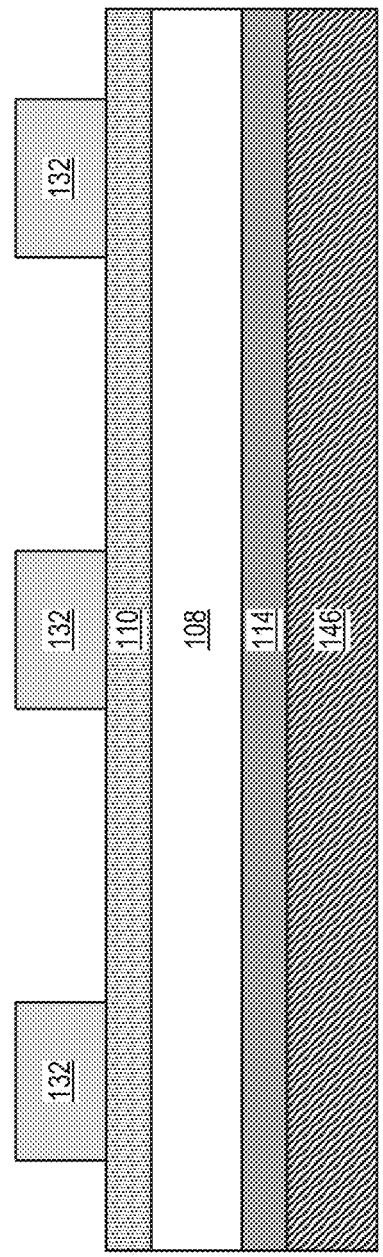
Figure 2E:
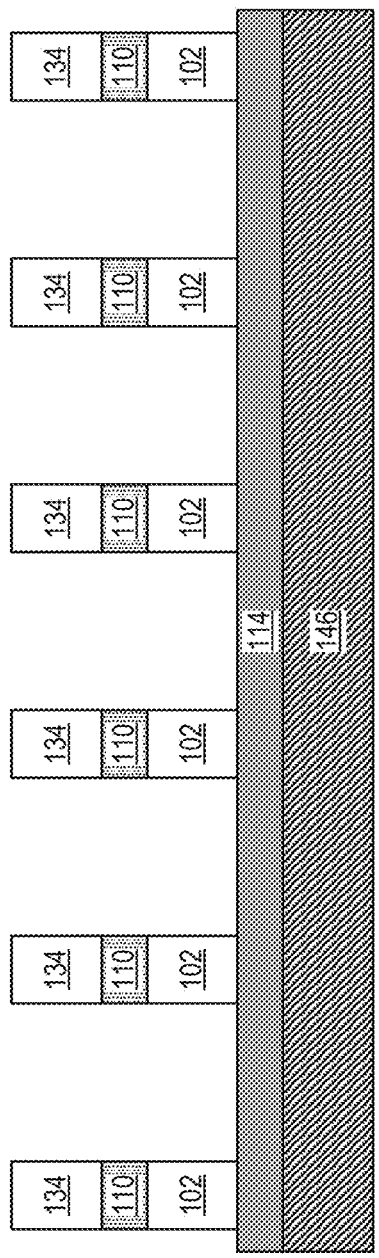
Figure 2F:
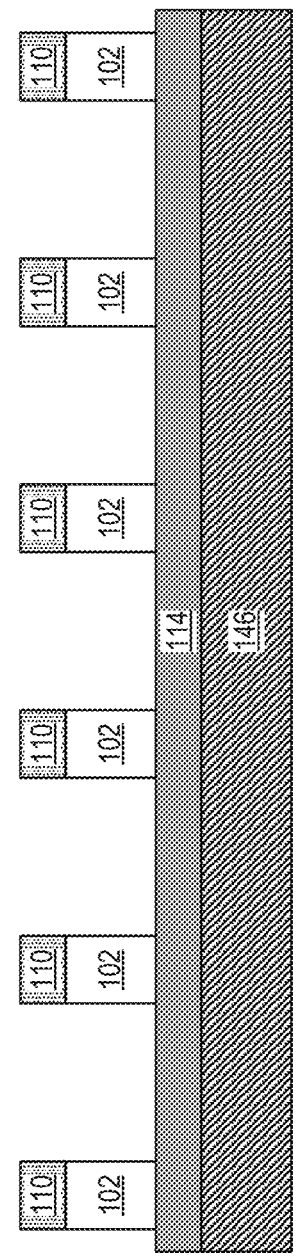
Figure 2G:
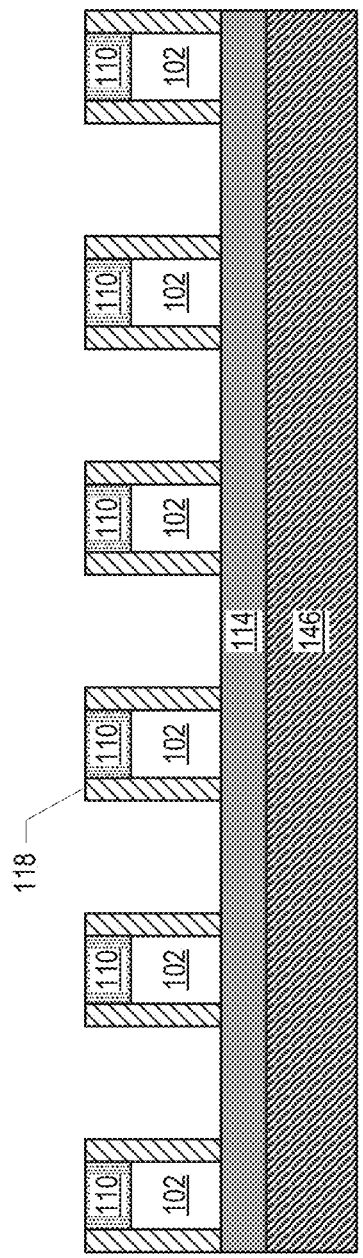
Figure 2H:
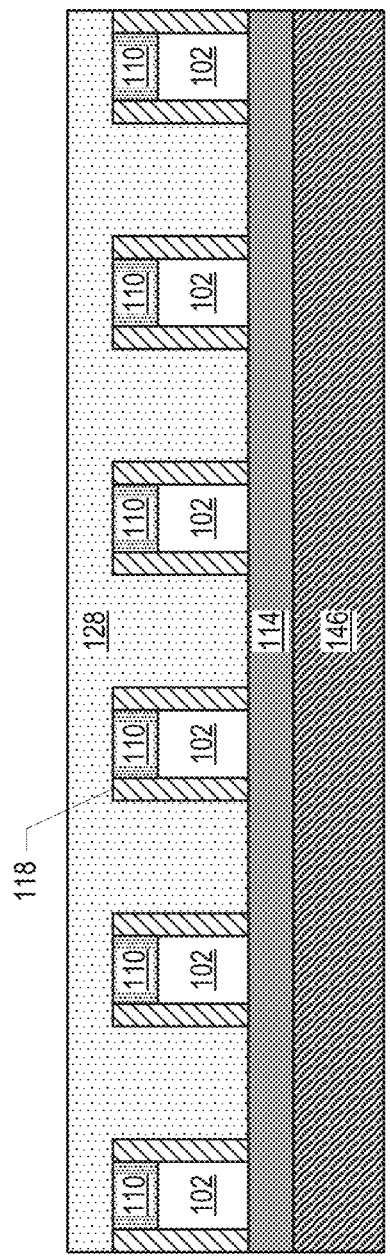
Figure 21:
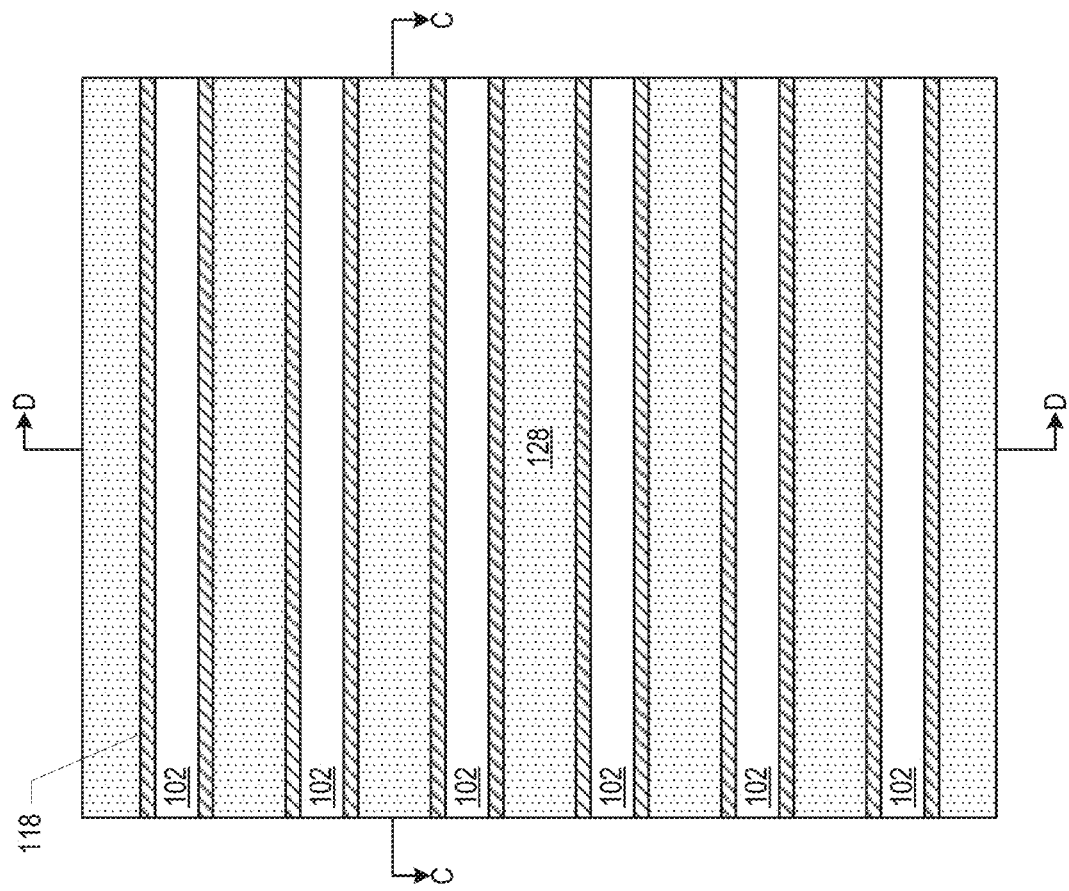
Figure 2J:
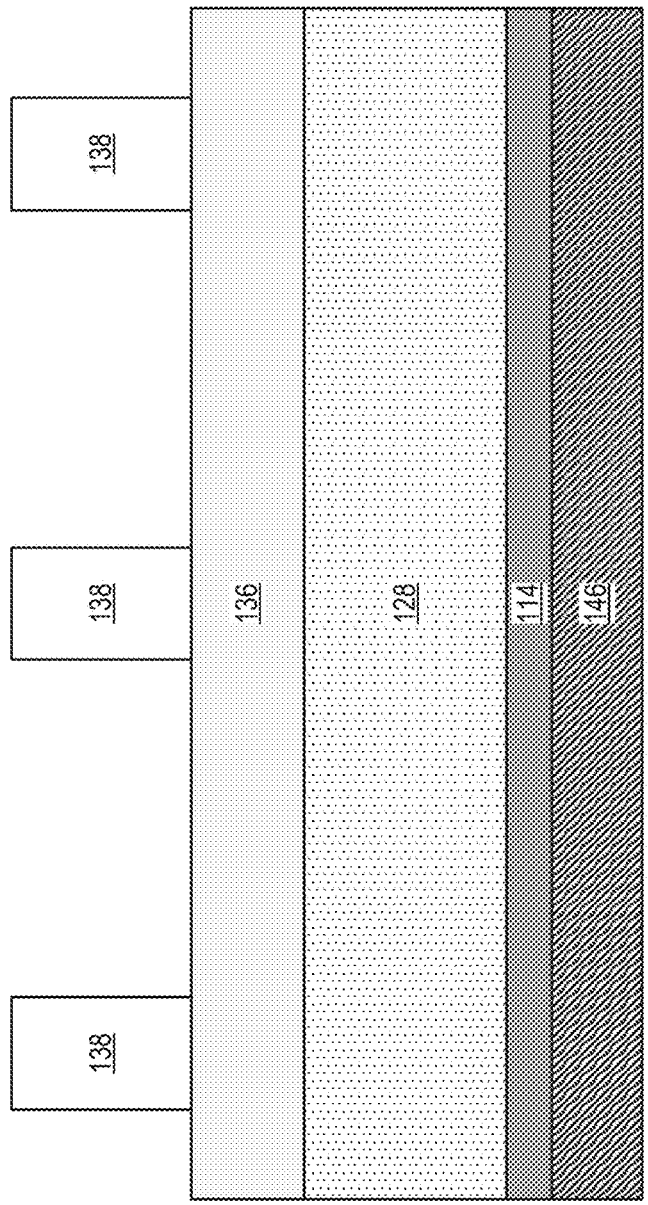
Figure 2K:
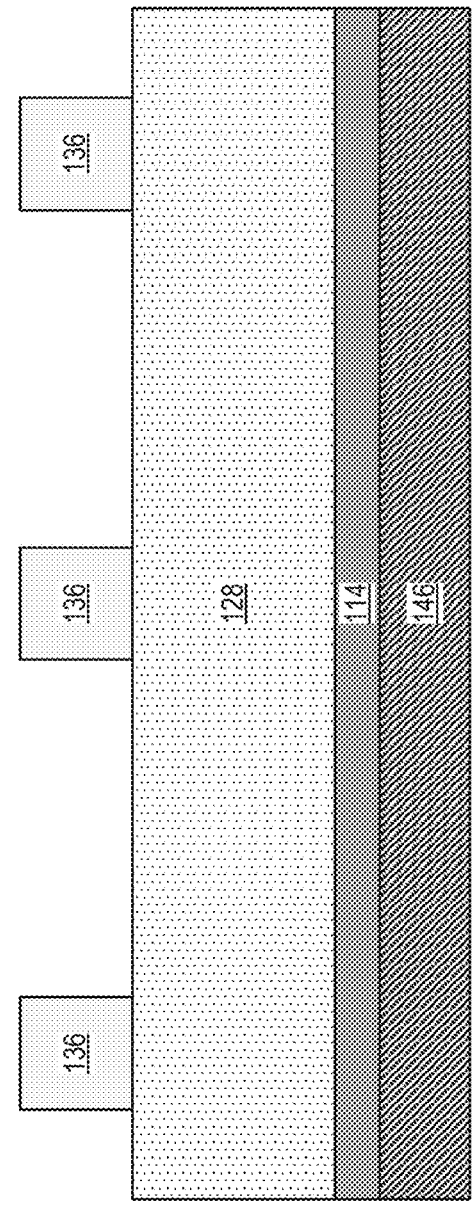
Figure 2L:
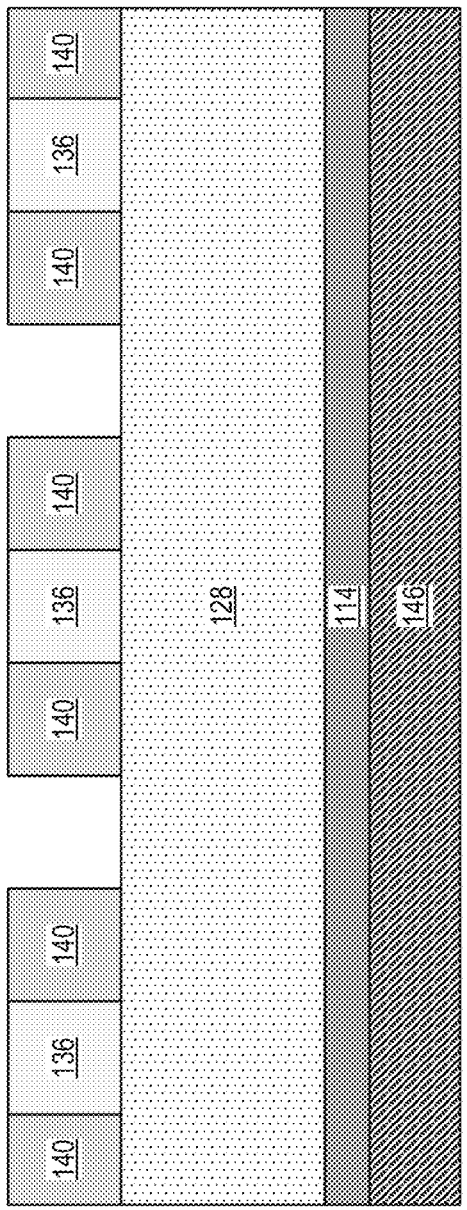
Figure 2M:
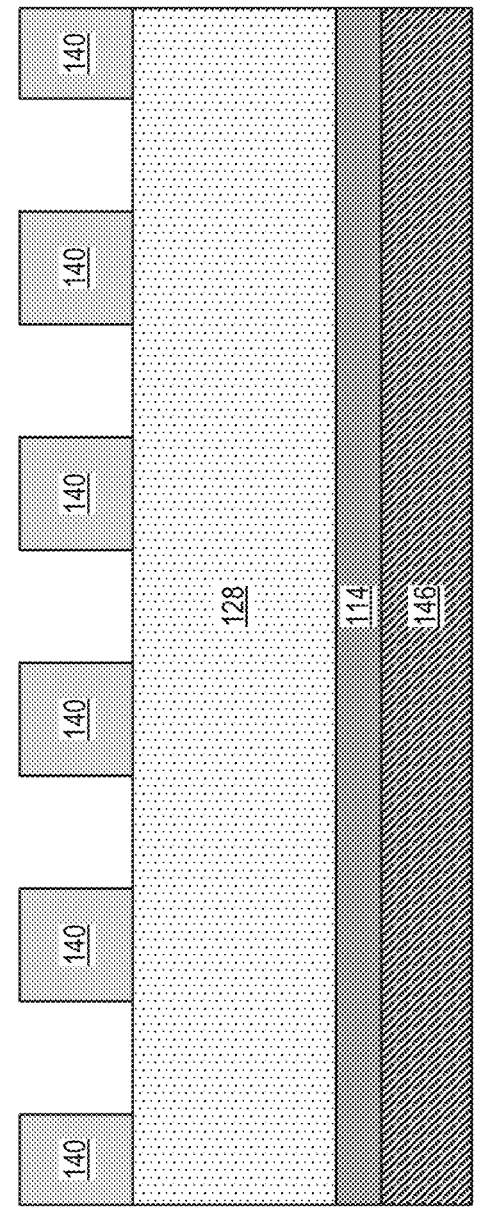
Figure 2T:
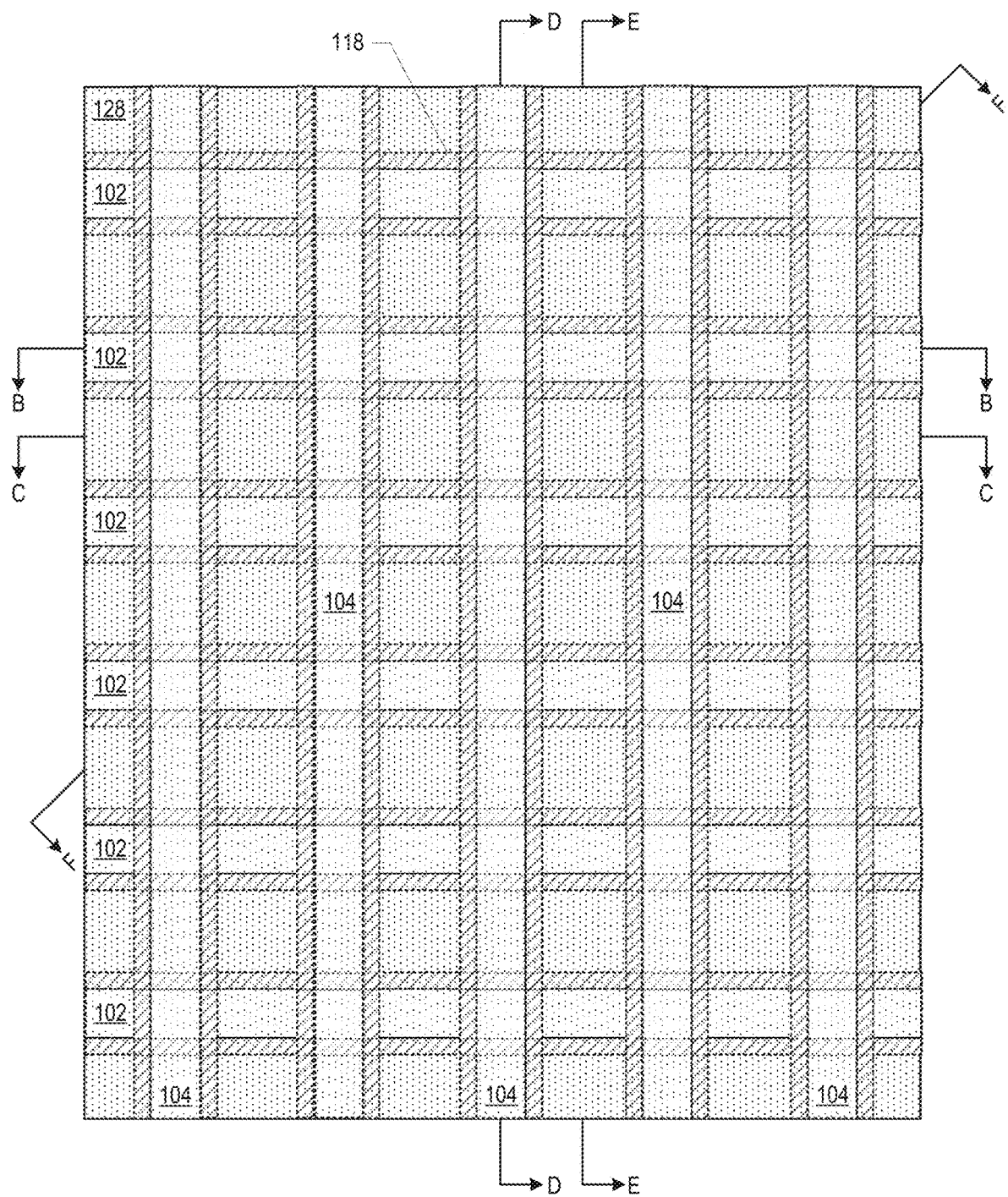
Figure 2U:
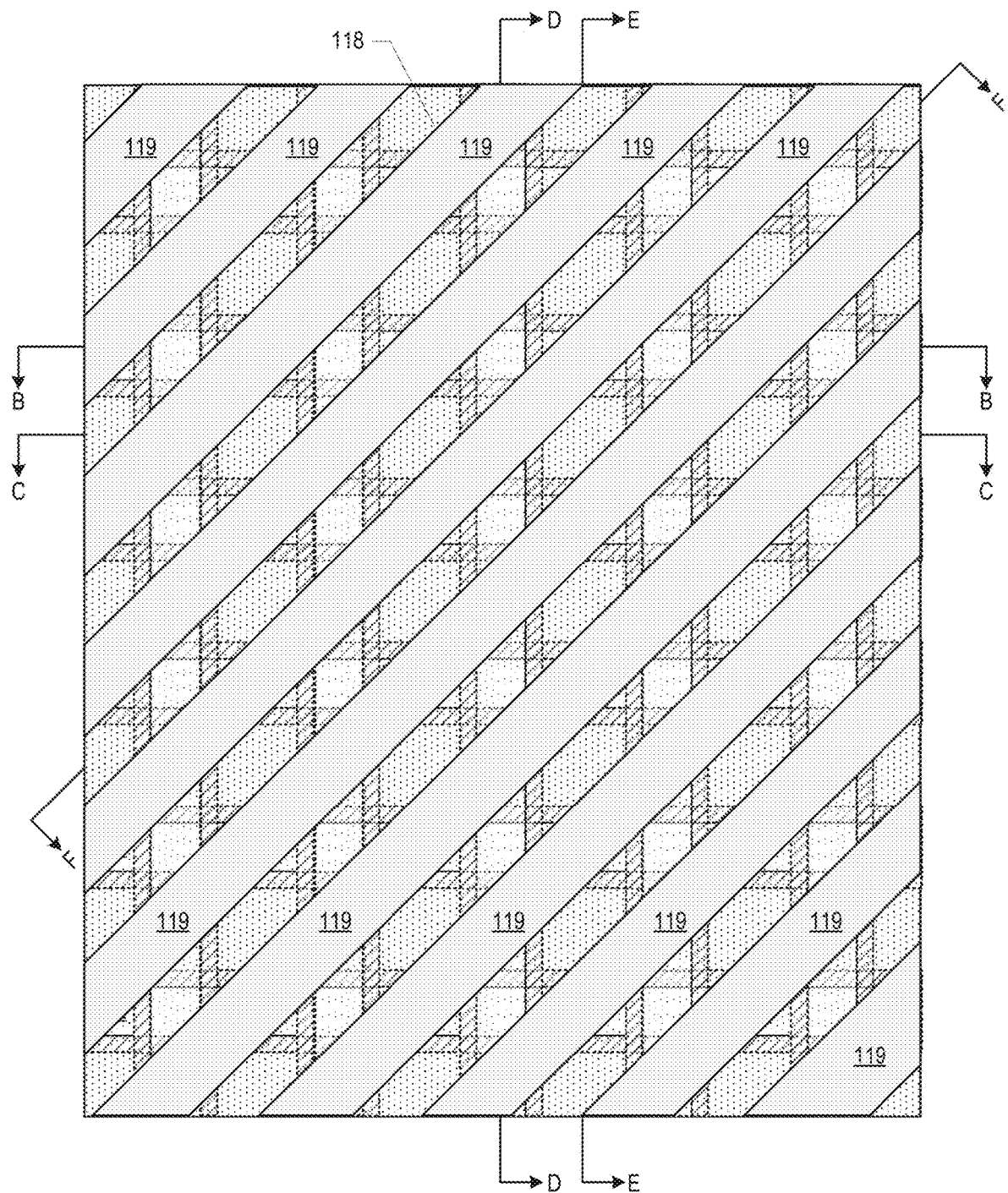
Figure 2V:
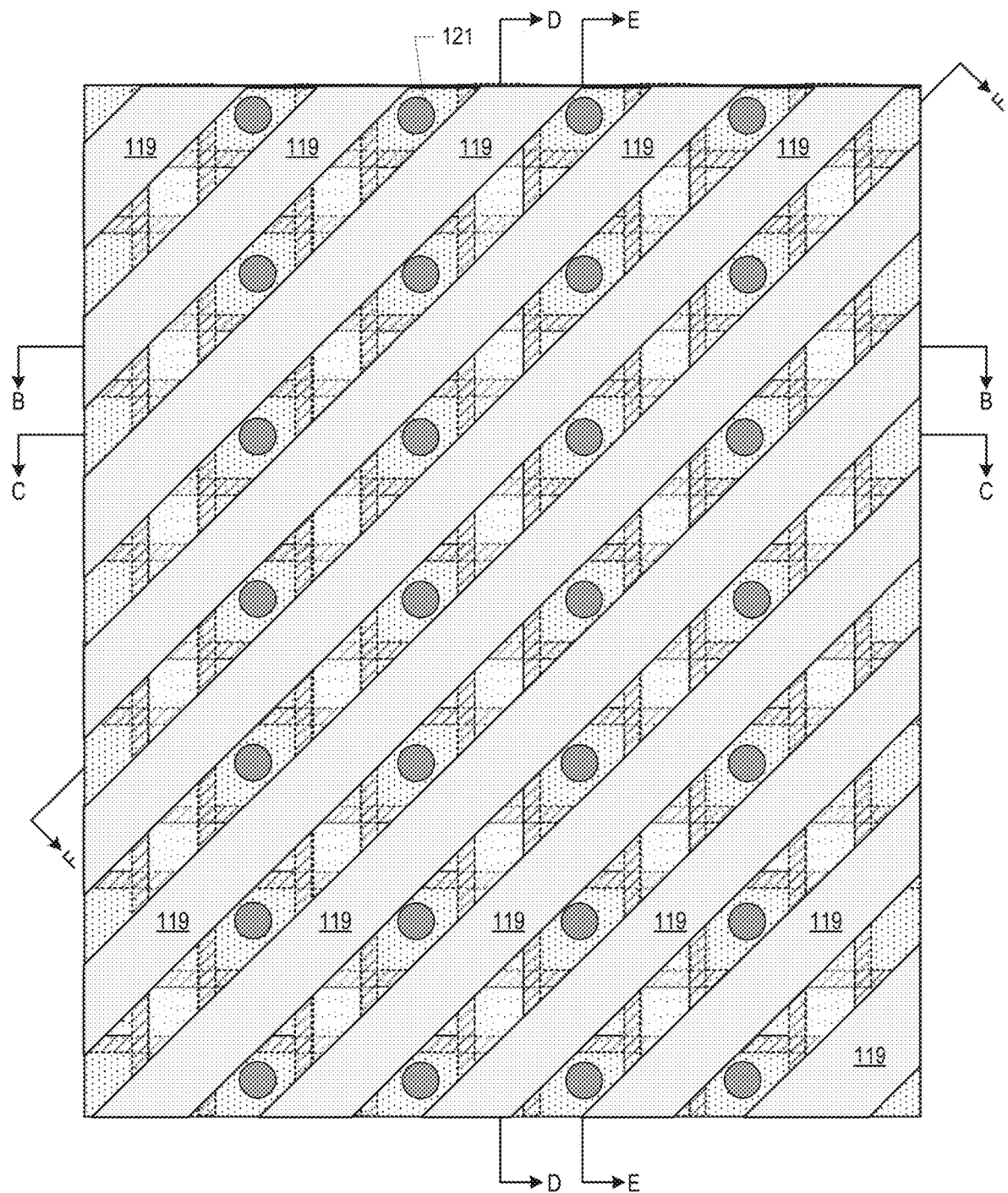
Figure 2W:
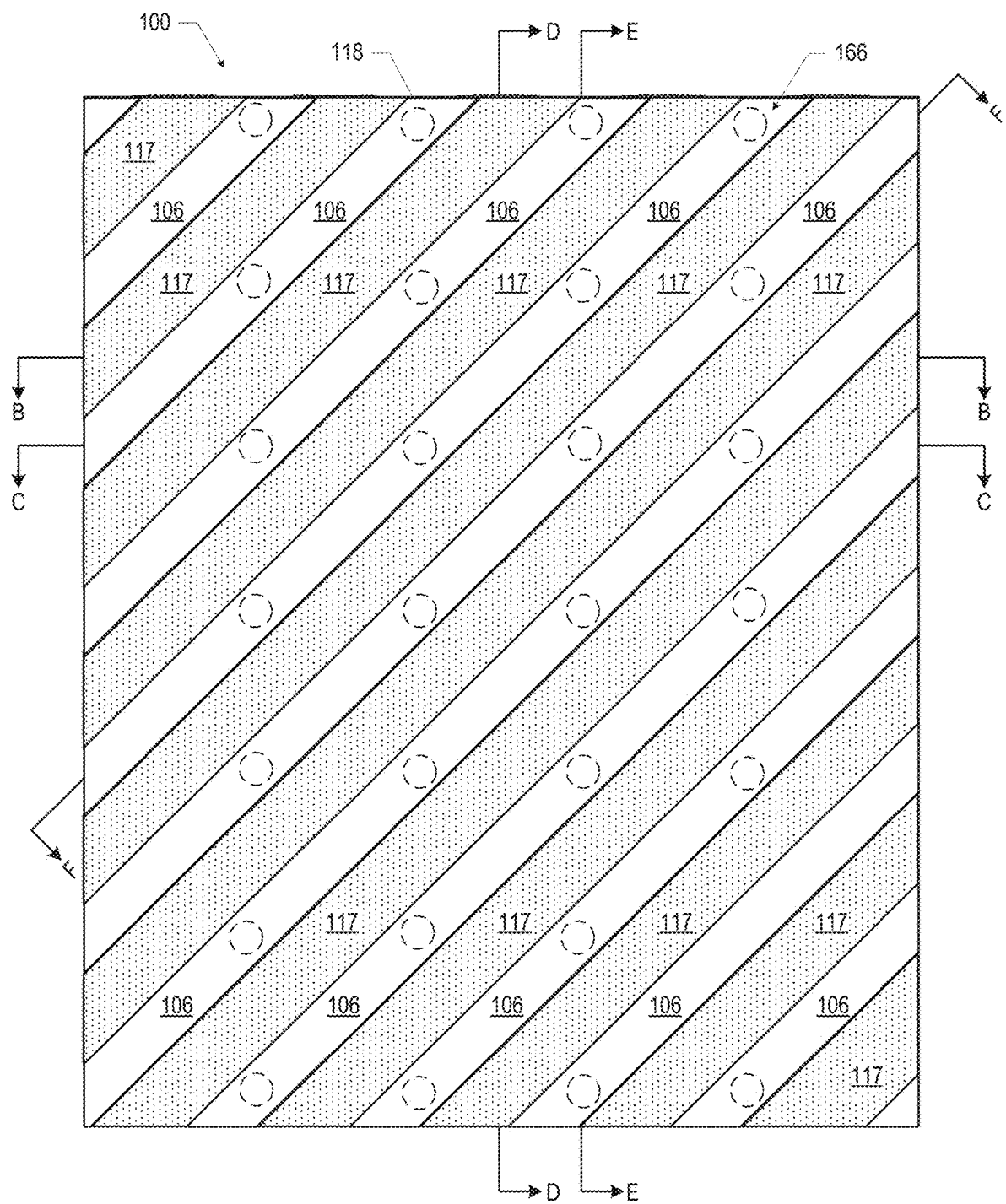

FIGS. 2A-2W illustrate various example stages in the manufacture of the quantum dot device 100 of FIG. 1, in accordance with various embodiments. The views illustrated in FIGS. 2A-2H are taken along the cross-section of FIG. 1D, the view illustrated in FIG. 2I is a top view with the same perspective as FIG. 1A, the views illustrated in FIGS. 2J-2P are taken along the cross-section of FIG. 1C, the view illustrated in FIG. 2Q is taken along the cross-section of FIG. 1B, the view illustrated in FIG. 2R is taken along the cross-section of FIG. 1D, the view illustrated in FIG. 2S is taken along the cross-section of FIG. 1E, and the views illustrated in FIGS. 2T-2W are top views with the same perspective as FIG. 1A.

FIG. 2A illustrates an assembly including a quantum well stack 146, a gate dielectric 114 disposed on the quantum well stack 146, a gate metal 108 disposed on the gate dielectric 114, a hardmask 110 disposed on the gate metal 108, a template material 132 disposed on the hardmask 110, and a patterned photoresist 130 disposed on the template material 132. The photoresist 130 may be any suitable material, and may be patterned using any suitable technique. In some embodiments, the template material 132 may be amorphous silicon, an anti-reflective coating (ARC) such as a carbon hardmask or a sacrificial light absorbing material (SLAM), or any other suitable material.

FIG. 2B illustrates an assembly subsequent to patterning the template material 132 of the assembly of FIG. 2A in accordance with the pattern of the photoresist 130, then removing the photoresist 130. Any suitable etch process may be used to pattern the template material 132.

FIG. 2C illustrates an assembly subsequent to providing spacer material 134 on side faces of the patterned template material 132 of the assembly of FIG. 2B. The spacer material 134 of FIG. 2C may be formed by depositing a conformal layer of the spacer material 134 over the patterned template material 132, then performing a directional etch to etch the spacer material 134 "downward," leaving the spacer material 134 on the sides of the patterned template material 132. The spacer material 134 may be an insulating material, for example.

FIG. 2D illustrates an assembly subsequent to removing the template material 132 from the assembly of FIG. 2C. The template material 132 may be removed using any suitable etch process.

FIG. 2E illustrates an assembly subsequent to etching the hardmask 110 and the gate metal 108 of the assembly of FIG. 2D in accordance with the pattern provided by the spacer material 134 (i.e., the hardmask 110 and gate metal 108 not masked by the spacer material 134 may be removed) to form first gate lines 102. Any suitable etch process may be used to pattern the hardmask 110 and the gate metal 108. In some embodiments, as shown, the etch may stop at the gate dielectric 114.

FIG. 2F illustrates an assembly subsequent to removing the spacer material 134 of the assembly of FIG. 2E. Any suitable technique may be used.

FIG. 2G illustrates an assembly subsequent to providing spacer material 118 on side faces of the patterned hardmask 110 and first gate lines 102 of the assembly of FIG. 2F. The spacer material 118 of FIG. 2G may be formed using the techniques discussed above with reference to FIG. 2C, for example.

FIG. 2H illustrates an assembly subsequent to providing an insulating material 128 on the assembly of FIG. 2G. The insulating material 128 may be, for example, an interlayer dielectric (ILD). In some embodiments, the insulating material 128 may fill the area above the gate dielectric 114 between adjacent portions of spacer material 118 and extend over the hardmask 110, as shown. In some embodiments, the insulating material 128 may be planarized after deposition (e.g., using a chemical mechanical polishing (CMP) technique). FIG. 2I is a "top" view of the assembly of FIG. 2H, with some of the insulating material 128 removed to show the first gate lines 102. FIG. 2H is a cross-sectional view of the assembly of FIG. 2I through the section D-D.

FIG. 2J is a cross-sectional view through the section C-C of FIG. 2I, subsequent to providing template material 136 and a patterned photoresist 138 on the insulating material 128 of the assembly of FIG. 2I. The template material 136 and patterned photoresist 138 may take the form of any of the template materials and patterned photoresists, respectively, discussed above with reference to FIG. 2A.

FIG. 2K illustrates an assembly subsequent to patterning the template material 136 of the assembly of FIG. 2J in accordance with the pattern of the photoresist 138, then removing the photoresist 138. Any suitable etch process may be used to pattern the template material 136.

FIG. 2L illustrates an assembly subsequent to providing spacer material 140 on side faces of the patterned template material 136 of the assembly of FIG. 2K. The spacer material 140 of FIG. 2L may be formed using the techniques discussed above with reference to FIG. 2C, for example.

FIG. 2M illustrates an assembly subsequent to removing the template material 136 from the assembly of FIG. 2L. The template material 136 may be removed using any suitable etch process.

FIG. 2N illustrates an assembly subsequent to etching the insulating material 128 of FIG. 2M in accordance with the pattern provided by the spacer material 140 (i.e., the insulating material 128 not masked by the spacer material 140 may be removed) to form trenches 113 in the insulating material 128. Any suitable etch process may be used to pattern the insulating material 128. In some embodiments, as shown, the etch may stop at the gate dielectric 114.

FIG. 2O illustrates an assembly subsequent to removing the spacer material 140 of the assembly of FIG. 2N, and providing spacer material 118 on the side faces of the patterned insulating material 128 in the trenches 113. The spacer material 140 may be removed using any suitable technique. The spacer material 118 of FIG. 2O may be formed using the techniques discussed above with reference to FIG. 2C, for example.

FIG. 2P illustrates an assembly subsequent to filling the trenches 113 of the assembly of FIG. 2O with a metal to form second gate lines 104, and providing a hardmask 115 and an insulating material 117 on top. The second gate lines 104 may be formed by depositing a metal (e.g., using chemical vapor deposition (CVD), physical vapor deposition (PVD), atomic layer deposition (ALD), or any other suitable technique), then polishing the deposited metal (e.g., using a CMP technique) to remove the overburden and create distinct second gate lines 104. The hardmask 115 and the insulating material 128 may be provided using any suitable technique. FIGS. 2Q-2T illustrate the assembly of FIG. 2P from different views: the view illustrated in FIG. 2Q is taken along the section B-B of FIG. 2R (the same perspective as FIG. 1B), the view illustrated in FIG. 2R is taken along the section D-D of FIG. 2P (the same perspective as FIG. 1D), and the view illustrated in FIG. 2S is taken along the section E-E of FIG. 2Q (the same perspective as FIG. 1E), and FIG. 2T is a top view with some of the materials removed to show the first gate lines 102 and the second gate lines 104.

FIG. 2U is a top view of an assembly subsequent to providing and patterning a mask material 119 (e.g., a hardmask) on the assembly of FIGS. 2P-2T, and etching diagonal trenches into the insulating material 117 to a desired depth in accordance with the patterned mask material 119. The mask material 119 may be any suitable material (e.g., a photoresist and/or a hardmask), and may be patterned diagonally relative to the first gate lines 102 and the second gate lines 104 to expose diagonal arrays of openings in the grid formed by the first gate lines 102 and the second gate lines 104. The diagonal portions of the mask material 119 may have a substantially equal width and spacing relative to each other. The insulating material 117 may be etched to a desired depth using, for example, a timed etch. Any suitable lithographic technique may be used to pattern the mask material 119.

FIG. 2V is a top view of an assembly subsequent to forming cavities 121 in the assembly of FIG. 2U. The cavities 121 may extend through the insulating material 117, the hardmask 115, and the insulating material 128 in the exposed openings in the grid formed by the first gate lines 102 and the second gate lines 104. The cavities 121 may land on the gate dielectric 114. In some embodiments, the cavities 121 may be formed using a photobucket technique. The cavities 121 may be holes for vias, and in some embodiments, may be tapered (e.g., narrowing towards the quantum well stack 146).

FIG. 2W is a top view of an assembly subsequent to providing a metal on the assembly of FIG. 2V so that the metal fills the cavities 121 and the trenches in the insulating material 117 (with the metal in the cavities 121 providing the third gates 166), and planarizing the assembly to remove the mask material 119 and any overburden of the metal (with the remaining metal providing the third gate lines 106). The assembly of FIG. 2W may take the form of the quantum dot device 100 illustrated in FIG. 1.

The patterning technique discussed above with reference to FIGS. 2A-2F may be referred to as a spacer-based pitch-halving technique for patterning the first gate lines 102; using spacer materials, the gate metal 108 may be patterned with a pitch that is half of the pitch of the patterned photoresist 130. FIGS. 2J-2P illustrate a spacer-based pitch-halving technique for patterning the second gate lines 104. Other techniques may be used to pattern the first gate lines 102 and the second gate lines 104. For example, a spacer-based pitch-quartering technique (in which two rounds of spacer deposition are performed to pattern the underlying gate metal with a pitch that is a quarter of the pitch of the initial patterned photoresist), or any other subtractive, additive, or semi-additive technique, may be used. Further, spacer-based pitch-halving or pitch-quartering techniques may be used to perform any of the other patterning operations discussed herein, as desired (e.g., the patterning of the third gate lines 106 discussed above, or the patterning of the first gate lines 124 and the second gate lines 125 discussed below with reference to FIG. 3).

Figure 3A:
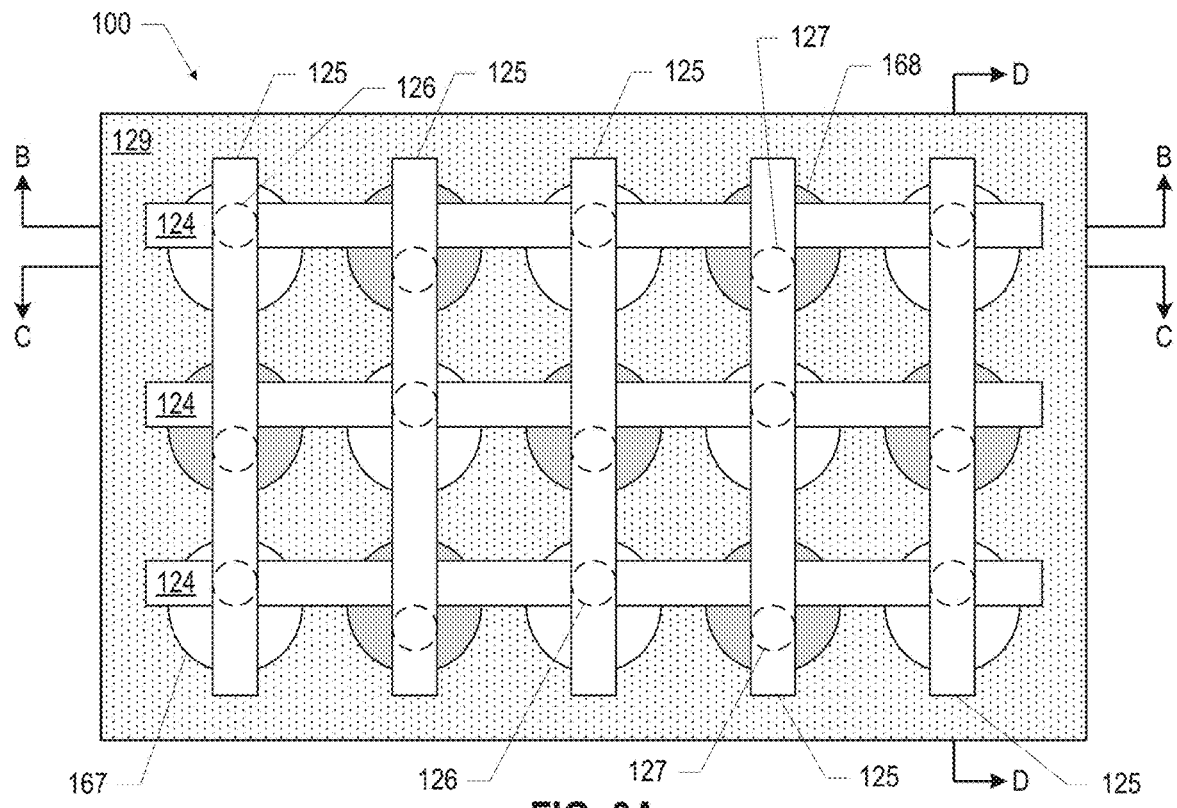
FIGS. 3A-3D are various views of a quantum dot device, in accordance with various embodiments.
Figure 3B:
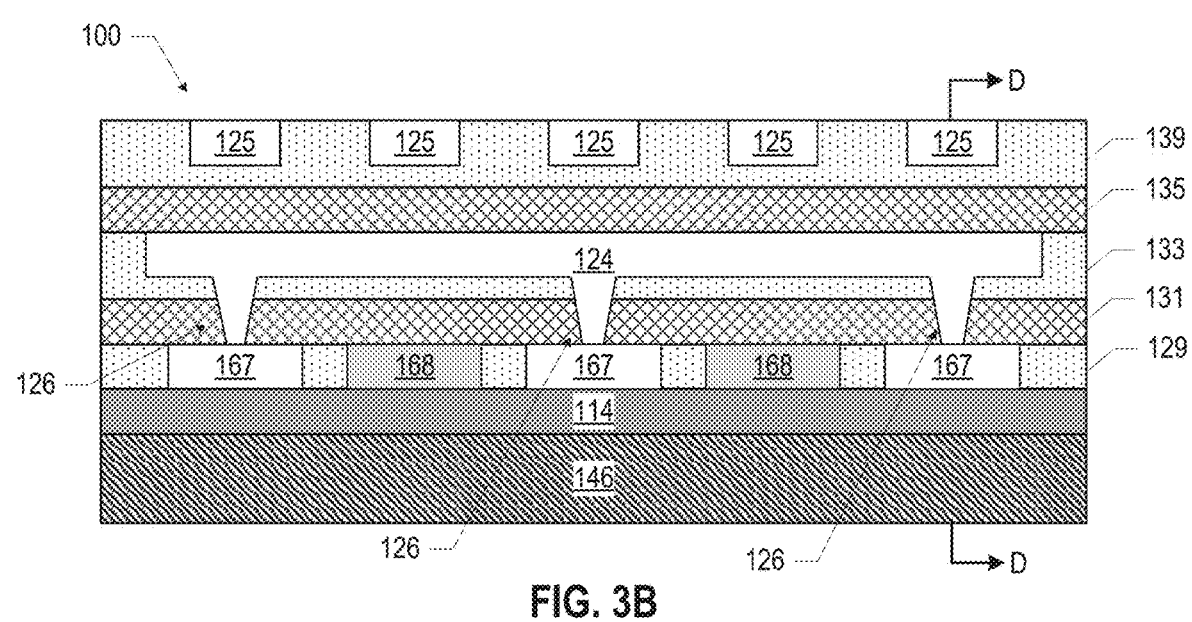
Figure 3C:
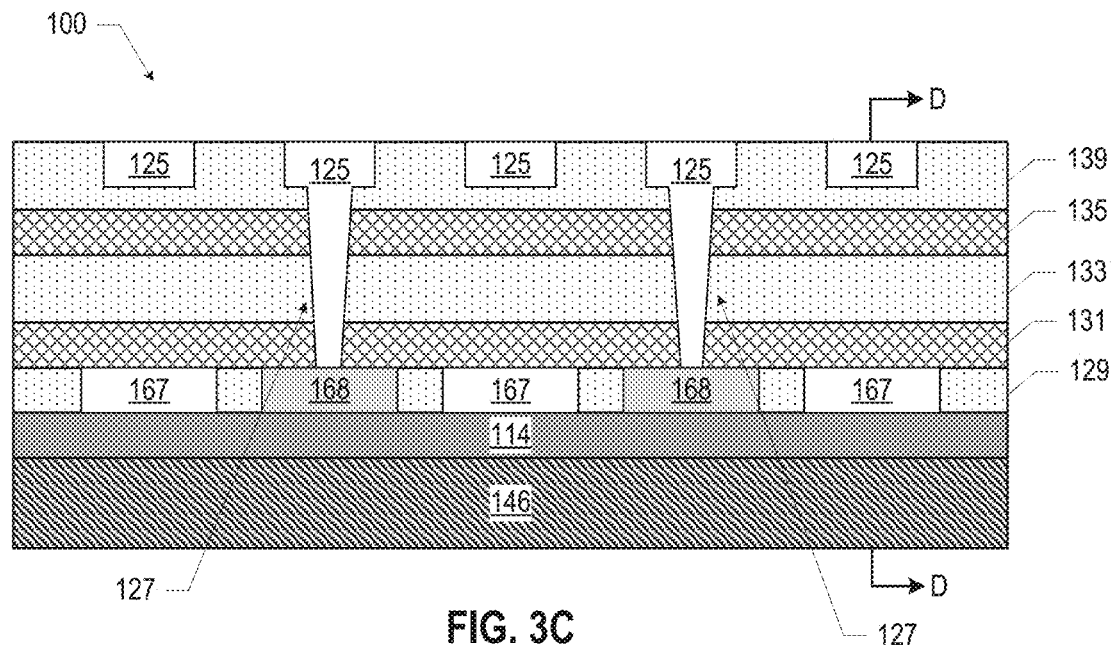
Figure 3D:
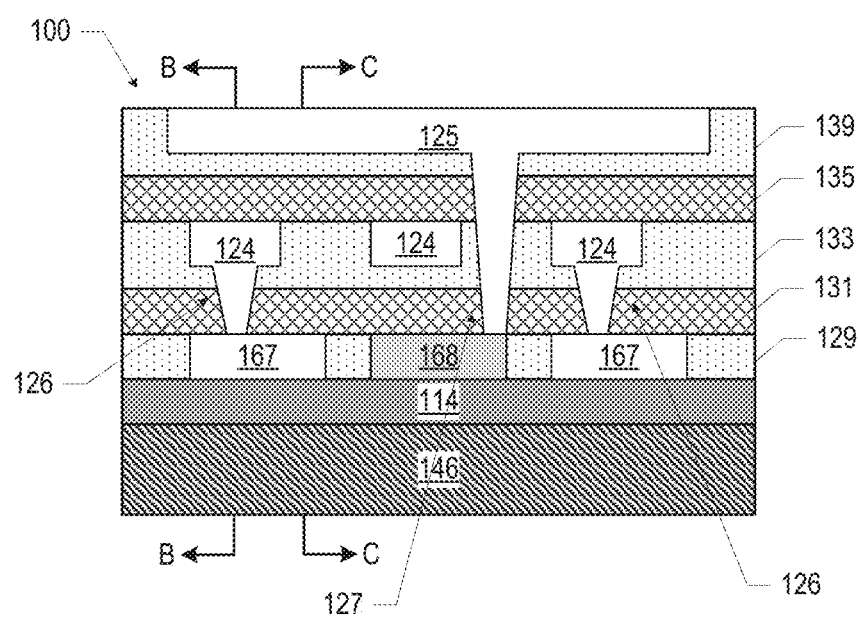

FIGS. 3A-3D are various views of another quantum dot device 100, in accordance with various embodiments. In particular, FIG. 3A is a top view of a portion of the quantum dot device 100 with some of the materials removed so that the first gate lines 124 and the second gate lines 125 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 3B-3D are side cross-sectional views of the quantum dot device 100 of FIG. 3A; in particular, FIG. 3B is a view through the section B-B of FIG. 3A, FIG. 3C is a view through the section C-C of FIG. 3A, and FIG. 3D is a view through the section D-D of FIG. 3A.

The quantum dot device 100 of FIG. 3 may include a quantum well stack 146 and a layer of gate dielectric 114, in accordance with any of the embodiments discussed above with reference to FIG. 1. The quantum dot device 100 of FIG. 3 may also include an array of first gate lines 124 running parallel to each other, and an array of second gate lines 125 running parallel to each other and perpendicular to the first gate lines 124. The first gate lines 124 and the second gate lines 125 may thus form a grid, as illustrated in FIG. 1. Each first gate line 124 may include one or more first gates 167, which may be disposed on the gate dielectric 114, and each second gate line 125 may include one or more second gates 168, which may be disposed on the gate dielectric 114. The first gates 167 and the second gates 168 may be arranged in a checkerboard pattern, as illustrated in FIG. 3, with first gates 167 and second gates 168 alternating in each row and column. The first gates 167/second gates 168 may be located at the intersections of the grid formed by the first gate lines 124 and the second gate lines 125, as shown.

In some embodiments, a first gate line 124 may include a conductive line and different vias 126 extending down to contact different associated first gates 167 (e.g., as illustrated in FIG. 3A, FIG. 3B, and FIG. 3D). Similarly, a second gate line 125 may include a conductive line and different vias 127 extending down to contact different associated second gates 168 (e.g., as illustrated in FIG. 3A, FIG. 3C, and FIG. 3D). In some embodiments, the conductive lines of the first gate lines 124 may all be included in a same interconnect layer of the quantum dot device 100 (e.g., as illustrated in FIG. 3), or may be included in different interconnect layers (not shown). Similarly, in some embodiments, the conductive lines of the second gate lines 125 may all be included in a same interconnect layer of the quantum dot device 100 (e.g., as illustrated in FIG. 3), or may be included in different interconnect layers (not shown). The conductive lines of the first gate lines 124 and the conductive lines of the second gate lines 125 may be included in different interconnect layers, as shown.

In some embodiments, the first gates 167 and the second gates 168 may be patterned simultaneously (e.g., as discussed below with reference to FIG. 4), and may have substantially the same shape and size. For example, the first gates 167 and the second gates 168 may be substantially circular, as illustrated in FIG. 3A. The vias 126 may contact the first gates 167 at any appropriate location at the surface of the first gates 167; for example, as illustrated in FIG. 3, the vias 126 (and the conductive lines of the first gate lines 124) may be offset from the centers of the first gates 167, and instead may contact the first gates 167 closer to a perimeter of the first gates 167. Similarly, the vias 127 may contact the second gates 168 at any appropriate location at the surface of the second gates 168; for example, as illustrated in FIG. 3, the vias 127 (and the conductive lines of the second gate lines 125) may be offset from the centers of the second gates 168, and instead may contact the second gates 168 closer to a perimeter of the second gates 168. The quantum dot device 100 may also include an insulating material 129, an etch stop material 131, an insulating material 133, an etch stop material 135, and an insulating material 139.

The quantum dot device 100 of FIG. 3 may be operated in any of a number of ways. For example, in some embodiments, electrical signals (e.g., voltages, RF, and/or microwave signals) may be provided to one or more first gate line 124 and/or second gate line 125 to cause a quantum dot (e.g., an electron spin-based quantum dot) to form in a quantum well stack 146 under the first gates 167 and/or the second gates 168. In some embodiments, the first gate lines 124 may be used as barrier gate lines, and the second gate lines 125 may be used as quantum dot gate lines; in such embodiments, electrical signals provided to the second gate lines 125 may control the electrical potential of quantum wells under the second gates 168, while electrical signals provided to the first gate lines 124 may control potential energy barriers in the quantum well stack 146 under the first gates 167. In other embodiments, the second gate lines 125 may be used as barrier gate lines, and the first gate lines 124 may be used as quantum dot gate lines. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates). Different ones of the first gate lines 124 may be electrically controlled in any desired combination (e.g., each first gate line 124 may be separately electrically controlled, or some or all the first gate lines 124 may be shorted together in one or more groups, as desired). Similarly, different ones of the second gate lines 125 may be electrically controlled in any desired combination (e.g., each second gate line 125 may be separately electrically controlled, or some or all the second gate lines 125 may be shorted together in one or more groups, as desired).

By connecting alternate ones of the gates in the quantum dot device 100 using two separate layers of metal interconnect, the quantum dot device 100 of FIG. 3 (and of FIGS. 5 and 6, discussed below) may exhibit an improved degree of control over electrostatic potentials relative to conventional devices, mitigating unintended interactions.

Figure 4A:
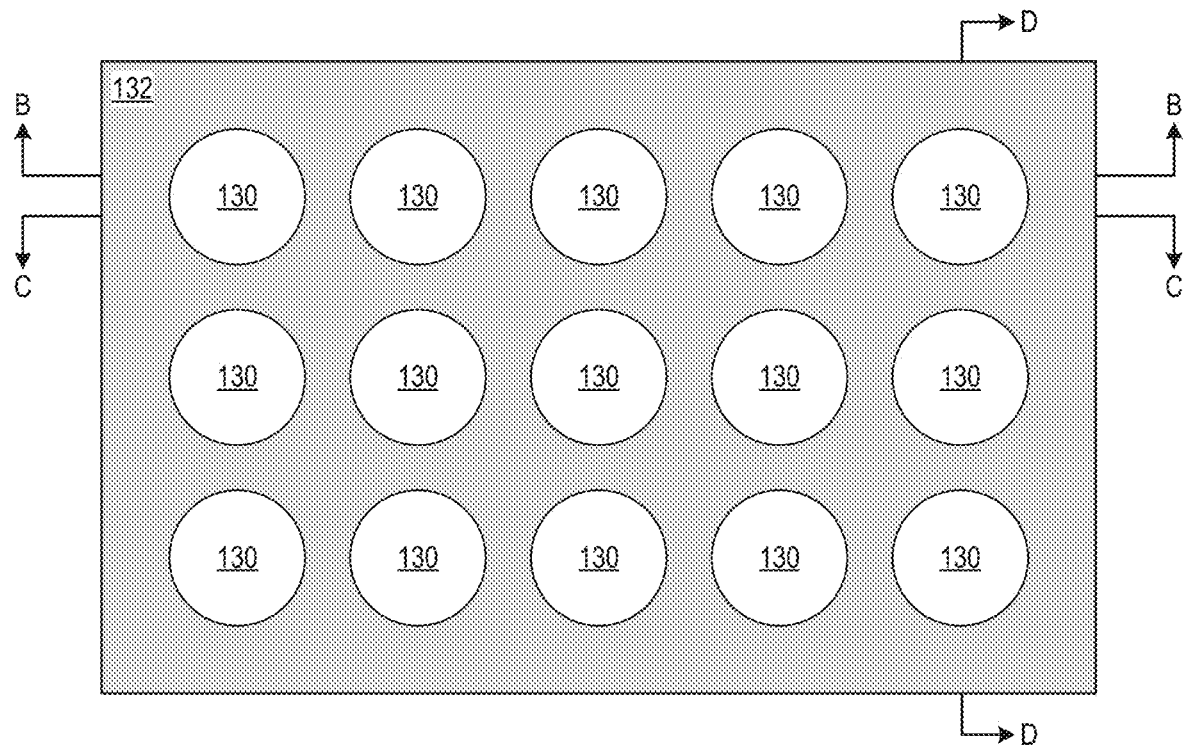
FIGS. 4A-4I illustrate various example stages in the manufacture of a quantum dot device of FIGS. 3A-3D, in accordance with various embodiments.
Figure 4B:
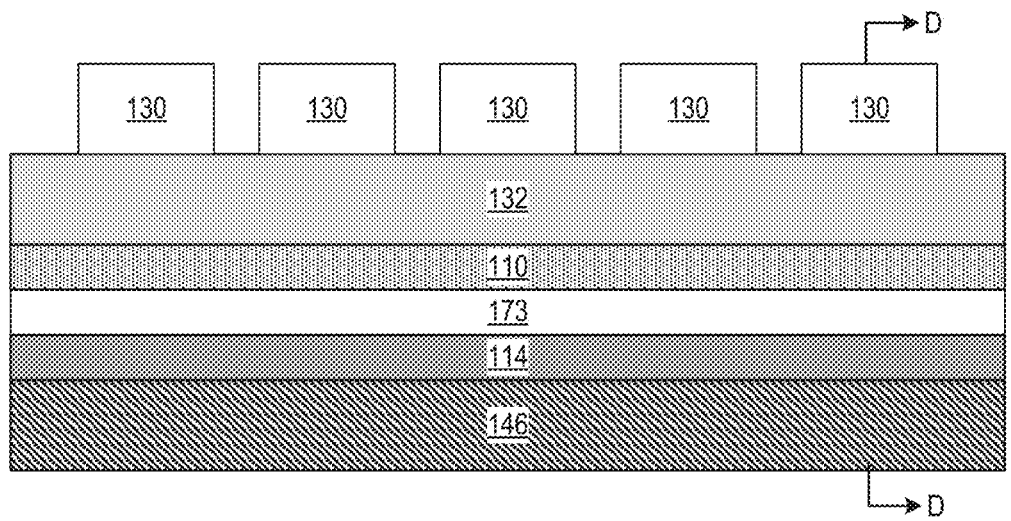
Figure 4C:
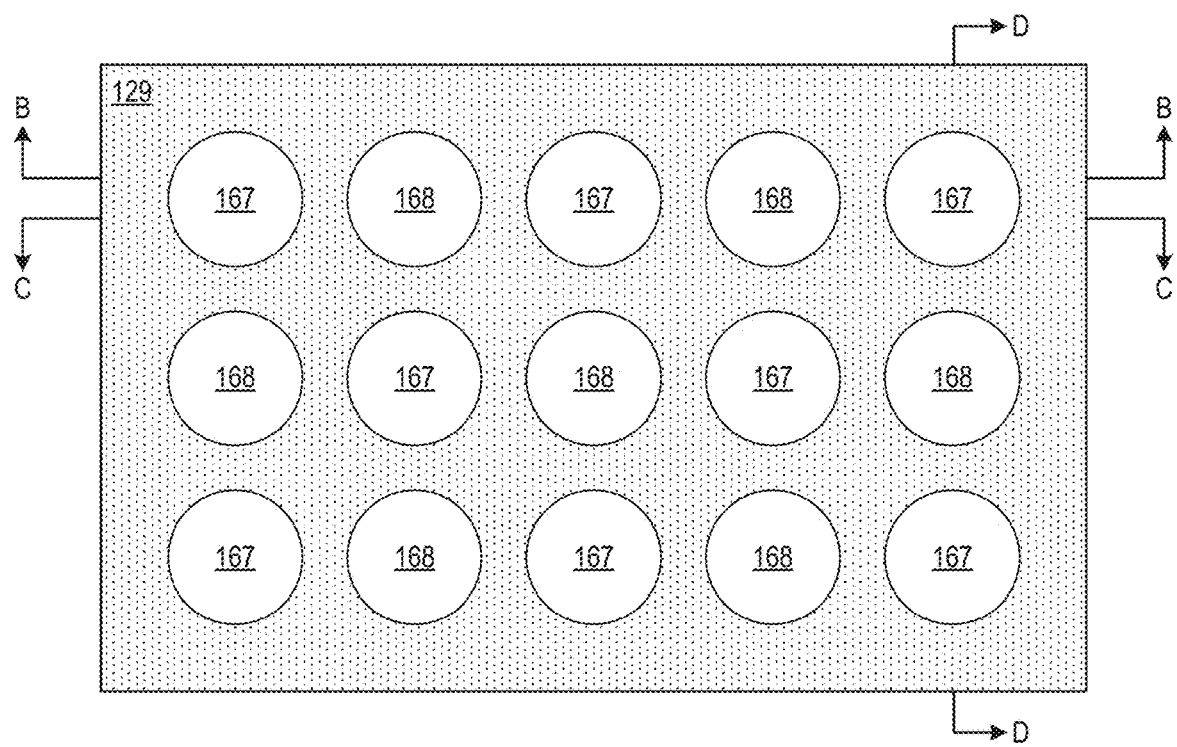
Figure 4D:
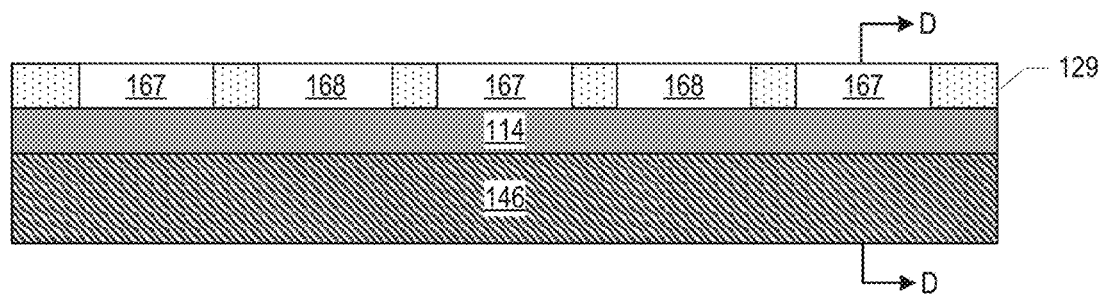
Figure 4E:
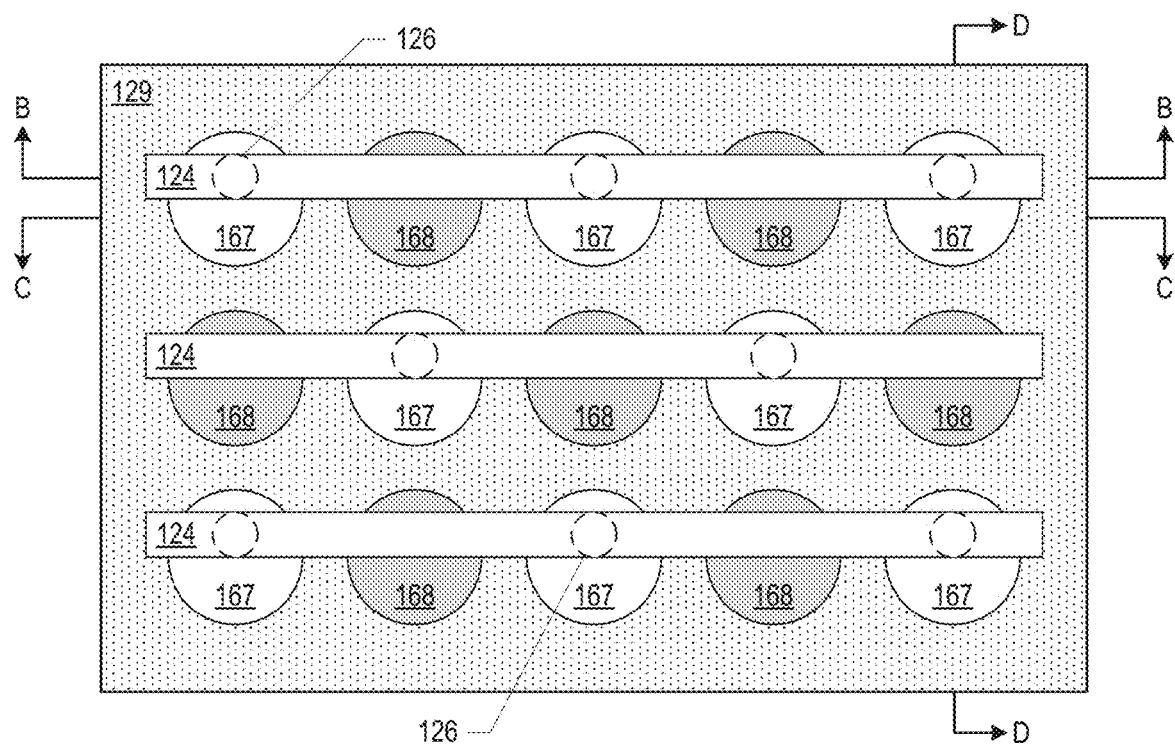
Figure 4F:
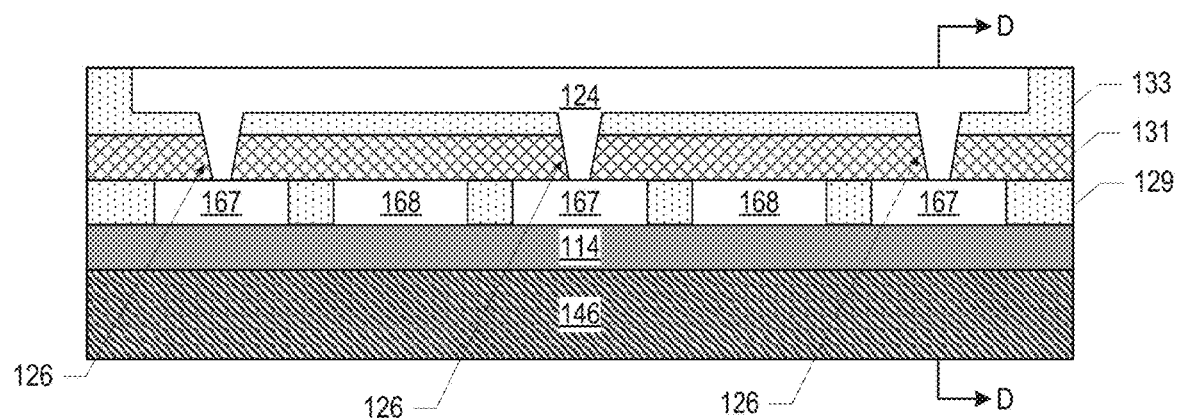
Figure 4G:
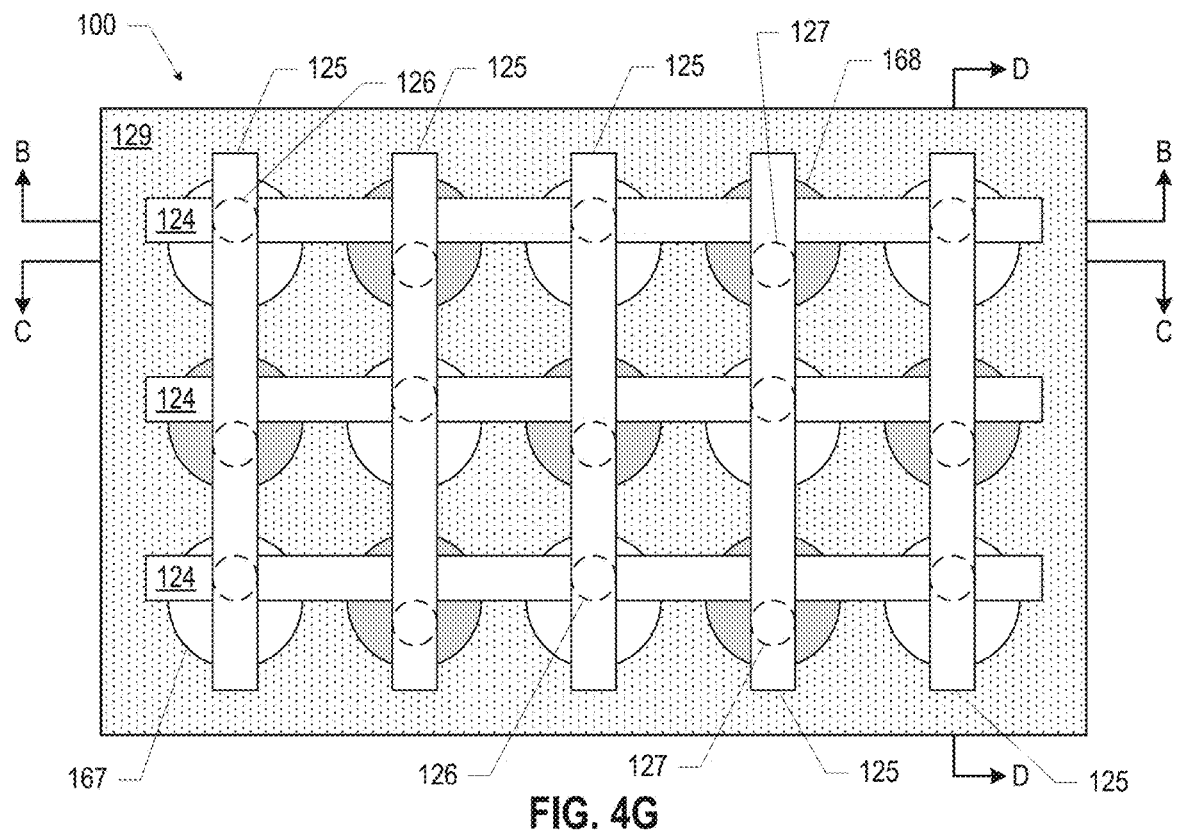
Figure 4H:
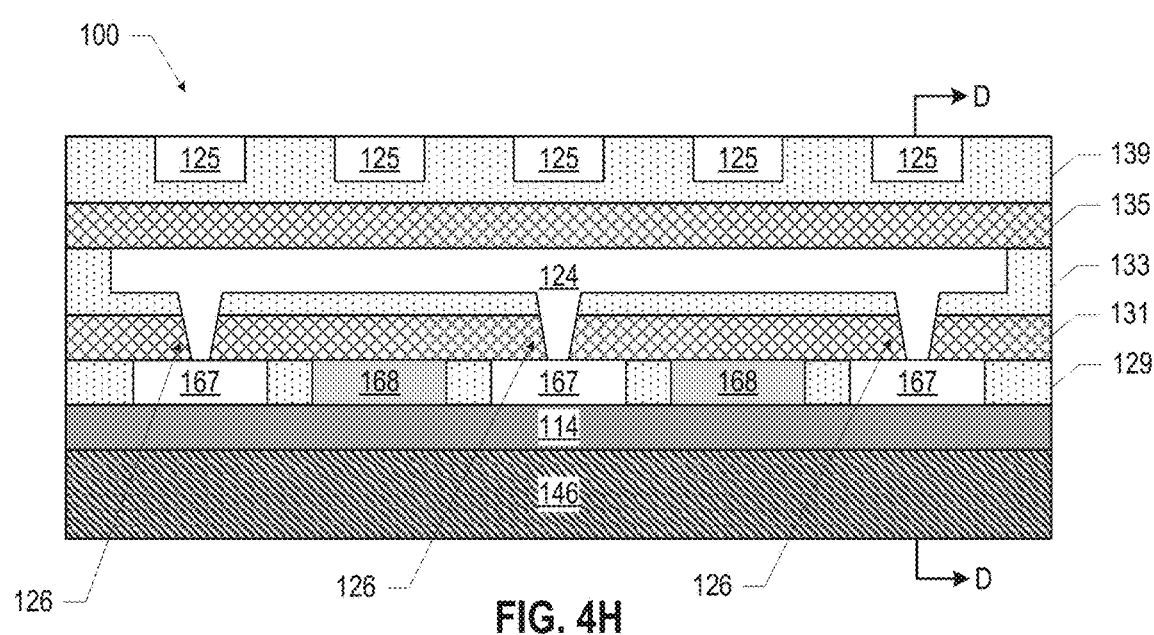
Figure 4I:
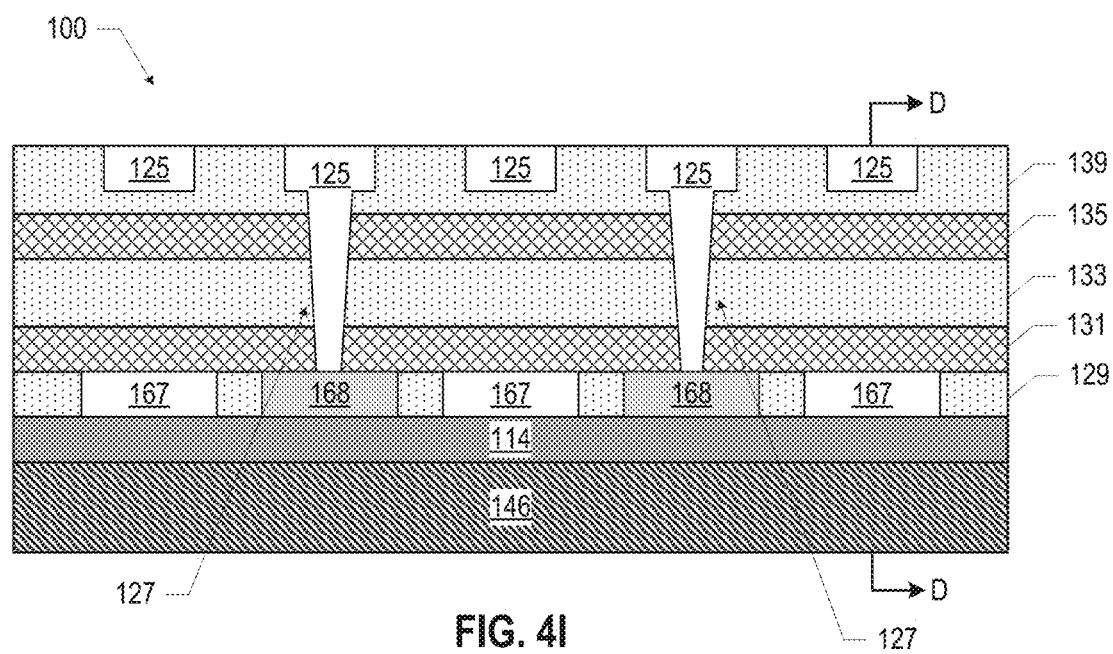

FIGS. 4A-4I illustrate various example stages in the manufacture of the quantum dot device 100 of FIG. 3, in accordance with various embodiments. The views illustrated in FIGS. 4A, 4C, and 4E, and 4G are top views with the same perspective as FIG. 3A (with some material removed to show the underlying structures), and the views illustrated in FIGS. 4B, 4D, 4F, and 4H are side cross-sectional views taken along the section B-B of FIGS. 4A, 4C, 4E, and 4H, respectively (the same perspective as FIG. 3B). The view illustrated in FIG. 4I is a side cross-sectional view taken along the section C-C of FIG. 4G.

FIGS. 4A and 4B illustrate an assembly including a quantum well stack 146, a gate dielectric 114 disposed on the quantum well stack 146, a gate metal 173 disposed on the gate dielectric 114, a hardmask 110 disposed on the gate metal 173, a template material 132 disposed on the hardmask 110, and a patterned photoresist 130 disposed on the template material 132. The photoresist 130 and the template material 132 may take any of the forms discussed above. The photoresist 130 may be patterned into a two-dimensional array of "islands," as shown; these islands may have any suitable shape (e.g., substantially circular, as shown).

FIGS. 4C and 4D illustrate an assembly subsequent to etching the template material 132, the hardmask 110, and the gate metal 173 of the assembly of FIGS. 4A and 4B in accordance with the pattern provided by the patterned photoresist 130 (i.e., the template material 132, the hardmask 110, and the gate metal 173 not masked by the patterned photoresist 130 may be removed) to form gates of the gate metal 173, removing the remaining photoresist 130, template material 132, and hardmask 110, and then filling the space between the gates with an insulating material 129. In FIGS. 4C and 4D, the gates are labeled as first gates 167 and second gates 168 in a checkerboard pattern, but as discussed above, the first gates 167 and the second gates 168 may be simultaneously patterned (e.g., using one lithographic mask)

and formed. Any suitable etch process may be used. In some embodiments, as shown, the etch may stop at the gate dielectric 114.

FIGS. 4E and 4F illustrate an assembly subsequent to forming an array of first gate lines 124 on the assembly of FIGS. 4C and 4D. Individual ones of the first gate lines 124 may span a "row" of the two-dimensional array of gates 167/168, and may include vias 126 that contact alternating ones of the gates such that each first gate 167 is contacted by a via 126 of the first gate line 124 corresponding to the row of that first gate 167. The first gate lines 124 may be formed using any suitable technique (e.g., subtractive, additive, semi-additive, single Damascene, dual Damascene, etc.). For example, in some embodiments, a layer of etch stop material 131 may be provided on the assembly of FIGS. 4C and 4D, followed by a layer of insulating material 133; via cavities may then be formed through the insulating material 133 and the etch stop material 131, a trench recess may be performed to create a trench for the conductive line of the first gate line 124, the via cavities and the trench may be filled with a conductive material (e.g., a metal), and then the conductive material may be planarized to form the first gate lines 124.

FIGS. 4G, 4H, and 4I illustrate an assembly subsequent to forming an array of second gate lines 125 on the assembly of FIGS. 4E and 4F. Individual ones of the second gate lines 125 may span a "column" of the two-dimensional array of gates 167/168, and may include vias 127 that contact alternating ones of the gates such that each second gate 168 is contacted by a via 127 of the second gate line 125 corresponding to the column of that second gate 168. The second gate lines 125 may be formed using any suitable technique (e.g., subtractive, additive, semi-additive, single Damascene, dual Damascene, etc.). For example, in some embodiments, a layer of etch stop material 135 may be provided on the assembly of FIGS. 4E and 4F, followed by a layer of insulating material 139; via cavities may then be formed through the insulating material 139, the etch stop material 135, the insulating material 133, and the etch stop material 131, a trench recess may be performed to create a trench for the conductive line of the second gate line 125, the via cavities and the trench may be filled with a conductive material (e.g., a metal), and then the conductive material may be planarized to form the second gate lines 125.

Figure 5A:
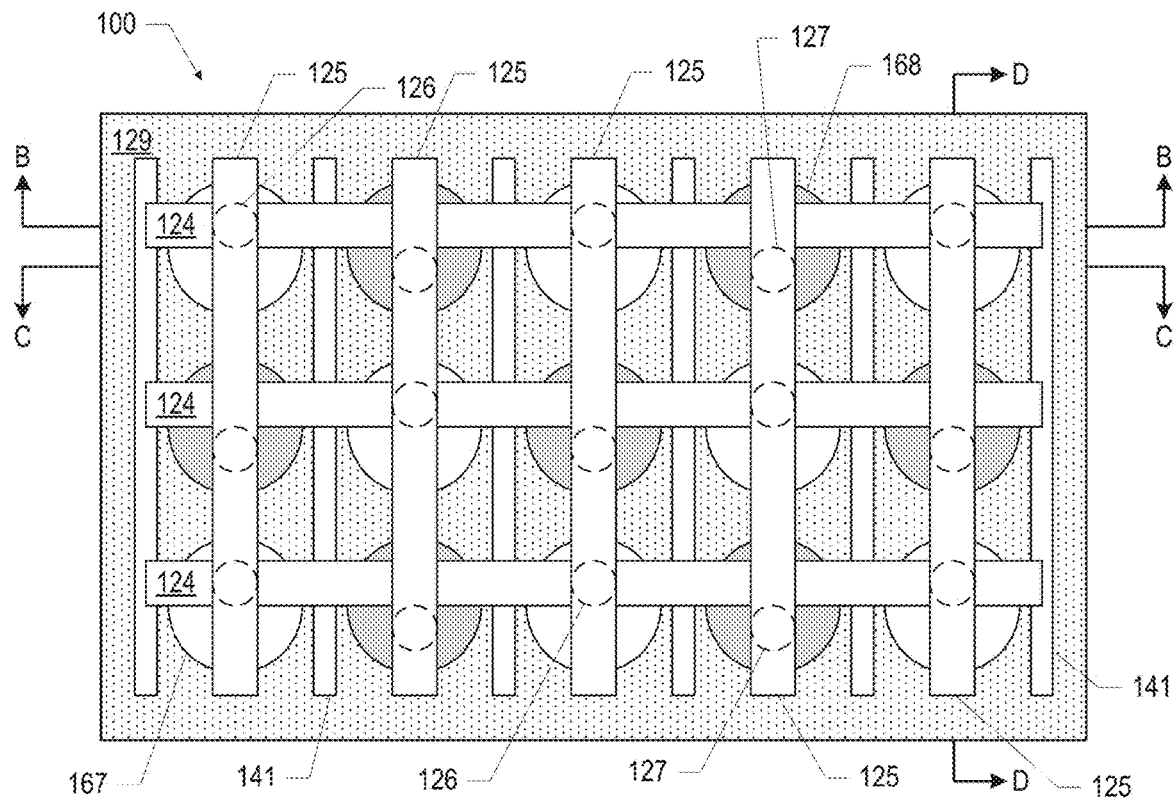
FIGS. 5A-5D are various views of a quantum dot device, in accordance with various embodiments.
Figure 5B:
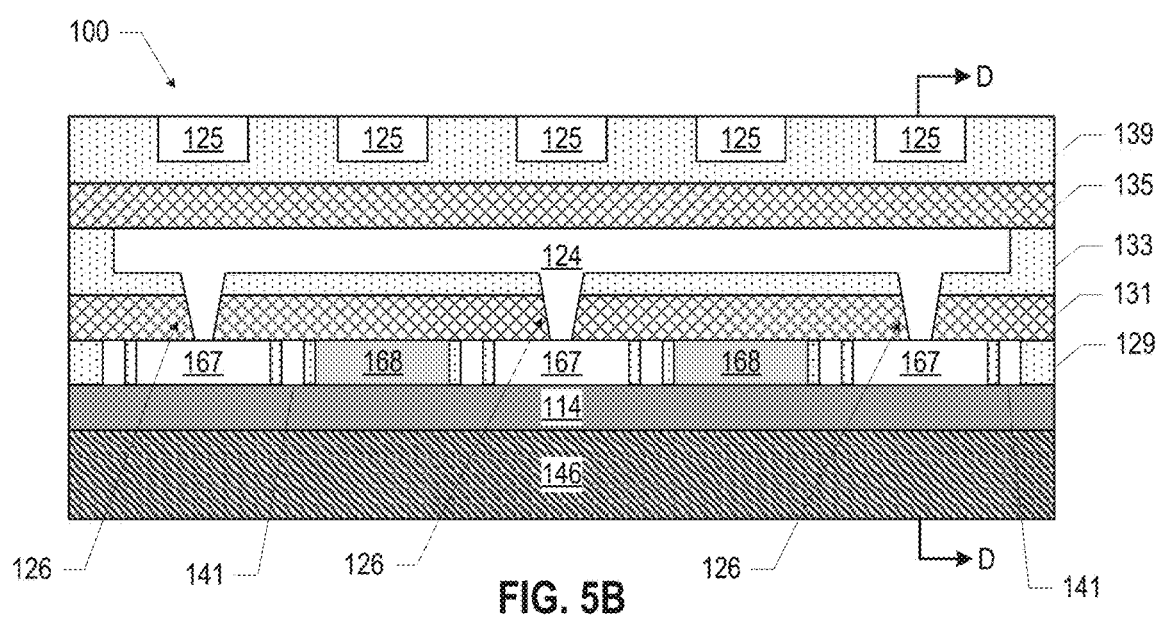
Figure 5C:
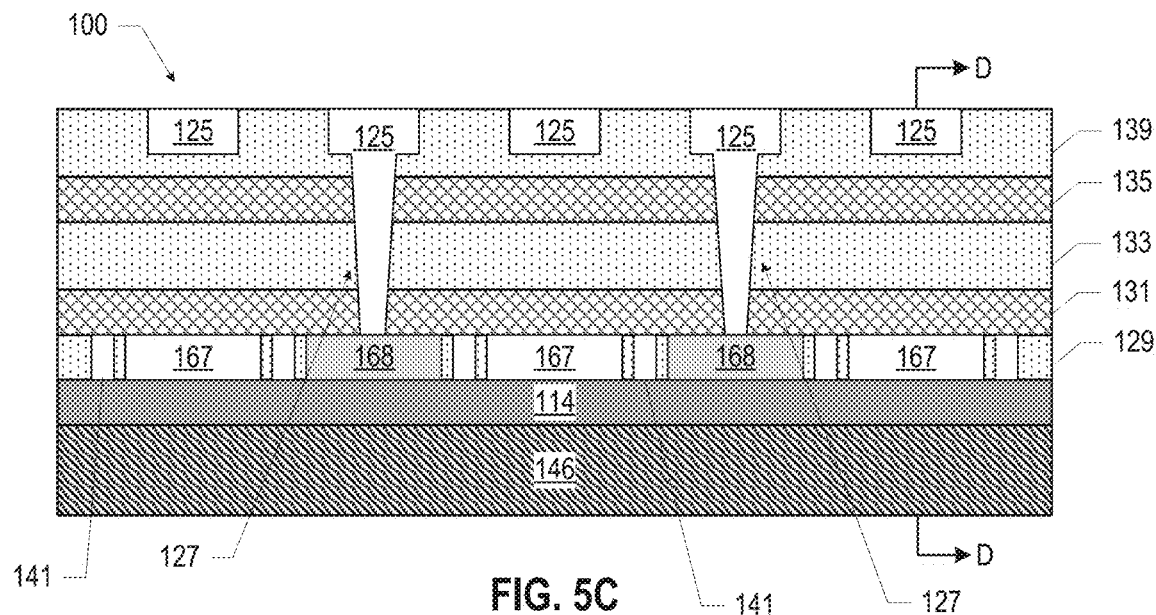
Figure 5D:
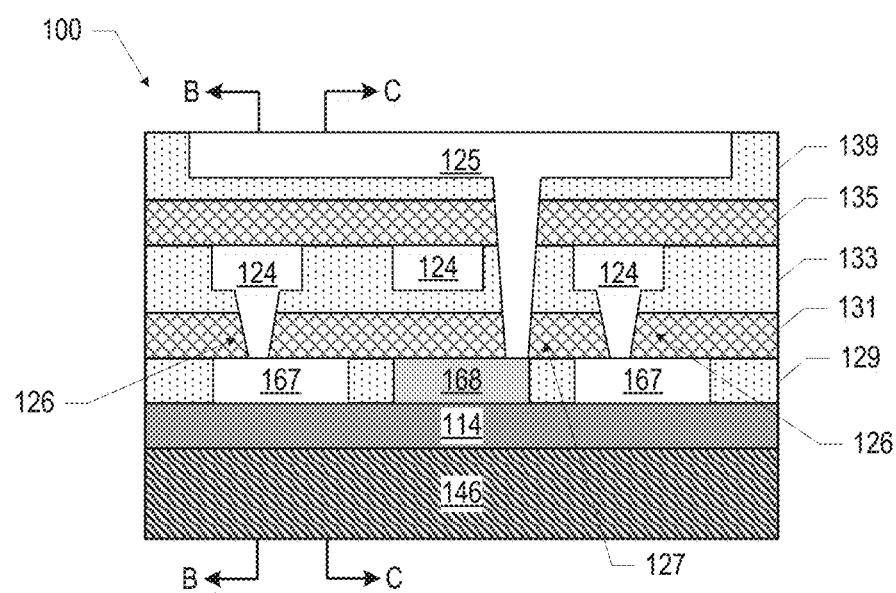
Figure 6A:
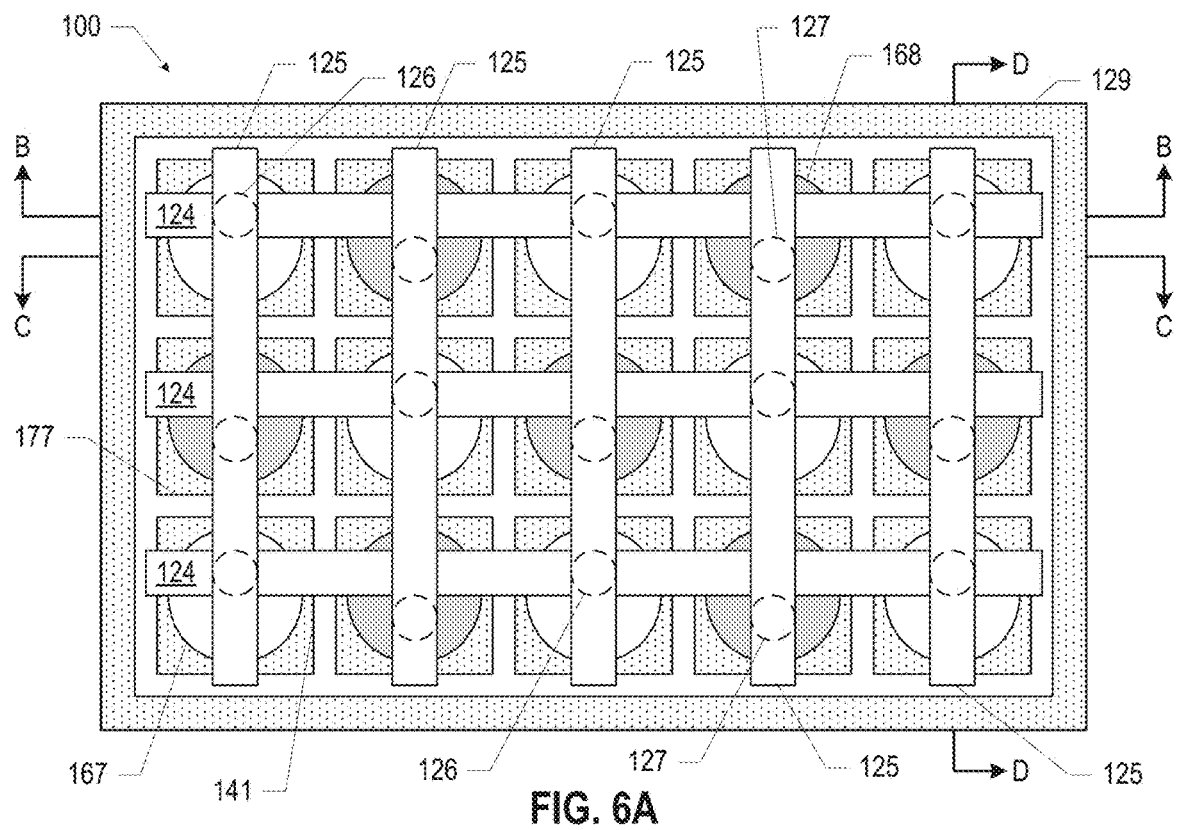
FIGS. 6A-6D are various views of a quantum dot device, in accordance with various embodiments.
Figure 6B:
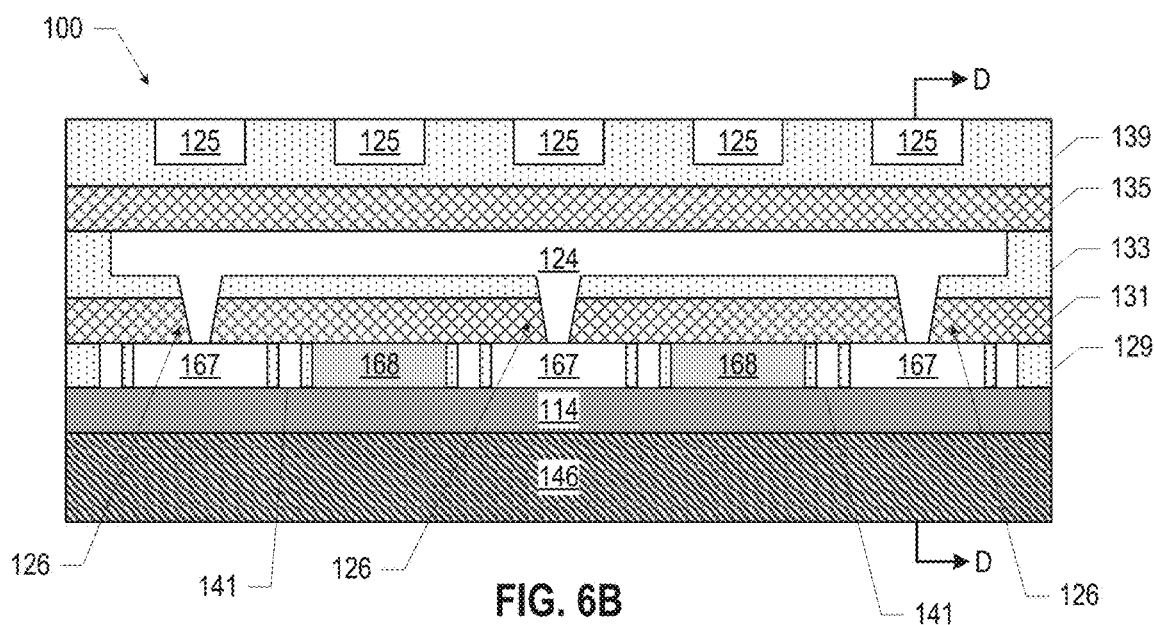
Figure 6C:
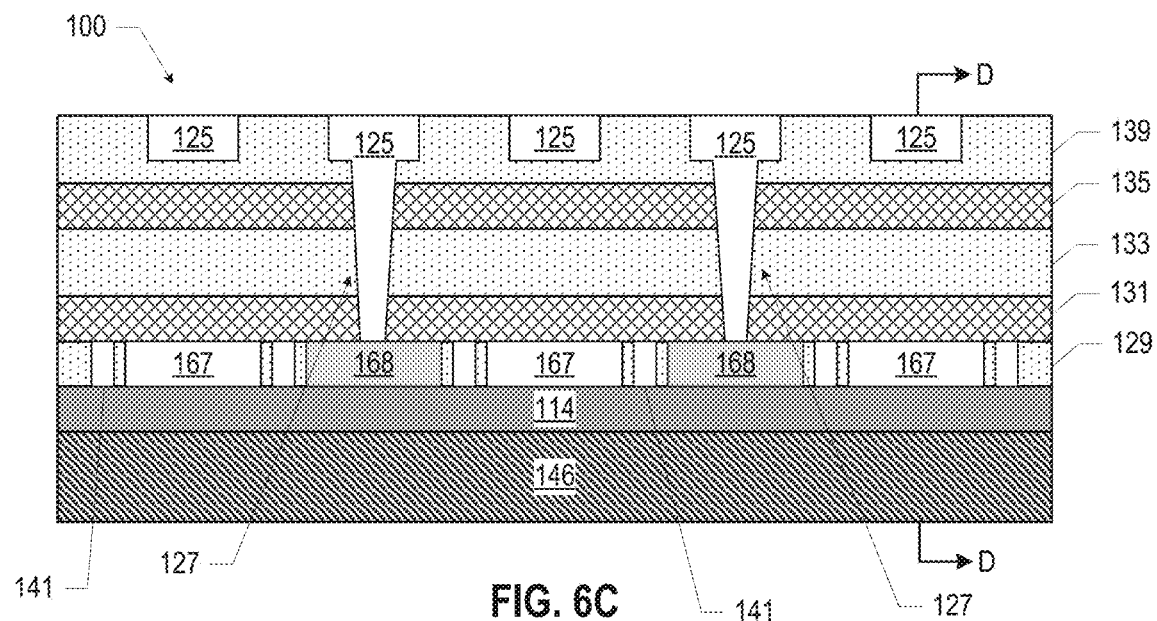
Figure 6D:
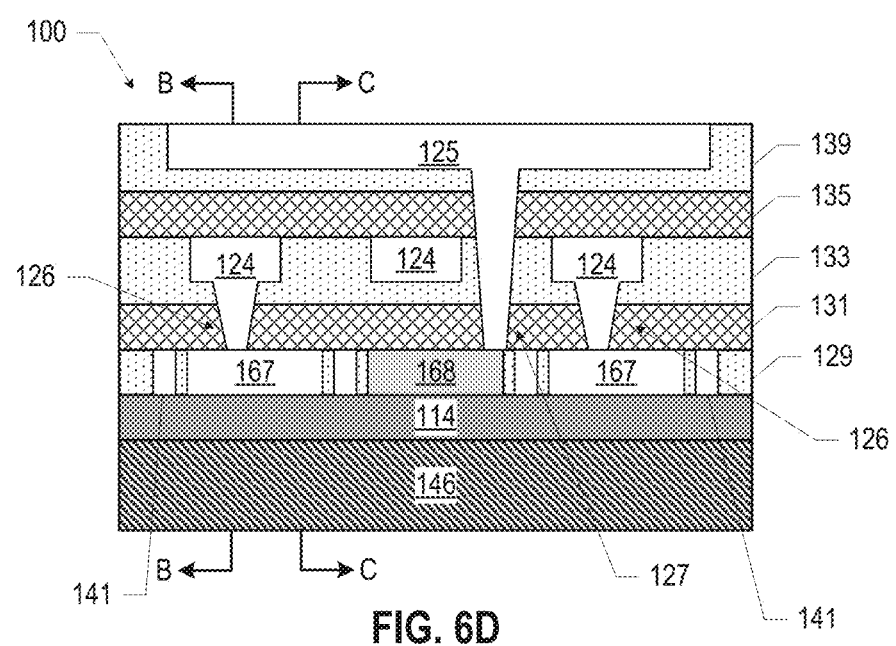

In some embodiments, additional gate lines may be disposed around the first gates 167 and the second gates 168 of the quantum dot device 100 of FIG. 3. For example, FIG. 5 illustrates a quantum dot device 100 similar to the quantum dot device 100 of FIG. 3, with the addition of third gate lines 141 between adjacent "columns" of the array of first gates 167/second gates 168. In particular, FIG. 5A is a top view (sharing the perspective of FIG. 3A), FIG. 5B is a side cross-sectional view through the section B-B of FIG. 5A (sharing the perspective of FIG. 3B), FIG. 5C is a side cross-sectional view through the section C-C of FIG. 5A (sharing the perspective of FIG. 3C), and FIG. 5D is a side cross-sectional view through the section D-D of FIG. 5A (sharing the perspective of FIG. 3D). The third gate lines 141 may be formed of a conductive material, such as a metal. Different ones of the third gate lines 141 may be electrically controlled in any desired combination (e.g., each third gate line 141 may be separately electrically controlled, or some or all the third gate lines 141 may be shorted together in one or more groups, as desired). In some embodiments, the third gate lines 141 may be formed in the same metal layer as the first gates 167/second gates 168 (e.g., as illustrated in FIG. 4B), while in other embodiments, the third gate lines 141 may be formed in a different metal layer (e.g., above or below the first gate lines 124, or above, below, or in the same metal layer as the second gate lines 125). In embodiments in which the third gate lines 141 are in the same metal layer as the first gates 167/second gates 168, the third gate lines 141 may be patterned simultaneously with the first gates 167/second gates 168 (e.g., using one lithographic mask), or patterned separately (e.g., using a different lithographic mask).

FIG. 6 illustrates a quantum dot device 100 similar to the quantum dot device 100 of FIG. 4, with the addition of fourth gate lines 177 between adjacent "rows" of the array of first gates 167/second gates 168. In particular, FIG. 6A is a top view (sharing the perspective of FIG. 3A), FIG. 6B is a side cross-sectional view through the section B-B of FIG. 6A (sharing the perspective of FIG. 3B), FIG. 6C is a side cross-sectional view through the section C-C of FIG. 6A (sharing the perspective of FIG. 3C), and FIG. 6D is a side cross-sectional view through the section D-D of FIG. 6A (sharing the perspective of FIG. 3D). The fourth gate lines 177 may be formed of a conductive material, such as a metal. Different ones of the fourth gate lines 177 may be electrically controlled in any desired combination (e.g., each fourth gate line 177 may be separately electrically controlled, or some or all the fourth gate lines 177 may be shorted together in one or more groups, as desired). For example, in the embodiment illustrated in FIG. 6, the third gate lines 141 and the fourth gate lines 177 are shorted together to form an electrically continuous grid that extends around the outermost first gates 167/second gates 168. This need not be the case; in some embodiments, the third gate lines 141 and the fourth gate lines 177 may not be electrically shorted and/or may be in different metal layers. In some embodiments, the fourth gate lines 177 may be formed in the same metal layer as the first gates 167/second gates 168 (e.g., as illustrated in FIG. 4D), while in other embodiments, the fourth gate lines 177 may be formed in a different metal layer (e.g., above, below, or in the same metal layer as the first gate lines 124; above or below the second gate lines 125; and above, below, or in the same metal layer as the third gate lines 141). In embodiments in which the fourth gate lines 177 are in the same metal layer as the first gates 167/second gates 168, the fourth gate lines 177 may be patterned simultaneously with the first gates 167/second gates 168 (e.g., using one lithographic mask), or patterned separately (e.g., using a different lithographic mask).

Figure 7C:
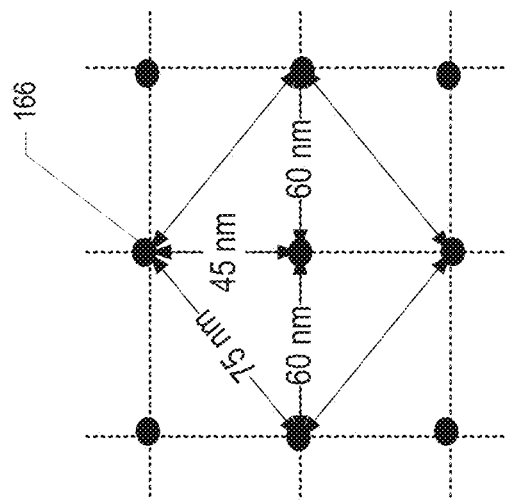
FIGS. 7A-7C illustrate various example dimensions of a quantum dot device, in accordance with various embodiments.
Figure 7B:
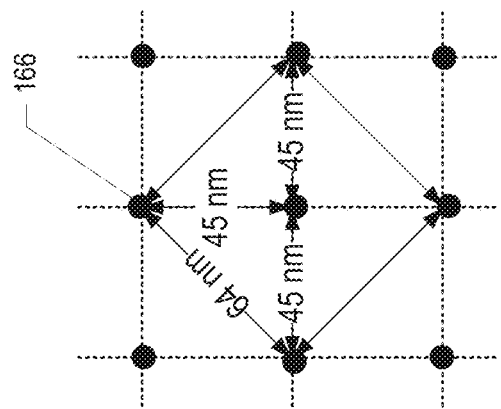
Figure 7A:
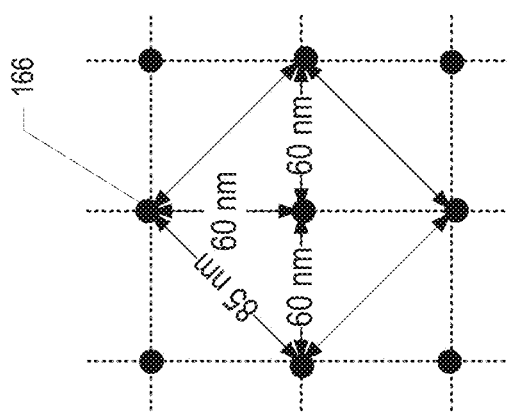

The quantum dot devices 100 disclosed herein may have any suitable dimensions. For example, in some embodiments, the distance (e.g., along a top surface of the quantum well stack 146) between two adjacent gates used to form quantum dots (e.g., two adjacent third gates 166, a first gate 167 and a second gate 168, two nearest first gates 167, etc.) may be between 5 nanometers and 200 nanometers (e.g., between 20 nanometers and 200 nanometers, between 40 nanometers and 200 nanometers, between 75 and 125 nanometers, between 40 nanometers and 100 nanometers, or between 80 nanometers and 90 nanometers). FIGS. 7A-7C illustrate various example dimensions of a quantum dot device 100, in accordance with various embodiments. In particular, FIGS. 7A-7C illustrate various example dimensions for any gates arranged in a two-dimensional array (e.g., the third gates 166, or the first gates 167/second gates 168). For example, as illustrated in FIG. 7A, when the columns of the array have a pitch of 60 nanometers, and the rows of the array have a pitch of 60 nanometers, two quantum dots that form under nearest neighbor gates along the "diagonal" may be spaced apart by approximately 85 nanometers. As illustrated in FIG. 7B, when the columns of the array have a pitch of 45 nanometers, and the rows of the array have a pitch of 45 nanometers, two quantum dots that form under nearest neighbor gates along the diagonal may be spaced apart by approximately 64 nanometers. As illustrated in FIG. 7C, when the columns of the array have a pitch of 60 nanometers, and the rows of the array have a pitch of 45 nanometers (or vice versa), two quantum dots that form under nearest neighbor gates may be spaced apart by approximately 75 nanometers. Any other desired pitches or combinations of pitches may be used to pattern the gate lines and gates disclosed herein.

Figure 8A:
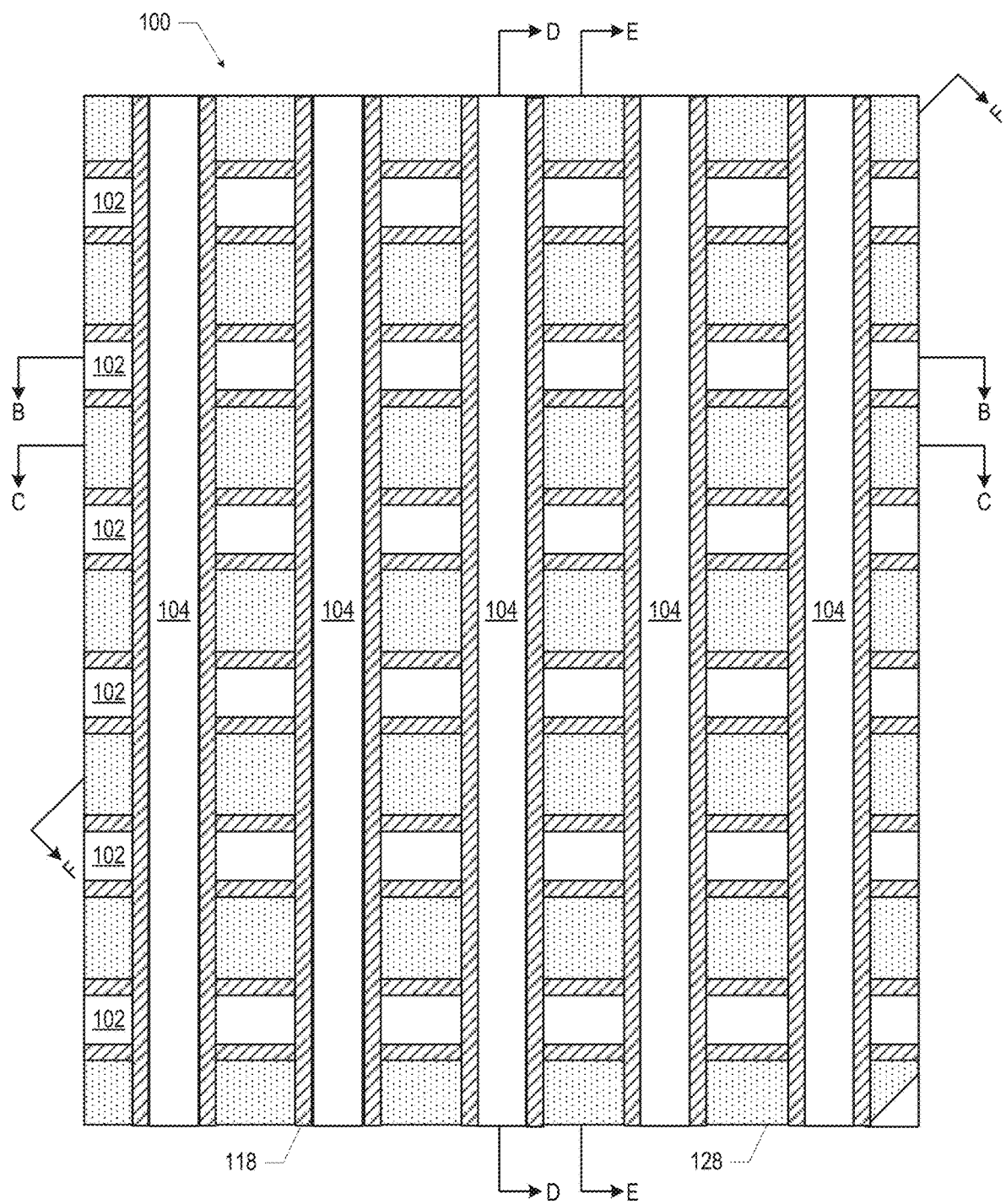
FIGS. 8A-8G are various views of a quantum dot device with gate lines on both faces of the quantum well stack, in accordance with various embodiments.
Figure 8B:
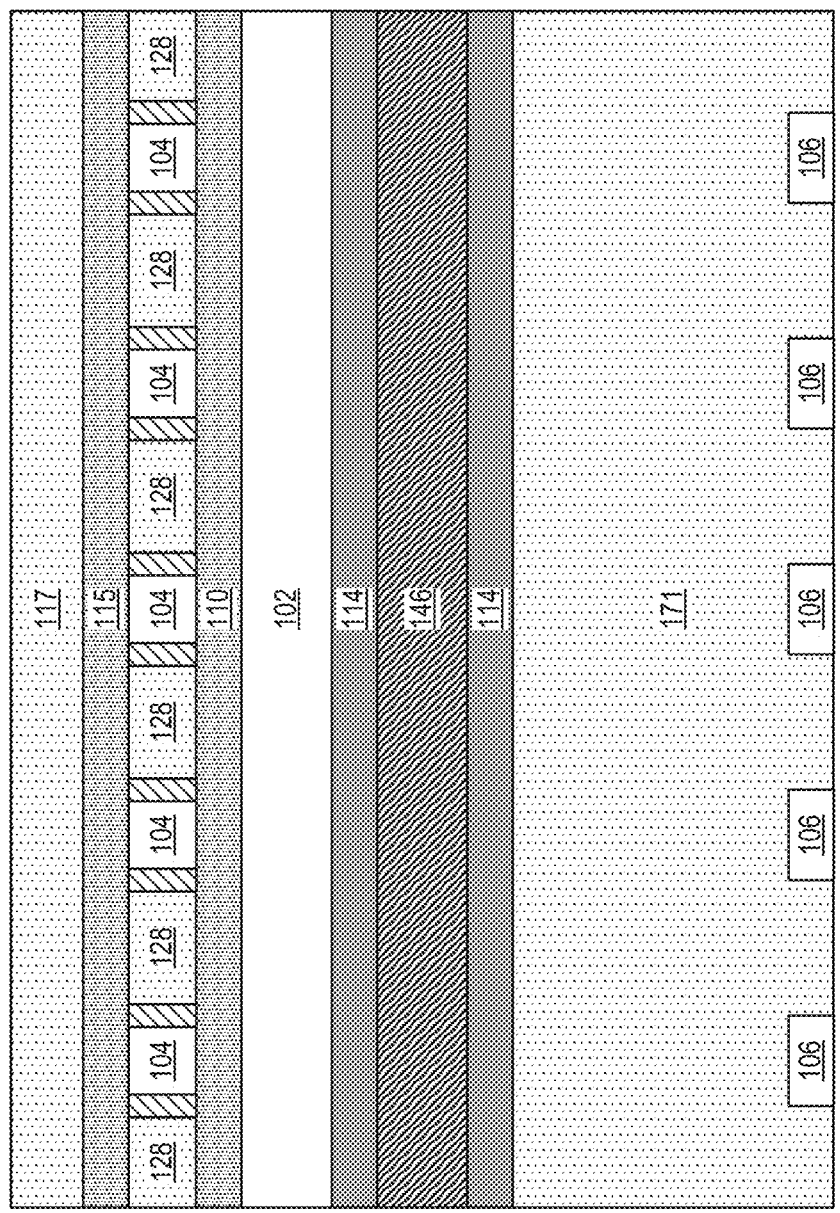
Figure 8C:
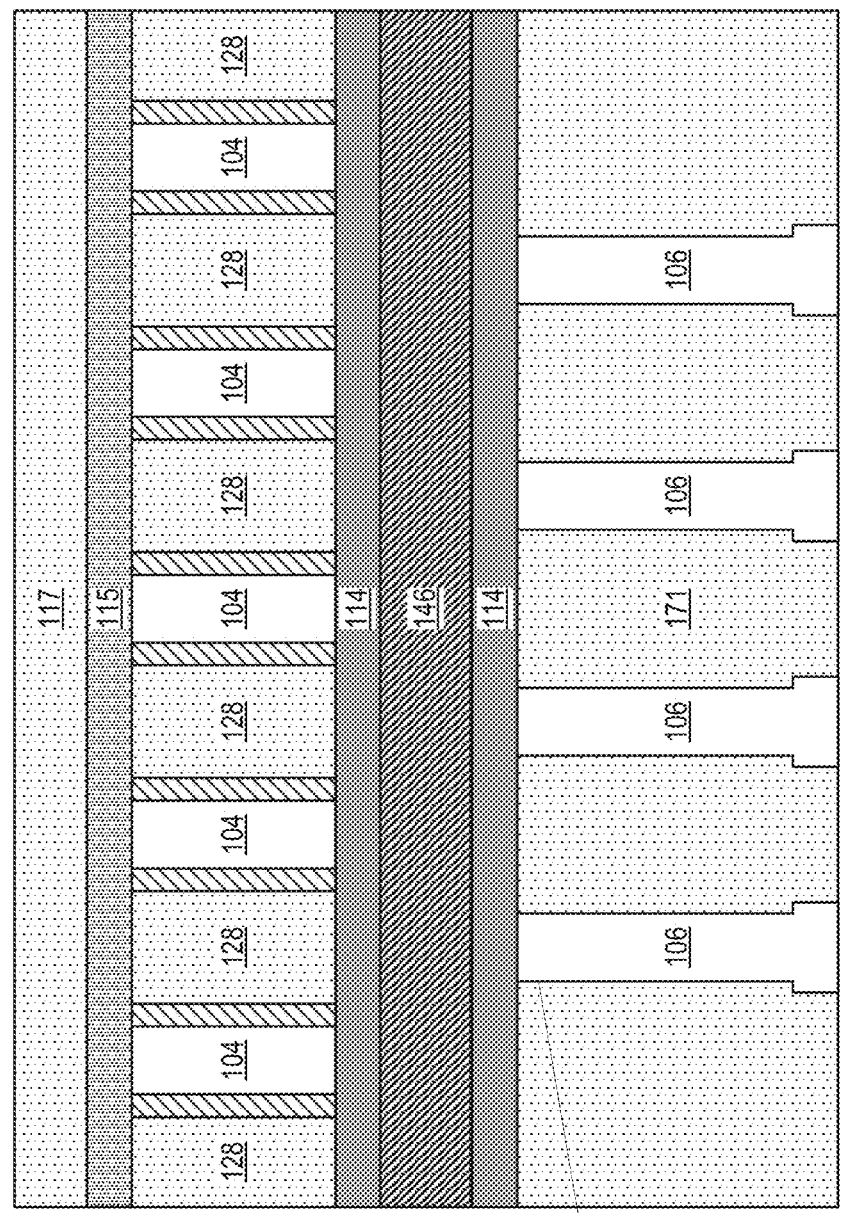
Figure 8D:
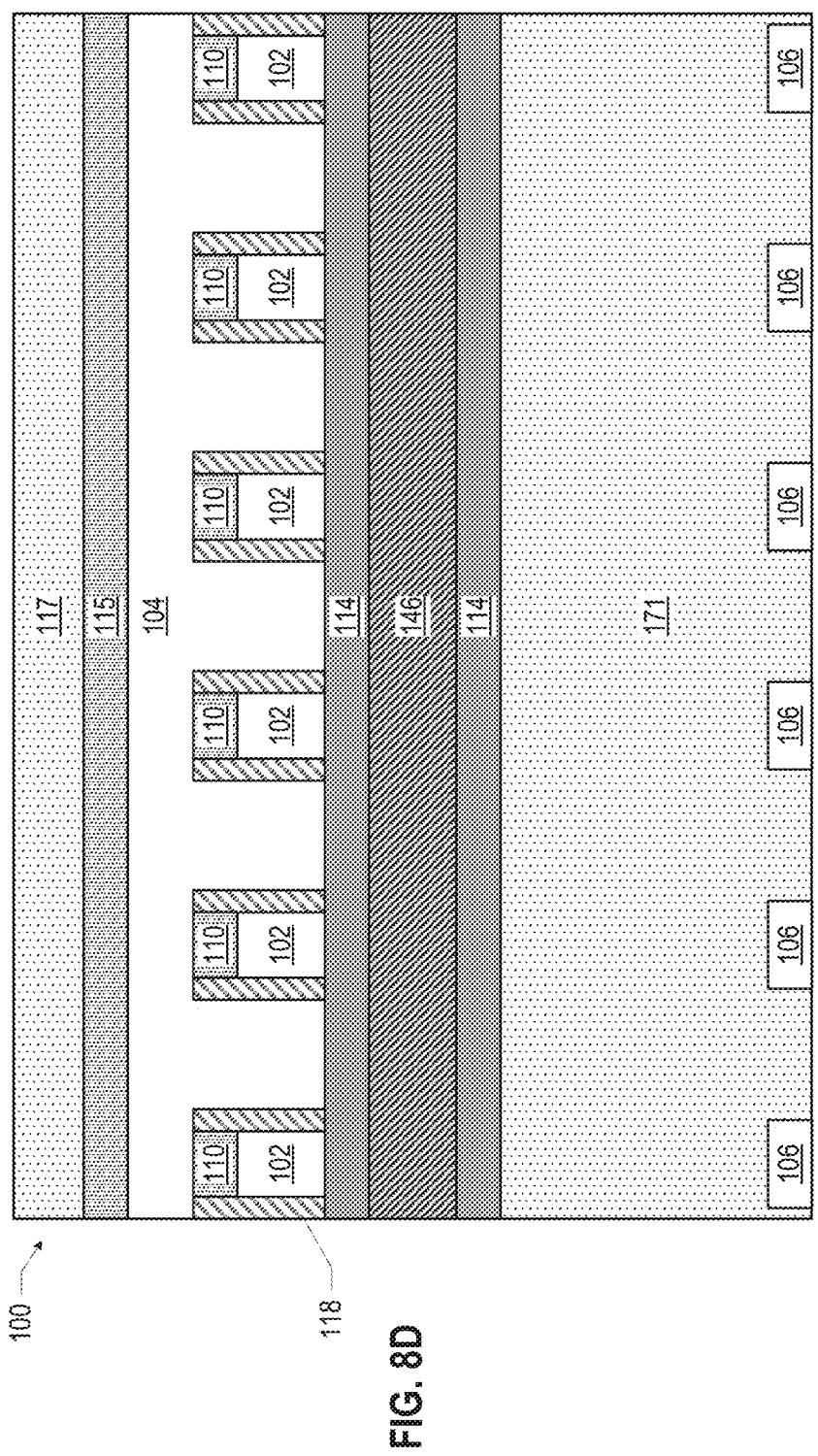
Figure 8E:
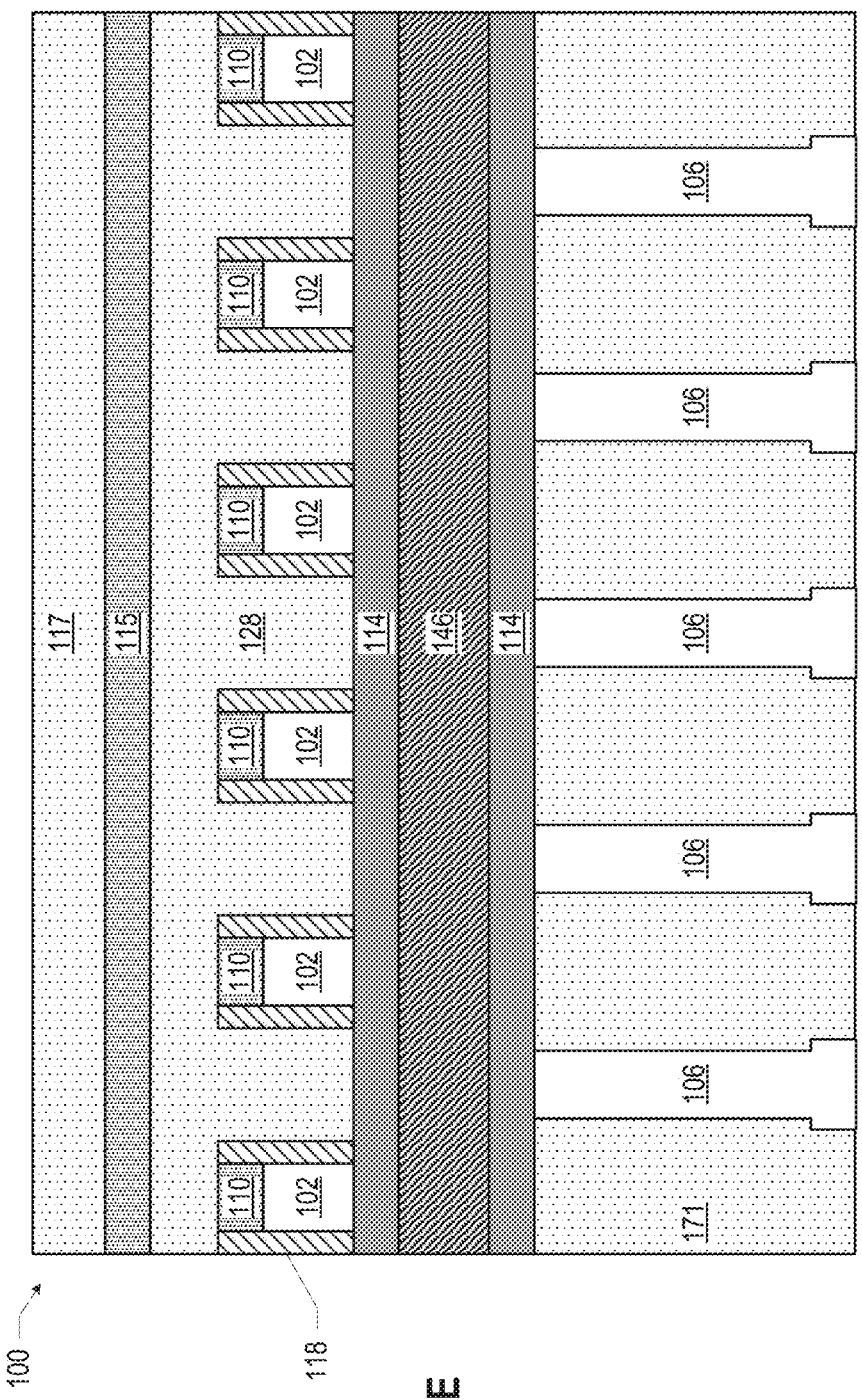
Figure 8F:
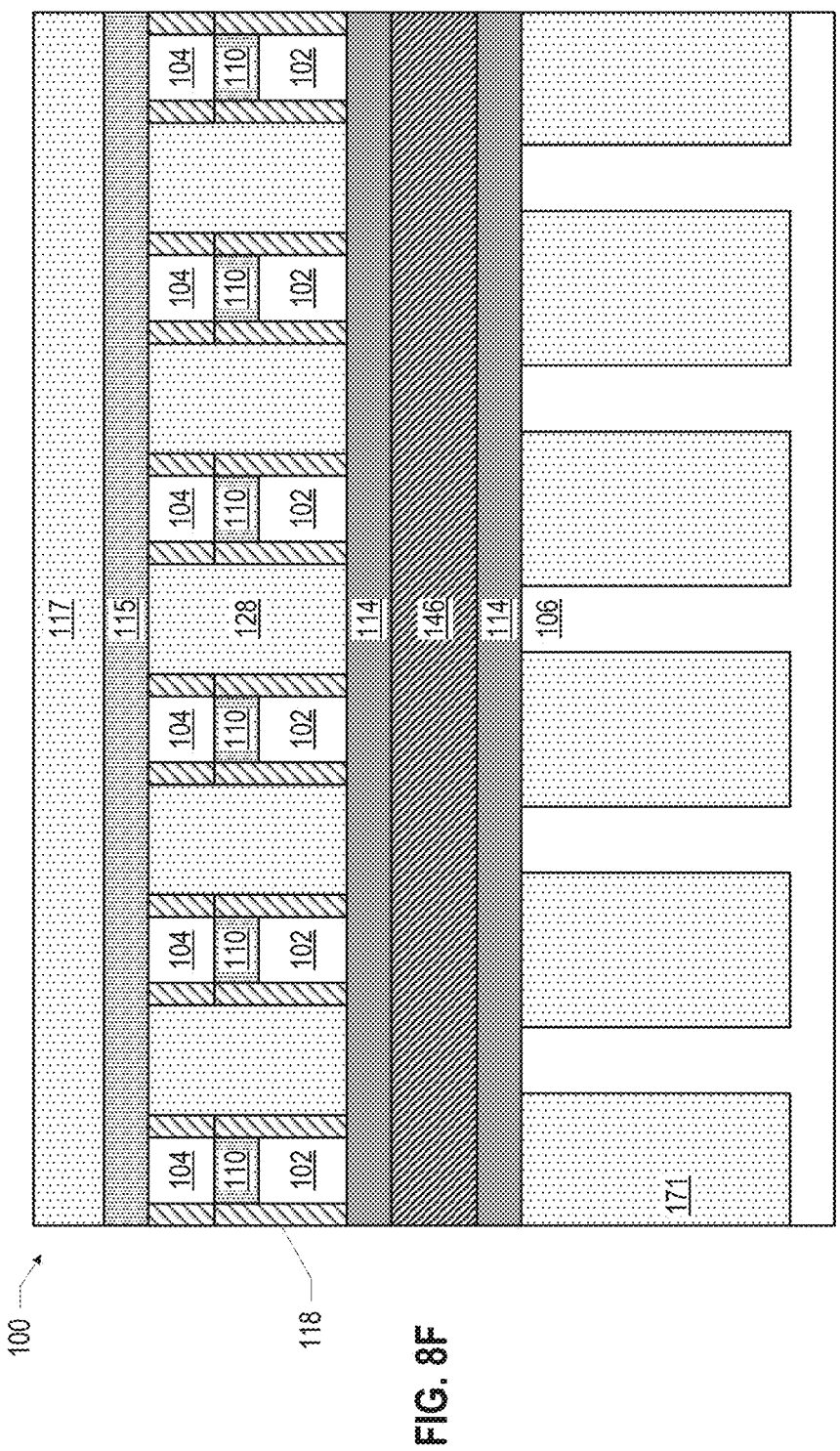
Figure 8G:
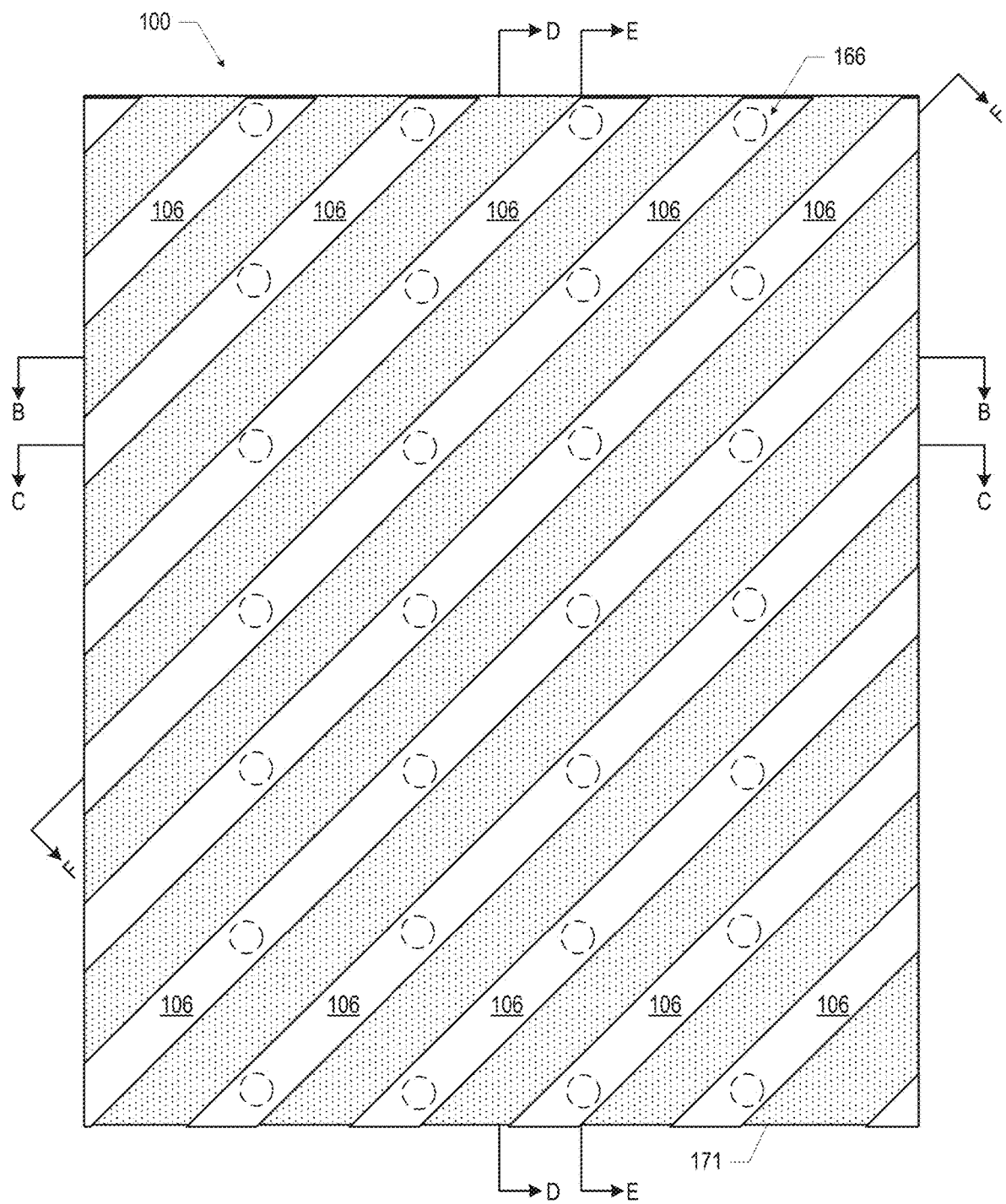

Although FIGS. 1, 3, 5, and 6 have illustrated quantum dot devices 100 in which all the gate lines are disposed at one face of the quantum well stack 146 (e.g., all disposed "above" the quantum well stack 146), in some embodiments, one or more of the gate lines may be disposed at the opposite face of the quantum well stack 146. For example, FIG. 8 provides various cross-sectional views of a quantum dot device 100 that shares many structural features with the quantum dot device 100 of FIG. 1, but includes the first gate lines 102 and the second gate lines 104 at one face of the quantum well stack 146, and the third gate lines 106 at the opposite face of the quantum well stack 146 (along with insulating material 171 and a gate dielectric 114). FIG. 8A is a top view of a portion of the quantum dot device 100 with some of the materials removed so that the first gate lines 102 and the second gate lines 104 are visible. FIGS. 8B-8F are side cross-sectional views of the quantum dot device 100 of FIG. 8A; in particular, FIG. 8B is a view through the section B-B of FIG. 8A, FIG. 8C is a view through the section C-C of FIG. 8A, FIG. 8D is a view through the section D-D of FIG. 8A, FIG. 8E is a view through the section E-E of FIG. 8A, and FIG. 8F is a view through the section F-F of FIG. 8A. FIG. 8G is a bottom view of a portion of the quantum dot device 100. The quantum dot device 100 of FIG. 8 may be formed by performing the operations discussed above with reference to FIGS. 2A-2S, flipping the result over, and performing operations similar to those discussed above with reference to FIGS. 2T-2W on the "other side" of the quantum well stack 146. Although a particular example of a device including gate lines at both faces of a quantum well stack 146 is shown in FIG. 8, any of the quantum dot devices 100 disclosed herein may include one or more of their gate lines at different faces of a quantum well stack 146.

Figure 9:
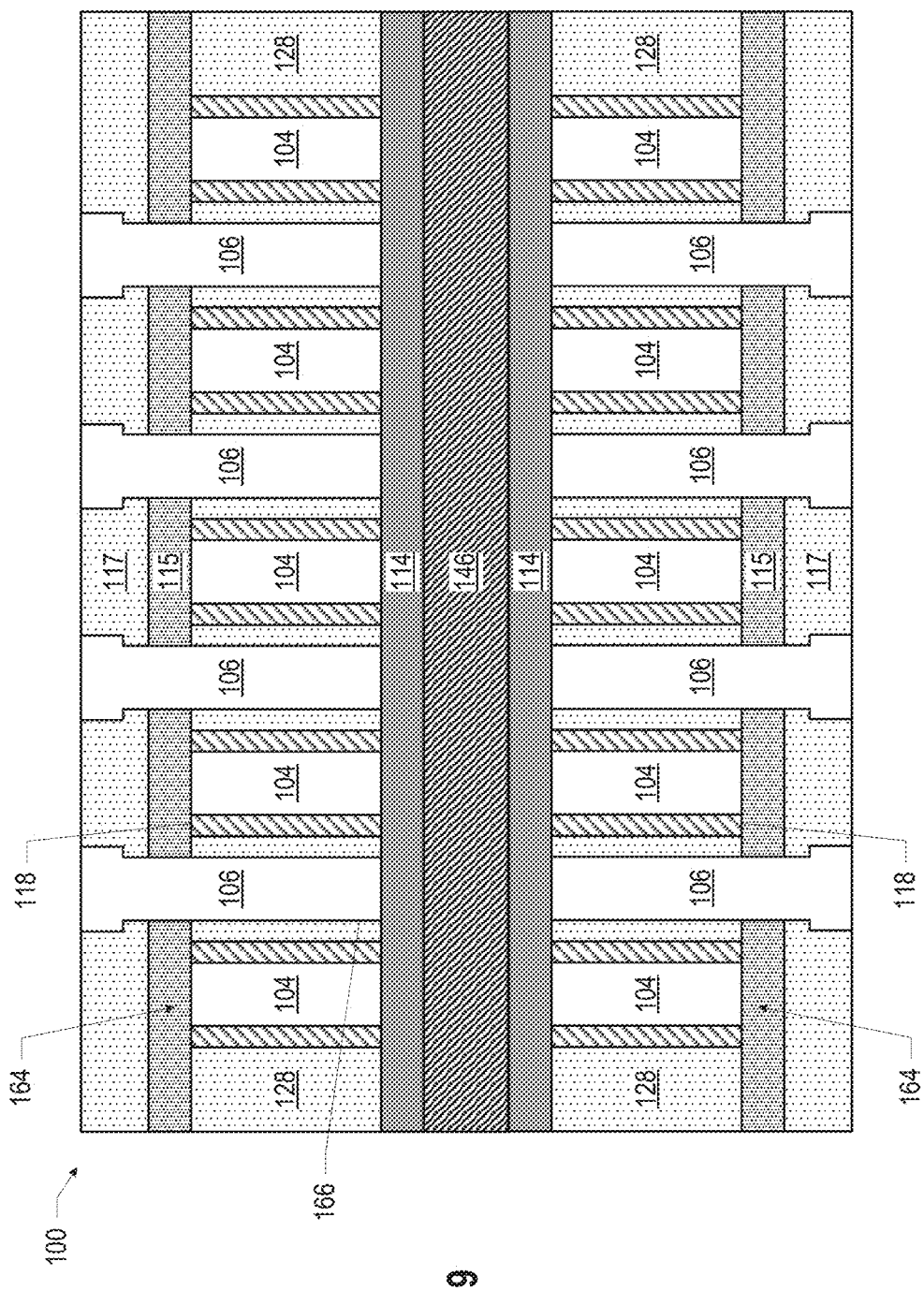
FIG. 9 is a side cross-sectional view of a double-sided quantum dot device, in accordance with various embodiments.

In some embodiments, the quantum well stack 146 may include two quantum well layers, and two full sets of gate lines may be formed on both faces of the quantum well stack 146 to form a "double-sided" quantum dot device 100. FIG. 9 is a cross-sectional view of a double-sided quantum dot device 100 (analogous to the perspective of FIG. 1C), in accordance with various embodiments. The quantum dot device 100 of FIG. 9 may be formed by performing the operations discussed above with reference to FIG. 2, flipping the result over, and performing the same operations on the "other side" of the quantum well stack 146. The quantum well stack 146 may itself include two quantum well layers, one in which quantum dots may be formed by the gates on the corresponding side of the quantum well stack 146, and the other in which quantum dots may be formed by the gates on the other, corresponding side of the quantum well stack 146. In some embodiments, the quantum dots formed in one of the quantum well layers may act as the "active" quantum dots in the quantum dot device 100, and the quantum dots formed in the other of the quantum well layers may act as the "read" quantum dots, sensing the state of the active quantum dots for readout (e.g., through the corresponding gates and other interconnects). Although a particular example of a double-sided device is shown in FIG. 9, any of the quantum dot devices 100 disclosed herein may be made double-sided as described above.

FIGS. 10A-10H illustrate various examples of quantum well stacks 146 that may provide the quantum well stacks 146 of any of the embodiments of the quantum dot devices 100 disclosed herein. In some embodiments, the layers of the quantum well stacks 146 may be grown on a substrate (e.g., a silicon or germanium wafer) (and on each other) by epitaxy. The quantum well stacks 146 illustrated in FIGS. 10A-10C include a single quantum well layer 152, and the quantum well stacks 146 illustrated in FIGS. 10D-10H include two quantum well layers 152 (e.g., as appropriate for a double-sided device, as discussed above with reference to FIG. 16). Generally, the quantum well stack 146 included in a quantum dot device 100 may include one quantum well layer 152 or more than two quantum well layers 152; elements may be omitted from the quantum well stacks 146, or added to the quantum well stacks 146, discussed with reference to FIG. 10 to achieve such embodiments, as appropriate. Layers other than the quantum well layer(s) 152 in a quantum well stack 146 may have higher threshold voltages for conduction than the quantum well layer(s) 152 so that when the quantum well layer(s) 152 are biased at their threshold voltages, the quantum well layer(s) 152 conduct and the other layers of the quantum well stack 146 do not. This may avoid parallel conduction in both the quantum well layer(s) 152 and the other layers, and thus avoid compromising the strong mobility of the quantum well layer(s) 152 with conduction in layers having inferior mobility. In some embodiments, silicon used in a quantum well stack 146 may be isotopically enriched 28Si. In some embodiments, germanium used in a quantum well stack 146 may be isotopically enriched 70Ge, 72Ge, or 74Ge.

Figure 10A:
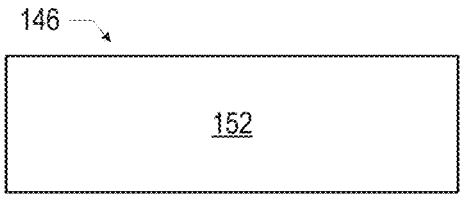
FIGS. 10A-10H illustrate various embodiments of a quantum well stack that may be included in a quantum dot device, in accordance with various embodiments.

FIG. 10A is a cross-sectional view of a quantum well stack 146 including only a quantum well layer 152. The quantum well layer 152 may be formed of a material such that, during operation of the quantum dot device 100, a 2DEG may form in the quantum well layer 152 proximate to the upper surface of the quantum well layer 152. The gate dielectric 114 may be disposed on the upper surface of the quantum well layer 152. In some embodiments, the quantum well layer 152 of FIG. 10A may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 10A is formed of intrinsic silicon may be particularly advantageous for electron-type quantum dot devices 100. In some embodiments, the quantum well layer 152 of FIG. 10A may be formed of intrinsic germanium, and the gate dielectric 114 may be formed of germanium oxide; in such an arrangement, during use of the quantum dot device 100, a 2DEG may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 10A may take any suitable values. For example, in some embodiments, the thickness of the quantum well layer 152 (e.g., intrinsic silicon or germanium) may be between 0.8 microns and 1.2 microns.

Figure 10B:
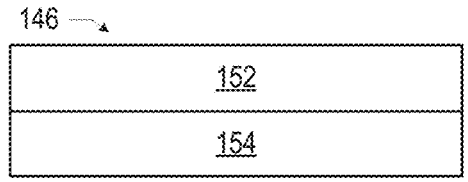

FIG. 10B is a cross-sectional view of a quantum well stack 146 including a quantum well layer 152 and a barrier layer 154. The quantum well stack 146 may be disposed on a substrate such that the barrier layer 154 is disposed between the quantum well layer 152 and the substrate. The barrier layer 154 may provide a potential barrier between the quantum well layer 152 and the substrate. As discussed above with reference to FIG. 10A, the quantum well layer 152 of FIG. 10B may be formed of a material such that, during operation of the quantum dot device 100, a 2DEG may form in the quantum well layer 152 proximate to the upper surface of the quantum well layer 152. For example, in some embodiments in which the substrate is formed of silicon, the quantum well layer 152 of FIG. 10B may be formed of silicon, and the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). The thicknesses (i.e., z-heights) of the layers in the quantum well stack 146 of FIG. 108 may take any suitable values. For example, in some embodiments, the thickness of the barrier layer 154 (e.g., silicon germanium) may be between 0 nanometers and 400 nanometers. In some embodiments, the thickness of the quantum well layer 152 (e.g., silicon or germanium) may be between 5 nanometers and 30 nanometers.

Figure 10C:
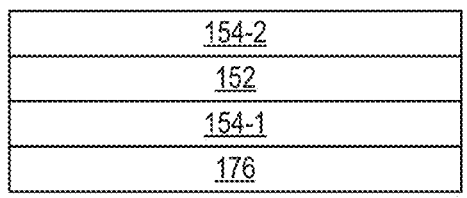

FIG. 10C is a cross-sectional view of a quantum well stack 146 including a quantum well layer 152 and a barrier layer 154-1, as well as a buffer layer 176 and an additional barrier layer 154-2. The quantum well stack 146 may be disposed on a substrate such that the buffer layer 176 is disposed between the barrier layer 154-1 and the substrate. The buffer layer 176 may be formed of the same material as the barrier layer 154, and may be present to trap defects that form in this material as it is grown on the substrate. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the substrate to the barrier layer 154-1; for example, the silicon germanium of the buffer layer 176 may have a germanium content that varies from zero percent at the substrate to a nonzero percent (e.g., 30%) at the barrier layer 154-1. The thicknesses (i.e., z-heights) of the layers in the quantum well stack 146 of FIG. 10C may take any suitable values. For example, in some embodiments, the thickness of the buffer layer 176 (e.g., silicon germanium) may be between 0.3 microns and 4 microns (e.g., 0.3-2 microns, or 0.5 microns). In some embodiments, the thickness of the barrier layer 154-1 (e.g., silicon germanium) may be between 0 nanometers and 400 nanometers. In some embodiments, the thickness of the quantum well layer 152 (e.g., silicon or germanium) may be between 5 nanometers and 30 nanometers (e.g., 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between 25 nanometers and 75 nanometers (e.g., 32 nanometers).

As discussed above with reference to FIG. 10B, the quantum well layer 152 of FIG. 10C may be formed of a material such that, during operation of the quantum dot device 100, a 2DEG may form in the quantum well layer 152 proximate to the upper surface of the quantum well layer 152. For example, in some embodiments in which the substrate is formed of silicon, the quantum well layer 152 of FIG. 10C may be formed of silicon, and the barrier layer 154-1 and the buffer layer 176 may be formed of silicon germanium. In some such embodiments, the silicon germanium of the buffer layer 176 may have a germanium content that varies from the substrate to the barrier layer 154-1; for example, the silicon germanium of the buffer layer 176 may have a germanium content that varies from zero percent at the substrate to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1 but may be thicker than the barrier layer 154-1 so as to absorb the defects that arise during growth.

In some embodiments, the quantum well layer 152 of FIG. 10C may be formed of germanium, and the buffer layer 176 and the barrier layer 154-1 may be formed of silicon germanium. In some such embodiments, the silicon germanium of the buffer layer 176 may have a germanium content that varies from the substrate to the barrier layer 154-1; for example, the silicon germanium of the buffer layer 176 may have a germanium content that varies from zero percent at the substrate to a nonzero percent (e.g., 70%) at the barrier layer 154-1. The barrier layer 154-1 may in turn have a germanium content equal to the nonzero percent. In other embodiments, the buffer layer 176 may have a germanium content equal to the germanium content of the barrier layer 154-1 but may be thicker than the barrier layer 154-1 so as to absorb the defects that arise during growth. In some embodiments of the quantum well stack 146 of FIG. 10C, the buffer layer 176 and/or the barrier layer 154-2 may be omitted.

Figure 10D:
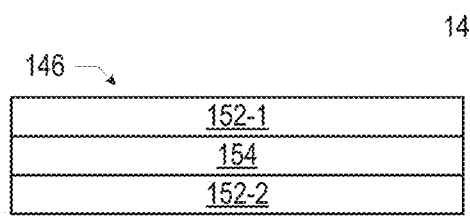

FIG. 10D is a cross-sectional view of a quantum well stack 146 including only a quantum well layer 152-1, a barrier layer 154, and a quantum well layer 152-2. In some embodiments, the quantum well layers 152 of FIG. 10D may be formed of intrinsic silicon, and the gate dielectrics 114 may be formed of silicon oxide; in such an arrangement, during use of the quantum dot device 100, a two-dimensional electron gas (2DEG) may form in the intrinsic silicon at the interface between the intrinsic silicon and the proximate silicon oxide. Embodiments in which the quantum well layers 152 of FIG. 10D are formed of intrinsic silicon may be particularly advantageous for electron-type quantum dot devices 100. In some embodiments, the quantum well layers 152 of FIG. 10D may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained.

The barrier layer 154 of FIG. 10D may provide a potential barrier between the quantum well layer 152-1 and the quantum well layer 152-2. In some embodiments in which the quantum well layers 152 of FIG. 10D are formed of silicon, the barrier layer 154 may be formed of silicon germanium. The germanium content of this silicon germanium may be 20-80% (e.g., 30%). In some embodiments in which the quantum well layers 152 are formed of germanium, the barrier layer 154 may be formed of silicon germanium (with a germanium content of 20-80% (e.g., 70%)).

The thicknesses (i.e., z-heights) of the layers in the quantum well stack 146 of FIG. 10D may take any suitable values. For example, in some embodiments, the thickness of the barrier layer 154 (e.g., silicon germanium) may be between 0 nanometers and 400 nanometers. In some embodiments, the thickness of the quantum well layers 152 (e.g., silicon or germanium) may be between 5 nanometers and 30 nanometers.

Figure 10E:
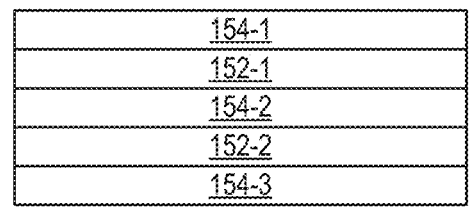

FIG. 10E is a cross-sectional view of a quantum well stack 146 including quantum well layers 152-1 and 152-2, a barrier layer 154-2 disposed between the quantum well layers 152-1 and 152-2, and additional barrier layers 154-1 and 154-3. In the quantum dot device 100, the barrier layer 154-1 may be disposed between the quantum well layer 152-1 and the gate dielectric 114 at one face of the quantum well stack, and the barrier layer 154-3 may be disposed between the quantum well layer 152-2 and the gate dielectric 114 at the other face of the quantum well stack (see, e.g., the double-sided quantum dot device 100 of FIG. 9). In some embodiments, the barrier layer 154-3 may be formed of a material (e.g., silicon germanium), and when the quantum well stack 146 is being grown on a substrate, the barrier layer 154-3 may include a buffer region of that material. This buffer region may trap defects that form in this material as it is grown on the substrate, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. In some embodiments, the buffer region may be lattice mismatched with the quantum well layer(s) 152 in a quantum well stack 146, imparting biaxial strain to the quantum well layer(s) 152.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. In some embodiments, the barrier layer 154-1 may have a similar form as the barrier layer 154-3, but may not include a "buffer region" as discussed above; in the quantum dot device 100, the barrier layer 154-3 and the barrier layer 154-1 may have substantially the same structure. The barrier layer 154-2 may take the form of any of the embodiments of the barrier layer 154 discussed above with reference to FIG. 10D. The thicknesses (i.e., z-heights) of the layers in the quantum well stack 146 of FIG. 10E may take any suitable values. For example, in some embodiments, the thickness of the barrier layers 154-1 and 154-3 (e.g., silicon germanium) in the quantum dot device 100 may be between 0 nanometers and 400 nanometers. In some embodiments, the thickness of the quantum well layers 152 (e.g., silicon or germanium) may be between 5 nanometers and 30 nanometers (e.g., 10 nanometers). In some embodiments, the thickness of the barrier layer 154-2 (e.g., silicon germanium) may be between 25 nanometers and 75 nanometers (e.g., 32 nanometers).

Figure 10F:
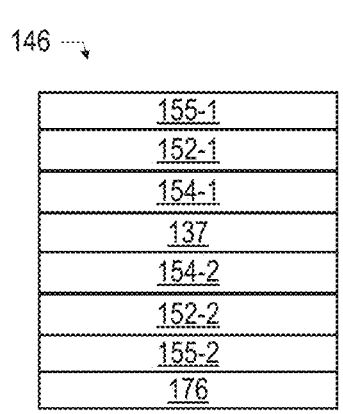
Figure 10G:
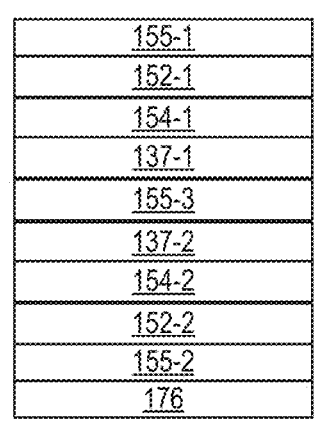

FIGS. 10F-10G illustrate examples of quantum well stacks 146 including doped layer(s) 137. As noted above, doped layer(s) 137 may be included in a quantum well stack 146 instead of or in addition to an accumulation region.

FIG. 10F is a cross-sectional view of a quantum well stack 146 including a buffer layer 176, a barrier layer 155-2, a quantum well layer 152-2, a barrier layer 154-2, a doped layer 137, a barrier layer 154-1, a quantum well layer 152-1, and a barrier layer 155-1.

The buffer layer 176 may be formed of the same material as the barrier layer 155-2, and may be present to trap defects that form in this material as it is grown. In some embodiments, the buffer layer 176 may be grown under different conditions (e.g., deposition temperature or growth rate) from the barrier layer 155-2. In particular, the barrier layer 155-2 may be grown under conditions that achieve fewer defects than the buffer layer 176. In some embodiments in which the buffer layer 176 includes silicon germanium, the silicon germanium of the buffer layer 176 may have a germanium content that varies to the barrier layer 155-2; for example, the silicon germanium of the buffer layer 176 may have a germanium content that varies from zero percent to a nonzero percent (e.g., 30%) at the barrier layer 155-2. The buffer layer 176 may be grown beyond its critical layer thickness such that it is substantially free of stress from the underlying base (and thus may be referred to as "relaxed"). In some embodiments, the thickness of the buffer layer 176 (e.g., silicon germanium) may be between 0.3 microns and 4 microns (e.g., between 0.3 microns and 2 microns, or 0.5 microns). In some embodiments, the buffer layer 176 may be lattice mismatched with the quantum well layer(s) 152 in a quantum well stack 146, imparting biaxial strain to the quantum well layer(s) 152.

The barrier layer 155-2 may provide a potential energy barrier proximate to the quantum well layer 152-2. The barrier layer 155-2 may be formed of any suitable materials. For example, in some embodiments in which the quantum well layer 152 is formed of silicon or germanium, the barrier layer 155-2 may be formed of silicon germanium. In some embodiments, the thickness of the barrier layer 155-2 may be between 0 nanometers and 400 nanometers (e.g., between 25 nanometers and 75 nanometers).

The quantum well layer 152-2 may be formed of a different material than the barrier layer 155-2. Generally, a quantum well layer 152 may be formed of a material such that, during operation of the quantum dot device 100, a 2DEG may form in the quantum well layer 152. Embodiments in which the quantum well layer 152 is formed of intrinsic silicon may be particularly advantageous for electron-type quantum dot devices 100. Embodiments in which a quantum well layer 152 is formed of intrinsic germanium may be particularly advantageous for hole-type quantum dot devices 100. In some embodiments, a quantum well layer 152 may be strained, while in other embodiments, a quantum well layer 152 may not be strained. The thickness of a quantum well layer 152 may take any suitable values; in some embodiments, a quantum well layer 152 may have a thickness between 5 nanometers and 30 nanometers.

In the quantum well stack 146 of FIG. 10F, the doped layer 137 may be "shared" by the two quantum well layers 152 in the quantum well stack 146, in that the doped layer 137 provides carriers to the quantum well layer 152-1 and the quantum well layer 152-2 during use. In the quantum dot device 100, the quantum well layer 152-1 may be disposed between the doped layer 137 and the gate dielectric 114-1, while the quantum well layer 152-2 may be disposed between the doped layer 137 and the gate dielectric 114-2. The doped layer 137 of FIG. 10F may be doped with an n-type material (e.g., for an electron-type quantum dot device 100) or a p-type material (e.g., for a hole-type quantum dot device 100). In some embodiments, the doping concentration of the doped layer 137 may be between $10^{17}/cm^3$ and $10^2$ cm$^3$ (e.g., between $10^{17}/cm^3$ and $10^{18}/cm^3$). The thickness (i.e., z-height) of the doped layer 137 may depend on the doping concentration, among other factors, and in some embodiments, may be between 5 nanometers and 50 nanometers (e.g., between 20 nanometers and 30 nanometers).

A doped layer 137 may be formed using any of a number of techniques. In some embodiments, a doped layer 137 may be formed of an undoped base material (e.g., silicon germanium) that is doped in situ during growth of the base material by epitaxy. In some embodiments, a doped layer 137 may initially be fully formed of an undoped base material (e.g., silicon germanium), then a layer of dopant may be deposited on this base material (e.g., a monolayer of the desired dopant), and an annealing process may be performed to drive the dopant into the base material. In some embodiments, a doped layer 137 may initially be fully formed of an undoped base material (e.g., silicon germanium), and the dopant may be implanted into the lattice (and, in some embodiments, may be subsequently annealed). In some embodiments, a doped layer 137 may be provided by a silicon germanium layer (e.g., with 90% germanium content) doped with an n-type dopant. In general, any suitable technique may be used to form a doped layer 137.

The barrier layer 154-2 may not be doped, and thus may provide a barrier to prevent impurities in the doped layer 137 from diffusing into the quantum well layer 152-2 and forming recombination sites or other defects that may reduce channel conduction and thereby impede performance of the quantum dot device 100. In some embodiments of the quantum well stack 146 of FIG. 10F, the doped layer 137 may include a same material as the barrier layer 154-2, but the barrier layer 154-2 may not be doped. For example, in some embodiments, the doped layer 137 and the barrier layer 154-2 may both be silicon germanium. In some embodiments in which the quantum well layer 152-2 is formed of silicon, the barrier layer 154-2 may be formed of silicon germanium. The germanium content of this silicon germanium may be 20-80% (e.g., 30%). In some embodiments in which the quantum well layer 152-2 is formed of germanium, the barrier layer 154-2 may be formed of silicon germanium (with a germanium content of 20-80% (e.g., 70%)). The thickness of the barrier layer 154-2 may depend on the doping concentration of the doped layer 137, among other factors discussed below, and in some embodiments, may be between 5 nanometers and 50 nanometers (e.g., between 20 nanometers and 30 nanometers).

The barrier layer 154-1 may provide a barrier to prevent impurities in the doped layer 137 from diffusing into the quantum well layer 152-1, and may take any of the forms described herein for the barrier layer 154-2. Similarly, the quantum well layer 152-1 may take any of the forms described herein for the quantum well layer 152-2. The barrier layer 155-1 may provide a potential energy barrier proximate to the quantum well layer 152-1 (as discussed above with reference to the barrier layer 155-2 and the quantum well layer 152-2), and may take any of the forms described herein for the barrier layer 155-2.

The thickness of a barrier layer 154 may impact the ease with which carriers in the doped layer 137 can move into a quantum well layer 152 disposed on the other side of the barrier layer 154. The thicker the barrier layer 154, the more difficult it may be for carriers to move into the quantum well layer 152; at the same time, the thicker the barrier layer 154, the more effective it may be at preventing impurities from the doped layer 137 from moving into the quantum well layer 152. Additionally, the diffusion of impurities may depend on the temperature at which the quantum dot device 100 operates. Thus, the thickness of the barrier layer 154 may be adjusted to achieve a desired energy barrier and impurity screening effect between the doped layer 137 and the quantum well layer 152 during expected operating conditions.

In some embodiments of the quantum well stack 146 of FIG. 10F (e.g., those included in "single-sided" quantum dot devices 100), only a single quantum well layer 152 may be included. For example, the layers 154-1 and 152-1 may be omitted, and gates may be formed proximate to the barrier layer 155-1 such that the quantum well layer 152-1 is disposed between the gates and the doped layer 137. In other embodiments, the layers 154-1, 152-1, and 155-2 may be omitted, and gates may be formed proximate to the doped layer 137. In some embodiments, the buffer layer 176 and/or the barrier layer 155-2 may be omitted from the quantum well stack 146 of FIG. 10F.

FIG. 10G is a cross-sectional view of a quantum well stack 146 that is similar to the quantum well stack 146 of FIG. 10F, except that in the place of the single doped layer 137 shared by two quantum well layers 152, the quantum well stack 146 of FIG. 10G includes two different doped layers 137-2 and 137-1 (spaced apart by a barrier layer 155-3). In such an embodiment, the doped layer 137-2 may provide a source of carriers for the quantum well layer 152-2, and the doped layer 137-1 may provide a source of carriers for the quantum well layer 152-1. The barrier layer 155-3 may provide a potential barrier between the two doped layers 137, and may take any suitable form. Generally, the elements of the quantum well stack 146 of FIG. 10G may take the form of any of the corresponding elements of the quantum well stack 146 of FIG. 10F. The doped layers 137-1 and 137-2 may have the same geometry and material composition, or may have different geometries and/or material compositions.

Figure 10H:
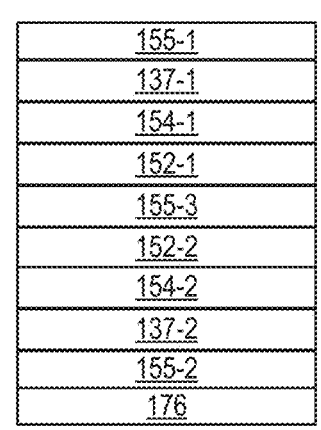

FIG. 10H is a cross-sectional view of a quantum well stack 146 in which two doped layers 137-1 and 137-2 are disposed toward the "outside" of the quantum well stack 146, rather than the "inside" of the quantum well stack 146, as illustrated in FIGS. 10F and 10G. In particular, the quantum well layer 152-2 is disposed between the doped layer 137-2 and the quantum well layer 152-1, and the quantum well layer 152-1 is disposed between the doped layer 137-1 and the quantum well layer 152-2. In the quantum dot device 100, the doped layer 137-1 may be disposed between the quantum well layer 152-1 and the gate dielectric 114-1, while the doped layer 137-2 may be disposed between the quantum well layer 152-2 and the gate dielectric 114-2. In the quantum well stack 146 of FIG. 10H, a barrier layer 155-3 provides a potential barrier between the quantum well layers 152-1 and 152-2 (rather than between the doped layers 137-1 and 137-2, as illustrated in the quantum well stack 146 of FIG. 10G). Generally, the elements of the quantum well stack 146 of FIG. 10H may take the form of any of the corresponding elements of the quantum well stack 146 of FIGS. 10D-10G.

In some particular embodiments in which the quantum dot device 100 is a "single-sided" device with only one set of gates, the quantum well stack 146 may include a silicon base, a buffer layer 176 of silicon germanium (e.g., with 30% germanium content), then a doped layer 137 formed of silicon germanium doped with an n-type dopant, a thin barrier layer 154 formed of silicon germanium (e.g., silicon germanium with 70% germanium content), a silicon quantum well layer 152, and a barrier layer 155 formed of silicon germanium (e.g., with 30% germanium content); in such an embodiment, the gates may be disposed on the barrier layer 155. In some other particular embodiments in which the quantum dot device 100 is a "single-sided" device with only one set of gates, the quantum well stack 146 may include a silicon base, a doped layer 137 formed of silicon doped with an n-type dopant, a thin barrier layer 154 formed of silicon germanium, and a silicon quantum well layer 152; in such an embodiment, the gates may be disposed on the silicon quantum well layer 152.

As noted above, any of the quantum dot devices 100 disclosed herein may include magnet lines that, during operation of the quantum dot device 100, may generate magnetic fields to selectively "address" different quantum dots. More generally, the magnet lines may be used to generate magnetic fields to create an energy difference in the quantum states of a quantum dot (e.g., in the two spin states of an electron spin-based quantum dot). The quantum states of a quantum dot may also be manipulated by application of RF energy, creating a quantum bit capable of computation.

The magnetic field experienced by different ones of the quantum dots may be a function of the distance and angle of that quantum dot from the different ones of the magnet lines, as known in the art. As noted above, different ones of the quantum dots may be driven (e.g., their spin states manipulated) by matching the resonance of the magnetic field with the resonance of the quantum dot. For example, the quantum dot device 100 may implement electron spin resonance (ESR) and/or electron dipole spin resonance (EDSR) techniques for quantum state manipulation.

In some embodiments, the magnet lines may be formed of a magnetic material, such as a ferromagnetic material, cobalt, iron, or nickel. In such embodiments, the magnet lines may generate a magnetic field even in the absence of an applied current (although a current may also be applied to tune the magnetic field of magnetic magnet lines). EDSR techniques may be implemented in such embodiments to drive transitions between different quantum states in quantum dots. In some embodiments, the magnet lines may be formed of a conductive (but not necessarily magnetic) material, such as a superconducting material (e.g., aluminum, titanium nitride, niobium titanium, or niobium titanium nitride). DC and/or AC currents may be passed through such non-magnetic magnet lines to generate magnetic field gradients as desired. ESR techniques may be implemented in such embodiments to drive transitions between different quantum states in quantum dots. IN some embodiments, magnet lines may be arranged in a parallel array above or below the gates in any of the embodiments disclosed herein (e.g., parallel to the first gate lines 102, parallel to the second gate lines 104, and/or parallel to the third gate lines 106).

In some embodiments, the first gate lines 102, second gate lines 104, and/or third gate lines 106 may themselves act as magnet lines; in some such embodiments, additional magnet lines (such as any of those discussed above) may or may not be included in a quantum dot device 100. Such gate lines may serve two purposes: to provide a localized electrostatic potential that helps to confine or otherwise affect a quantum dot, and to provide a magnetic field gradient that allows a quantum dot to be driven between different quantum states (e.g., spin states). As discussed above, ESR techniques may be implemented when a gate line includes a superconducting material to drive transitions between different quantum states in quantum dots.

In some embodiments in which a gate line (e.g., a first gate line 102, a second gate line 104, and/or a third gate line 106) acts as a magnet line, the metal of that gate line may be a superconductor, such as aluminum, titanium nitride (e.g., deposited via atomic layer deposition), or niobium titanium nitride. In such embodiments, application of an appropriate AC or DC current (e.g., by the control circuitry 175) to the gate line may cause a desired magnetic field to be generated. In some embodiments in which a gate line acts as a magnet line, the metal of that gate line may be a magnetic material, such as a ferromagnetic material, cobalt, iron, or nickel. In such embodiments, the gate line may generate a magnetic field even in the absence of an applied current (although a current may also be applied to tune the magnetic field of magnetic gate lines). As discussed above, EDSR techniques may be implemented when a gate line includes a magnetic material to drive transitions between different quantum states in quantum dots.

The quantum dot devices 100 illustrated in various ones of the figures have particular regular patterns of gates. In some embodiments of the quantum dot devices 100 disclosed herein, the pattern of gates may be sparser than illustrated in the figures, with certain ones of the gates omitted to create a sparser arrangement with any desired pattern.

FIG. 11 illustrates an interconnect arrangement for a quantum dot device 100, in accordance with various embodiments. Although the quantum dot device 100 illustrated in FIG. 11 takes the form of the quantum dot device 100 of FIG. 1, interconnects may be made to the gate lines of any of the quantum dot devices 100 disclosed herein in any desired manner. In FIG. 11, each gate line may be routed out to a bond pad for connection to control circuitry 175 including a processing device or other control device to control electrical signals on the gate lines (e.g., to perform any suitable quantum operation). In some embodiments, the control circuitry 175 may include multiplexers or other suitable circuitry for selectively applying voltages to various ones of the gate lines (e.g., providing microwave pulses and DC voltages).

Figure 12:
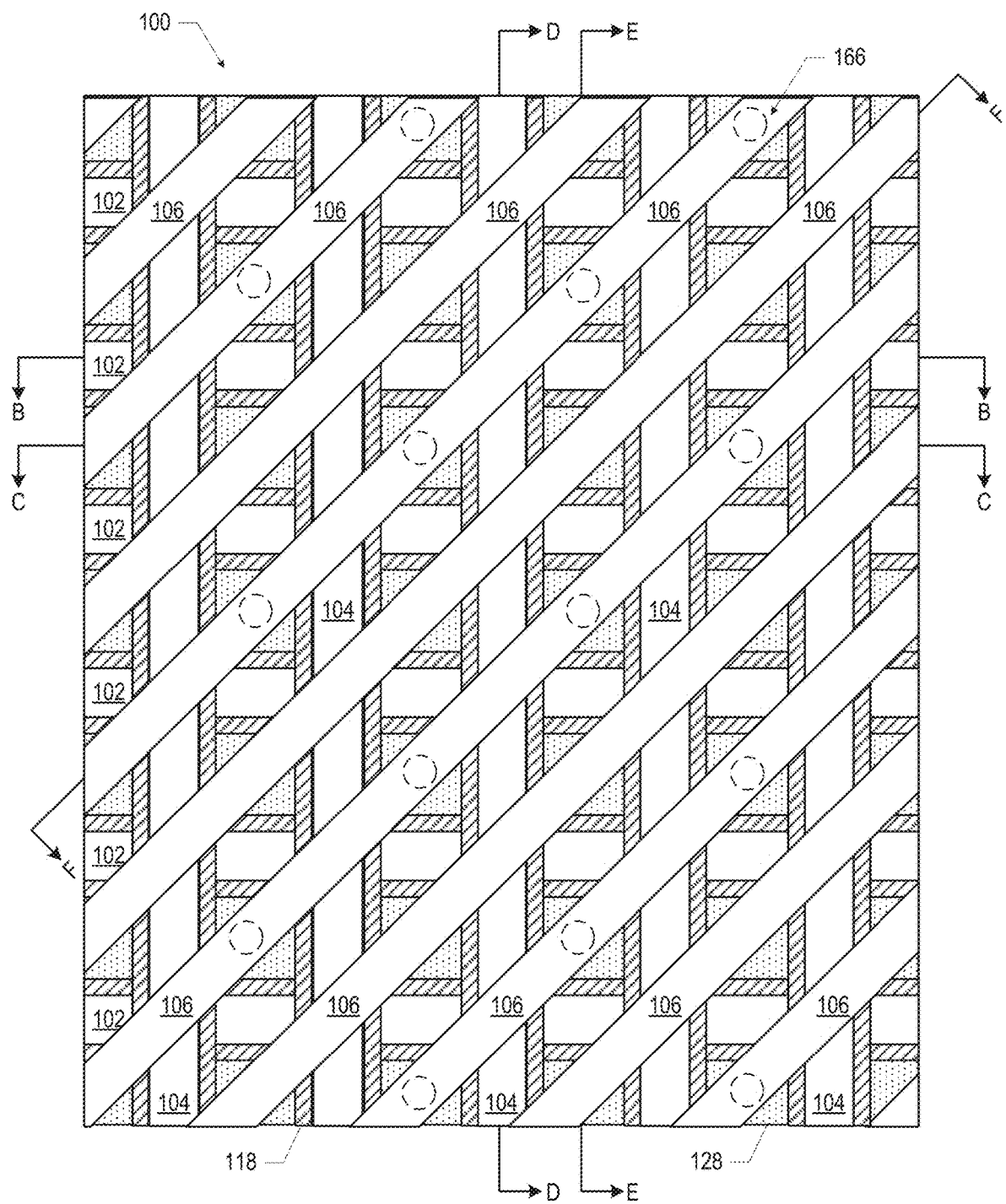
FIG. 12 is a top view of a quantum dot device, in accordance with various embodiments.

Although a number of the embodiments discussed above include gates arranged in a regular rectangular array, the techniques disclosed herein may be used to form regular or irregular arrays with other spacings. For example, in some variants on the quantum dot device 100 of FIG. 1, not all the openings in the grid formed by the first gate lines 102 and the second gate lines 104 may have a third gate 166 extending through them. FIG. 12 is a top view of a quantum dot device 100, analogous to the view of FIG. 1A, in which some but not all the openings in the grid have third gates 166 extending through them. In the embodiment of FIG. 12, the third gates 166 are arranged in a regular pattern, but more sparsely than they are arranged in FIG. 1. Other ones of the quantum dot devices 100 may have gates arranged more sparsely than illustrated; for example, variants of the quantum dot devices 100 of FIGS. 3, 5, and 6 may include gate pads that are not connected to either the first gate lines 124 or the second gate lines 125 (and thereby provide a passive barrier between adjacent first gates 167/second gates 168).

Figure 13:
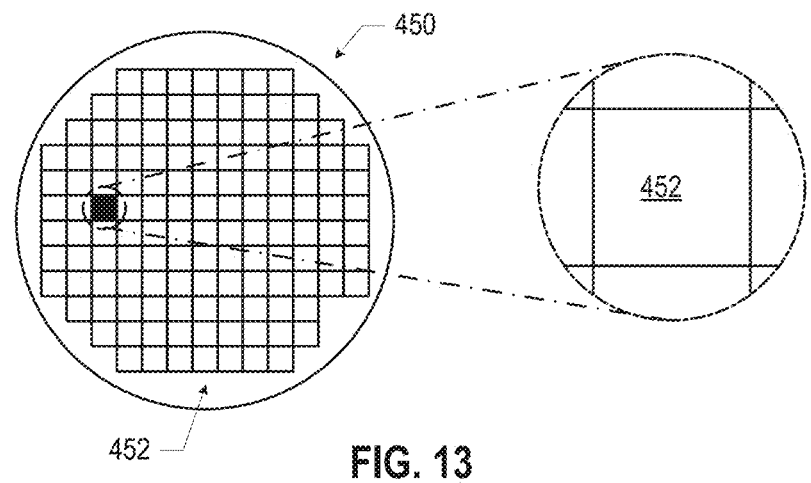
FIG. 13 is a top view of a wafer and dies that may include any of the quantum dot devices disclosed herein.
Figure 14:
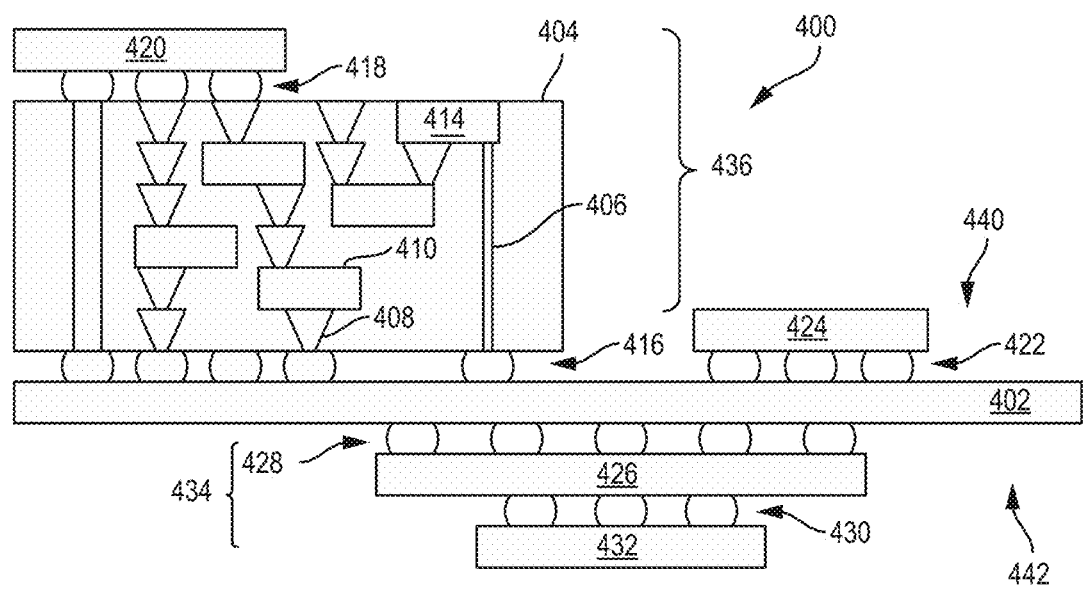
FIG. 14 is a cross-sectional side view of a device assembly that may include any of the quantum dot devices disclosed herein.
Figure 15:
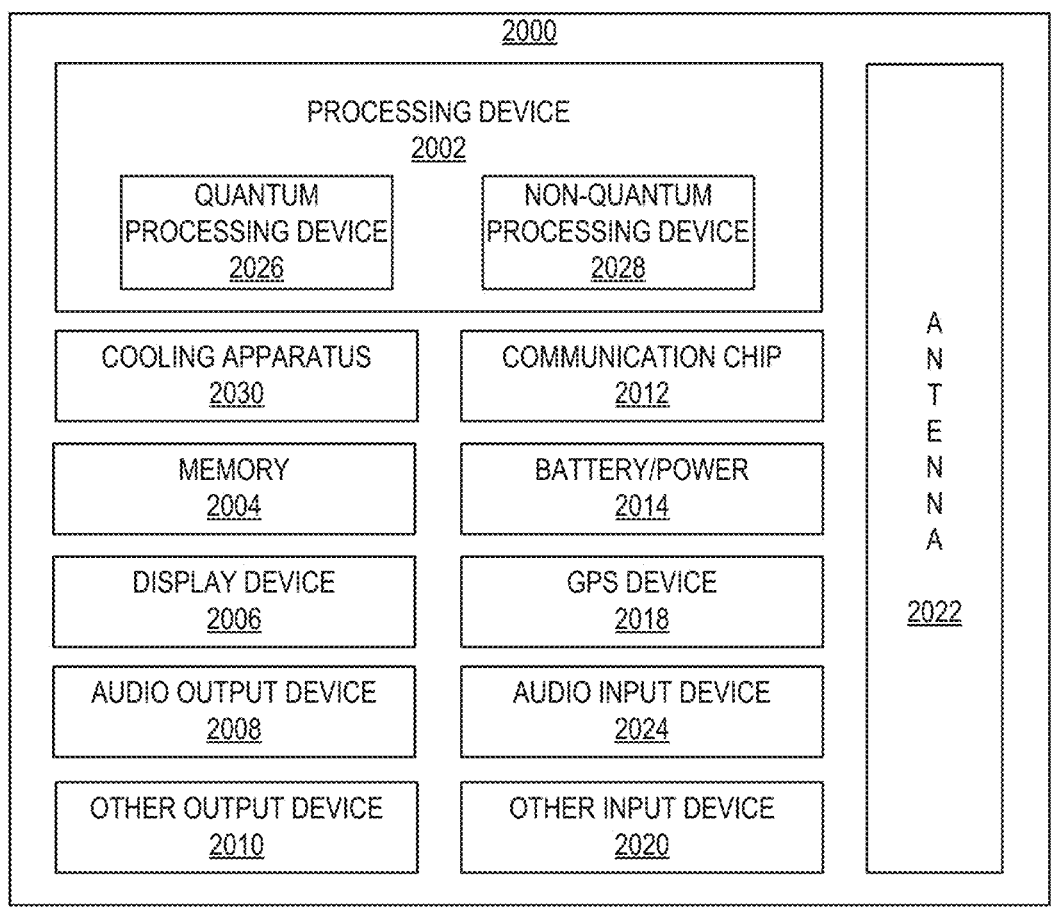
FIG. 15 is a block diagram of an example quantum computing device that may include any of the quantum dot devices disclosed herein, in accordance with various embodiments.

The quantum dot devices 100 disclosed herein may be included in any suitable electronic component. FIGS. 13-15 illustrate various examples of apparatuses that may include any of the quantum dot devices 100 disclosed herein.

FIG. 13 is a top view of a wafer 450 and dies 452 that may be formed from the wafer 450; the dies 452 may include any of the quantum dot devices 100 disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices (e.g., interconnects including conductive vias and lines, or any control circuitry 175, as discussed above with reference to FIG. 11), as well as any other integrated circuit (IC) components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 15) or other logic that is configured to store information in the memory devices or execute instructions stored in the memory array.

FIG. 14 is a cross-sectional side view of a device assembly 400 that may include any of the embodiments of the quantum dot devices 100 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 14 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 14), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 14, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package (e.g., a package that includes one or more quantum dot devices 100) or may be a conventional IC package, for example. In some embodiments, the package 420 may include a quantum dot device die (e.g., a die that includes one or more quantum dot devices 100) coupled to a package substrate (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 14, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package (e.g., a package that includes one or more quantum dot devices 100) or may be a conventional IC package, for example. In some embodiments, the package 424 may include a quantum dot device die (e.g., a die that includes one or more quantum dot devices 100) coupled to a package substrate (e.g., by flip chip connections).

The device assembly 400 illustrated in FIG. 14 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package (e.g., a package that includes one or more quantum dot devices 100) or may be a conventional IC package, for example. In some embodiments, one or both of the packages 426 and 432 may take the form of any of the embodiments of a quantum dot device package (e.g., a package that includes one or more quantum dot devices 100) disclosed herein, and may include a die coupled to a package substrate (e.g., by flip chip connections).

FIG. 15 is a block diagram of an example quantum computing device 2000 that may include any of the quantum dot devices 100 disclosed herein. A number of components are illustrated in FIG. 15 as included in the quantum computing device 2000, but any one or more of these components may be omitted or duplicated, as suitable for the application. In some embodiments, some or all the components included in the quantum computing device 2000 may be attached to one or more PCBs (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 15, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, control the performance of any of the operations discussed herein, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 10 Kelvin or less (e.g., 5 Kelvin or less, or 2 Kelvin or less). In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc. that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Any suitable materials may be used in various ones of the embodiments disclosed herein. For example, in some embodiments, the gate dielectric 114 may be a multilayer gate dielectric. The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

In some embodiments, any of the gate lines (e.g., the first gate lines 102, the second gate lines 104, the third gate lines 106, the first gate lines 124, the second gate lines 125, the third gate lines 141, and/or the fourth gate lines 177) may be a superconductor, such as aluminum, titanium nitride (e.g., deposited via atomic layer deposition), niobium titanium, or niobium titanium nitride. In some embodiments, any of the gate lines may include palladium, gold, copper, nickel, ruthenium, or cobalt. The spacer materials (e.g., the spacer material 118, 134, or 140) may be any suitable material, such as a carbon-doped oxide, silicon nitride, silicon oxide, or other carbides or nitrides (e.g., silicon carbide, silicon nitride doped with carbon, and silicon oxynitride). The insulating materials (e.g., the insulating materials 128, 117, 129, 133, and 171) may include silicon oxide, silicon nitride, aluminum oxide, carbon-doped oxide, and/or silicon oxynitride, for example. Hardmasks (e.g., the hardmasks 110 and 115) may be formed of silicon nitride, silicon carbide, transition metal oxides or nitrides, or another suitable material. The etch stop materials (e.g., the etch stop materials 131 and 135) may be any suitable material, such as a nitride, silicon carbide, silicon nitride, carbon-doped silicon nitride, or silicon oxycarbide.

The following paragraphs provide examples of various ones of the embodiments disclosed herein.

Example 1 is a quantum dot device, including: a quantum well stack having a first face and a second opposing face; an array of parallel first gate lines at the first face or the second face of the quantum well stack; and an array of parallel second gate lines at the first face or the second face of the quantum well stack, wherein the second gate lines are oriented diagonal to the first gate lines.

Example 2 may include the subject matter of Example 1, and may further include an array of parallel third gate lines at the first face or the second face of the quantum well stack, wherein the third gate lines are oriented perpendicular to the first gate lines, and the second gate lines are oriented diagonal to the third gate lines.

Example 3 may include the subject matter of Example 2, and may further specify that the first gate lines and the third gate lines form a grid, and the second gate lines include gates that extend toward the quantum well stack through openings in the grid.

Example 4 may include the subject matter of Example 3, and may further specify that gates extend through all the openings in an interior of the grid.

Example 5 may include the subject matter of Example 3, and may further specify that the gates do not extend through all the openings in an interior of the grid.

Example 6 may include the subject matter of any of Examples 2-5, and may further specify that the third gate lines extend over and between the first gate lines.

Example 7 may include the subject matter of any of Examples 2-6, and may further specify that the second gate lines include gates that extend toward the quantum well stack between adjacent pairs of first gate lines.

Example 8 may include the subject matter of any of Examples 2-7, and may further specify that the first gate lines and the third gate lines are at the first face of the quantum well stack, and the second gate lines are at the second face of the quantum well stack.

Example 9 may include the subject matter of any of Examples 2-7, and may further specify that the first gate lines, the second gate lines, and the third gate lines are at the first face of the quantum well stack.

Example 10 may include the subject matter of any of Examples 1-7, and may further specify that the first gate lines are at the first face of the quantum well stack, and the second gate lines are at the second face of the quantum well stack.

Example 11 may include the subject matter of any of Examples 1-7, and may further specify that the first gate lines and the second gate lines are at the first face of the quantum well stack.

Example 12 may include the subject matter of any of Examples 1-11, and may further include a layer of dielectric material between the quantum well stack and the first gate lines.

Example 13 may include the subject matter of any of Examples 1-12, and may further specify that the first gate lines and the second gate lines include one or more superconducting materials.

Example 14 may include the subject matter of any of Examples 1-13, and may further specify that the first gate lines and the second gate lines include a magnetic material.

Example 15 may include the subject matter of any of Examples 1-14, and may further specify that the quantum well stack includes a layer of silicon or a layer of germanium, and a layer of gate dielectric is on the layer of silicon or the layer of germanium.

Example 16 may include the subject matter of any of Examples 1-15, and may further specify that the first gate lines have a pitch between 5 nanometers and 200 nanometers.

Example 17 is a method of manufacturing a quantum dot device, including: forming a quantum well stack having a first face and a second opposing face; forming an array of parallel first gate lines at the first face or the second face of the quantum well stack; and forming an array of parallel second gate lines at the first face or the second face of the quantum well stack, wherein the second gate lines are oriented diagonal to the first gate lines.

Example 18 may include the subject matter of Example 17, and may further specify that forming an array of parallel first gate lines includes patterning the first gate lines by pitch-halving or pitch-quartering.

Example 19 may include the subject matter of any of Examples 17-18, and may further include forming spacers on side faces of the first gate lines.

Example 20 may include the subject matter of any of Examples 17-19, and may further include forming an array of parallel third gate lines at the first face or the second face of the quantum well stack, wherein the third gate lines are oriented perpendicular to the first gate lines, and the second gate lines are oriented diagonal to the third gate lines.

Example 21 may include the subject matter of Example 20, and may further specify that the third gate lines are formed after formation of the first gate lines and before formation of the second gate lines.

Example 22 may include the subject matter of any of Examples 17-21, and may further specify that forming the array of parallel second gate lines includes: forming an array of parallel mask strips to expose dielectric material between adjacent ones of the first gate lines; and forming gate cavities in the exposed dielectric material; and depositing a conductive material in the gate cavities and between the parallel mask strips.

Example 23 may include the subject matter of Example 22, and may further specify that forming gate cavities includes performing a photobucket technique.

Example 24 may include the subject matter of any of Examples 17-23, and may further specify that the first gate lines are formed at the first face of the quantum well stack, and the second gate lines are formed at the second face of the quantum well stack.

Example 25 is a method of operating a quantum dot device, including: applying electrical signals to an array of parallel first gate lines at a first face or an opposing second face of a quantum well stack; and applying electrical signals to an array of parallel second gate lines at the first face or the second face of the quantum well stack, and may further specify that the second gate lines are oriented diagonal to the first gate lines, the second gate lines include gates extending toward the quantum well stack between adjacent ones of the first gate lines, and the electrical signals applied to the first gate lines and the second gate lines contribute to causing individual quantum dots to form in the quantum well stack under individual ones of the gates.

Example 26 may include the subject matter of Example 25, and may further specify that the quantum dots are electron spin quantum dots or hole-spin quantum dots.

Example 27 may include the subject matter of any of Examples 25-26, and may further include applying electrical signals to an array of parallel third gate lines at the first face or the second face of the quantum well stack, wherein the second gate lines are oriented diagonal to the third gate lines, and the third gate lines are oriented perpendicular to the first gate lines.

Example 28 is a quantum computing device, including: a quantum processing device, wherein the quantum processing device includes a quantum well stack having a first face and a second opposing face, an array of parallel first gate lines at the first face or the second face of the quantum well stack, and an array of parallel second gate lines at the first face or the second face of the quantum well stack, wherein the second gate lines are oriented diagonal to the first gate lines; a non-quantum processing device, coupled to the quantum processing device, to control electrical signals applied to the first gate lines and the second gate lines; and a memory device to store data generated during operation of the quantum processing device.

Example 29 may include the subject matter of Example 28, and may further include a cooling apparatus to maintain a temperature of the quantum processing device below 10 Kelvin.

Example 30 may include the subject matter of any of Examples 28-29, and may further specify that the memory device is to store instructions for a quantum computing algorithm to be executed by the quantum processing device.

Example 31 is a quantum dot device, including: a quantum well stack; a two-dimensional array of gates above the quantum well stack, including rows and columns of gates; an array of parallel first gate lines, wherein individual ones of the first gate lines are electrically coupled to alternating ones of the gates in individual rows; and an array of parallel second gate lines, wherein individual ones of the second gate lines are electrically coupled to alternating ones of the gates in individual columns.

Example 32 may include the subject matter of Example 31, and may further include an array of parallel third gate lines, wherein individual ones of the third gate lines are between adjacent columns of gates.

Example 33 may include the subject matter of Example 32, and may further include an array of parallel fourth gate lines, wherein individual ones of the fourth gate lines are between adjacent rows of gates.

Example 34 may include the subject matter of Example 33, and may further specify that the third gate lines and the fourth gate lines are electrically coupled.

Example 35 may include the subject matter of Example 33, and may further specify that the third gate lines and the fourth gate lines provide a grid, and individual ones of the gates are in openings of the grid.

Example 36 may include the subject matter of any of Examples 32-35, and may further specify that the quantum well stack has a first face and an opposing second face, the gates are at the first face, and the third gate lines are at the second face.

Example 37 may include the subject matter of any of Examples 32-35, and may further specify that the gates and the third gate lines are part of a common metal layer.

Example 38 may include the subject matter of any of Examples 31-37, and may further specify that the quantum well stack includes silicon or germanium.

Example 39 may include the subject matter of any of Examples 31-38, and may further specify that no gate is electrically coupled to both a first gate line and a second gate line.

Example 40 may include the subject matter of any of Examples 31-39, and may further include a layer of dielectric material between the quantum well stack and the gates.

Example 41 may include the subject matter of any of Examples 31-40, and may further specify that the first gate lines and the second gate lines include one or more superconducting materials.

Example 42 may include the subject matter of any of Examples 31-41, and may further specify that the first gate lines and the second gate lines include a magnetic material.

Example 43 may include the subject matter of any of Examples 31-42, and may further specify that the gates have a pitch between 5 nanometers and 200 nanometers.

Example 44 is a method of manufacturing a quantum dot device, including: forming a quantum well stack; forming a two-dimensional array of gates above the quantum well stack, including rows and columns of gates; forming an array of parallel first gate lines, wherein individual ones of the first gate lines are electrically coupled to alternating ones of the gates in individual rows; and forming an array of parallel second gate lines, wherein individual ones of the second gate lines are electrically coupled to alternating ones of the gates in individual columns.

Example 45 may include the subject matter of Example 44, and may further include forming an array of parallel third gate lines, wherein individual ones of the third gate lines are between adjacent columns of gates.

Example 46 may include the subject matter of Example 45, and may further include forming an array of parallel fourth gate lines, wherein individual ones of the fourth gate lines are between adjacent rows of gates.

Example 47 may include the subject matter of Example 45, and may further specify that the gates and the third gate lines are patterned simultaneously.

Example 48 may include the subject matter of Example 45, and may further specify that the gates and the third gate lines are patterned in separate patterning operations.

Example 49 may include the subject matter of any of Examples 44-48, and may further include, before forming the gates, forming a layer of gate dielectric above the quantum well stack.

Example 50 is a method of operating a quantum dot device, including: applying electrical signals to an array of parallel first gate lines, wherein individual ones of the first gate lines are electrically coupled to alternating gates in individual rows of a two-dimensional array of gates above a quantum well stack; and applying electrical signals to an array of parallel second gate lines, wherein individual ones of the second gate lines are electrically coupled to alternating gates in individual columns of the two-dimensional array of gates, and the electrical signals applied to the first gate lines and the second gate lines contribute to causing individual quantum dots to form in the quantum well stack under one or more of the gates.

Example 51 may include the subject matter of Example 50, and may further specify that the quantum dots are electron spin quantum dots.

Example 52 may include the subject matter of any of Examples 50-51, and may further include applying electrical signals to an array of parallel third gate lines, wherein individual ones of the third gate lines are between adjacent columns of gates.

Example 53 may include the subject matter of Example 52, and may further specify that the third gate lines are in electrical contact with an array of parallel fourth gate lines, and individual ones of the fourth gate lines are between adjacent rows of gates.

Example 54 is a quantum computing device, including: a quantum processing device, wherein the quantum processing device includes a quantum well stack, a two-dimensional array of gates above the quantum well stack, including rows and columns of gates, an array of parallel first gate lines, wherein individual ones of the first gate lines are electrically coupled to alternating ones of the gates in individual rows, and an array of parallel second gate lines, wherein individual ones of the second gate lines are electrically coupled to alternating ones of the gates in individual columns; a non-quantum processing device, coupled to the quantum processing device, to control electrical signals applied to the first gate lines and the second gate lines; and a memory device to store data generated during operation of the quantum processing device.

Example 55 may include the subject matter of Example 54, and may further include a cooling apparatus to maintain a temperature of the quantum processing device below 10 Kelvin.

Example 56 may include the subject matter of any of Examples 54-55, and may further specify that the memory device is to store instructions for a quantum computing algorithm to be executed by the quantum processing device.

Example 57 may include the subject matter of any of Examples 54-55, and may further specify that the non-quantum processing device is further to read out signals from the quantum processing device.

Example 58 may include the subject matter of any of Examples 54-55, and may further specify that the non-quantum processing device is further to process the read-out signals.

The invention claimed is:

1. A quantum dot device, comprising:
a quantum well stack having a first face and a second opposing face;
an array of parallel first gate lines at the first face or the second face of the quantum well stack; and
an array of parallel second gate lines at the first face or the second face of the quantum well stack, wherein the second gate lines are oriented diagonal to the first gate lines.

2. The quantum dot device of claim 1, further comprising:
an array of parallel third gate lines at the first face or the second face of the quantum well stack, wherein the third gate lines are oriented perpendicular to the first gate lines, and the second gate lines are oriented diagonal to the third gate lines.

3. The quantum dot device of claim 2, wherein the first gate lines and the third gate lines form a grid, and the second gate lines include gates that extend toward the quantum well stack through openings in the grid.

4. The quantum dot device of claim 3, wherein gates extend through all the openings in an interior of the grid.

5. The quantum dot device of claim 3, wherein the gates do not extend through all the openings in an interior of the grid.

6. The quantum dot device of claim 2, wherein the third gate lines extend over and between the first gate lines.

7. The quantum dot device of claim 2, wherein the second gate lines include gates that extend toward the quantum well stack between adjacent pairs of first gate lines.

8. The quantum dot device of claim 1, wherein the first gate lines are at the first face of the quantum well stack, and the second gate lines are at the second face of the quantum well stack.

9. The quantum dot device of claim 1, wherein the first gate lines and the second gate lines are at the first face of the quantum well stack.

10. The quantum dot device of claim 1, wherein the first gate lines and the second gate lines include one or more superconducting materials.

11. The quantum dot device of claim 1, wherein the first gate lines and the second gate lines include a magnetic material.

12. The quantum dot device of claim 1, wherein the quantum well stack includes a layer of silicon or a layer of germanium, and a layer of gate dielectric is on the layer of silicon or the layer of germanium.

13. A quantum computing device, comprising:
a quantum processing device, wherein the quantum processing device includes a quantum well stack having a first face and a second opposing face, an array of parallel first gate lines at the first face or the second face of the quantum well stack, and an array of parallel second gate lines at the first face or the second face of the quantum well stack, wherein the second gate lines are oriented diagonal to the first gate lines;
a non-quantum processing device, coupled to the quantum processing device, to control electrical signals applied to the first gate lines and the second gate lines; and
a memory device to store data generated during operation of the quantum processing device.

14. A quantum dot device, comprising:
a quantum well stack;
a two-dimensional array of gates above the quantum well stack, including rows and columns of gates;
an array of parallel first gate lines, wherein individual ones of the first gate lines are electrically coupled to alternating ones of the gates in individual rows; and
an array of parallel second gate lines, wherein individual ones of the second gate lines are electrically coupled to alternating ones of the gates in individual columns.

15. The quantum dot device of claim 14, further comprising:
an array of parallel third gate lines, wherein individual ones of the third gate lines are between adjacent columns of gates.

16. The quantum dot device of claim 15, further comprising:
an array of parallel fourth gate lines, wherein individual ones of the fourth gate lines are between adjacent rows of gates.

17. The quantum dot device of claim 16, wherein the third gate lines and the fourth gate lines provide a grid, and individual ones of the gates are in openings of the grid.

18. The quantum dot device of claim 15, wherein the quantum well stack has a first face and an opposing second face, the gates are at the first face, and the third gate lines are at the second face.

19. The quantum dot device of claim 15, wherein the gates and the third gate lines are part of a common metal layer.

20. The quantum dot device of claim 14, wherein no gate is electrically coupled to both a first gate line and a second gate line.

* * * * *